United States Patent [19]

Nunogaki et al.

[11] Patent Number: 5,602,384
[45] Date of Patent: Feb. 11, 1997

[54] SUNLIGHT SENSOR THAT DETECTS A DISTRUBITION AND AMOUNT OF THERMAL LOAD

[75] Inventors: Naochika Nunogaki; Makoto Shirai; Manabu Yamada; Yutaka Maeda; Masaya Nakamura; Masanori Fukutani; Katsuhide Akimoto, all of Kariya, Japan

[73] Assignee: Nippondenso Co., Ltd., Koriya, Japan

[21] Appl. No.: 256,298

[22] PCT Filed: Nov. 4, 1993

[86] PCT No.: PCT/JP93/01599

§ 371 Date: Sep. 20, 1994

§ 102(e) Date: Sep. 20, 1994

[87] PCT Pub. No.: WO94/11703

PCT Pub. Date: May 26, 1994

[30] Foreign Application Priority Data

Nov. 6, 1992 [JP] Japan .................................. 4-296815
Nov. 6, 1992 [JP] Japan .................................. 4-297280
May 26, 1993 [JP] Japan .................................. 5-124103

[51] Int. Cl.$^6$ .......................... G01C 21/02; G01C 21/24; F24J 2/38
[52] U.S. Cl. ........................................ 250/203.4; 126/257
[58] Field of Search ............................. 250/203.4, 203.3; 126/578, 573; 257/431, 432, 434, 435, 459

[56] References Cited

U.S. PATENT DOCUMENTS

| | | |
|---|---|---|
| 3,268,185 | 8/1966 | Eckermann et al. . |
| 3,838,277 | 9/1974 | Morgenstern et al. . |
| 4,006,356 | 1/1977 | Johnson et al. ..................... 250/203.4 |
| 4,041,307 | 8/1977 | Napoli et al. ........................ 250/203.4 |
| 4,287,411 | 9/1981 | Beucci .................................. 250/203.4 |
| 4,516,018 | 5/1985 | Bodenheimer et al. ............ 250/203.4 |
| 4,933,550 | 6/1990 | Hegyi . |
| 5,101,829 | 4/1992 | Fujikawa et al. . |
| 5,117,744 | 6/1992 | Zimmer et al. . |
| 5,181,654 | 1/1993 | Yoshimi et al. ..................... 250/203.4 |
| 5,264,691 | 11/1993 | Hegyi .................................. 250/203.4 |
| 5,324,929 | 6/1994 | Yamada et al. . |

FOREIGN PATENT DOCUMENTS

| | | |
|---|---|---|
| 4205757 | 8/1992 | Germany . |
| 4302442 | 8/1994 | Germany ............................ 250/203.4 |
| 4953463 | 5/1974 | Japan . |
| 52-161537 | 12/1977 | Japan . |
| 55-161700 | 11/1980 | Japan . |
| 56-064611 | 6/1981 | Japan . |
| 57-120809 | 7/1982 | Japan . |
| 57-173256 | 10/1982 | Japan . |
| 59-151126 | 10/1984 | Japan . |
| 62-071713 | 4/1987 | Japan . |
| 53-116754 | 9/1987 | Japan . |
| 62-254005 | 11/1987 | Japan . |
| 62-297712 | 12/1987 | Japan . |
| 63-19209 | 2/1988 | Japan . |
| 63-118507 | 8/1988 | Japan . |
| 63-246614 | 10/1988 | Japan . |
| 63-278284 | 11/1988 | Japan . |
| 6419107 | 1/1989 | Japan . |
| 1136811 | 5/1989 | Japan . |
| 2640 | 1/1990 | Japan . |
| 2087027 | 3/1990 | Japan . |
| 2216402 | 8/1990 | Japan . |

(List continued on next page.)

Primary Examiner—Stephone Allen
Attorney, Agent, or Firm—Cushman, Darby & Cushman IP Group of Pillsbury Madison & Sutro LLP

[57] ABSTRACT

A sunlight sensor for use in control of vehicle air conditioners, and provides which detects the sunlight thermal load. A light-cutoff film is formed on the upper surface of the transparent substrate (intermediate element) of the light-sensing element, and at the center of this light-cutoff film is formed a light-guiding hole. Left and right light-detection sections and are formed on the lower surface of the transparent substrate.

33 Claims, 52 Drawing Sheets

FOREIGN PATENT DOCUMENTS

| | | |
|---|---|---|
| 2284489 | 11/1990 | Japan . |
| 352208 | 5/1991 | Japan . |
| 3207340 | 9/1991 | Japan . |
| 4095728 | 3/1992 | Japan . |
| 4104019 | 4/1992 | Japan . |
| 449506 | 4/1992 | Japan . |
| 4143611 | 5/1992 | Japan . |
| 4216405 | 8/1992 | Japan . |
| 4343276 | 11/1992 | Japan . |
| 4355317 | 12/1992 | Japan . |
| 557636 | 7/1993 | Japan . |
| 587534 | 11/1993 | Japan . |
| 587537 | 11/1993 | Japan . |
| 2253516 | 9/1992 | United Kingdom . |
| 9405044 | 3/1994 | WIPO . |

θ = 90°

θ = 60°   φ = −90°

θ = 60°   φ = 90°

θ = 60°   φ = 0°

$\theta \approx 0°$    $\phi = 90°$ $\theta \approx 0°$    $\phi = -90°$ $\theta \approx 0°$    $\phi = 0°$ $\theta=90°$ $\theta=60°$   $\phi=-90°$ $\theta=60°$   $\phi=90°$ $\theta=60°$   $\phi=0°$ $\theta = 90°$ $\theta = 60°$  $\phi = 0°$

θ = 60°  φ = 45°

θ = 60°  φ = 90°

$\theta = 90°$ $\theta = 60°$  $\phi = 0°$

θ = 60°   φ = 45°

θ = 60°   φ = 90°

LIGHT-RECEIVING REGION $\phi = 0°$  $\theta = 60°$

LIGHT-RECEIVING REGION $\phi = -90°$  $\theta = 60°$

φ = 0°  θ = 60°

φ = −90°  θ = 60°

$\theta = 90°$ $\theta \, max \leq \theta < 90°$ $\theta < \theta \, max$

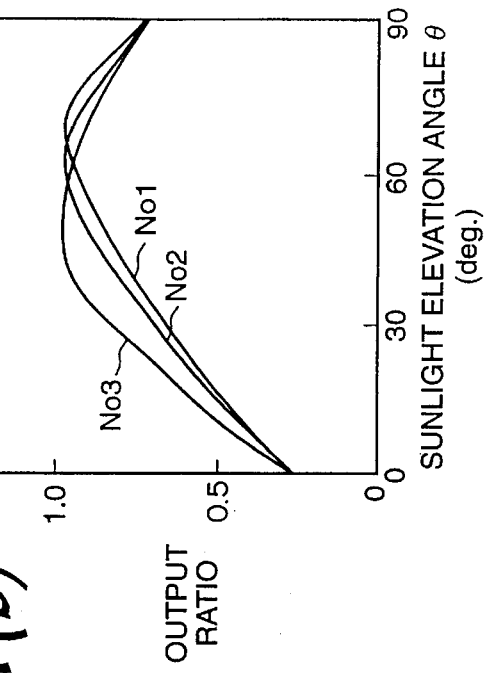
Fig. 56
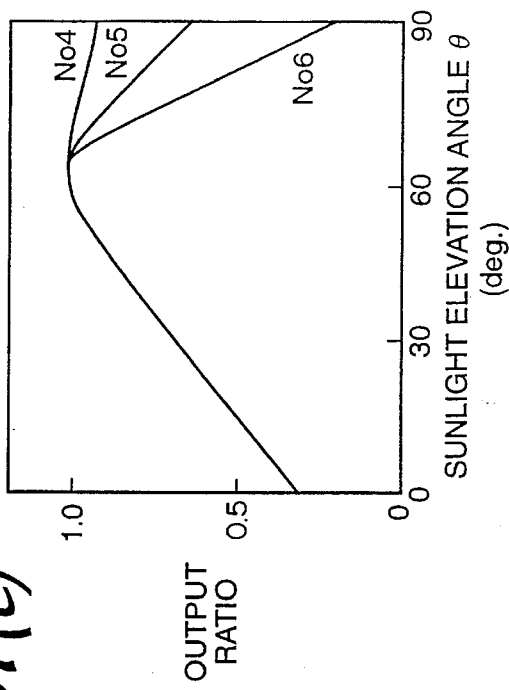
Fig. 57(b)
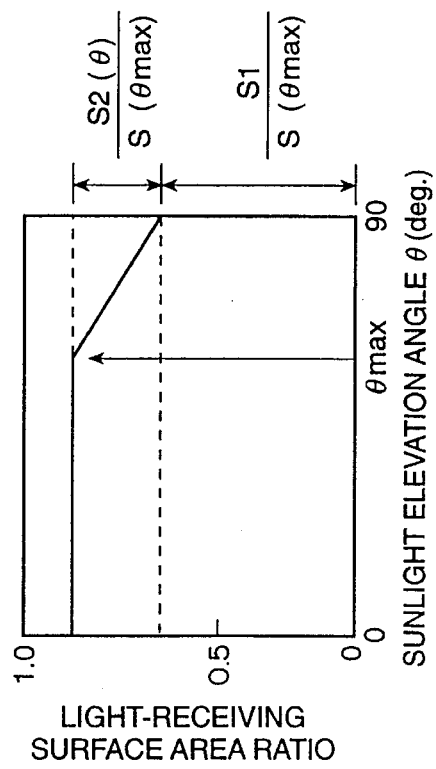
Fig. 57(c)
Fig. 57(a)
| No | θL | a | b | θmax | α |
|---|---|---|---|---|---|
| 1 | 17 | 0.70 | 0.020 | 70 | 0.25 |
| 2 | 15 | 0.65 | 0.014 | 60 | 0.25 |
| 3 | 13 | 0.55 | 0.011 | 50 | 0.25 |
| 4 | 15 | 0.20 | 0.032 | 60 | 0.85 |
| 5 | 15 | 0.60 | 0.016 | 60 | 0.60 |
| 6 | 15 | 0.85 | 0.006 | 60 | 0.20 |

DIRECTION OF VEHICLE FRONT

174

DIRECTION OF VEHICLE FRONT

173

DIRECTION OF VEHICLE FRONT

DIRECTION OF VEHICLE FRONT

DIRECTION OF VEHICLE FRONT

DIRECTION OF VEHICLE FRONT

DIRECTION OF VEHICLE FRONT

DIRECTION OF VEHICLE FRONT

LIGHT-DETECTION
2D SECTION PATTERN

LIGHT-CUTOFF
2D FILM PATTERN

LIGHT-DETECTION
1D SECTION PATTERN

LIGHT-CUTOFF
1D FILM PATTERN

SUNLIGHT SENSOR THAT DETECTS A DISTRUBITION AND AMOUNT OF THERMAL LOAD

BACKGROUND OF THE INVENTION

1. Field of the Invention

The present invention is related to a sunlight sensor, and more specifically, to a sunlight sensor used in the control of an air conditioner or other device.

2. Description of the Related Art

In the past, sunlight sensors, such as sunlight sensors used for air conditioner control in an automobile as disclosed in U.S. Pat. No. 3,268,185 and as shown in FIG. 81, have been known.

The sunlight sensor 1 in FIG. 81 is provided with a light-cutoff means 3, having a light-receiving hole 3a which is located over a light detector 2a so as to allow sunlight selectively to pass to the light detector 2a. Using a constant illuminated surface area upon which sunlight strikes light detector 2a, the amount of heat to which incident light is converted, which depends upon the angle of elevation of the incident sunlight, is obtained from the intensity of illumination light detector 2a.

In addition, there is a sunlight sensor as shown in FIG. 82, which was disclosed in Japanese Unexamined Patent Application Publication (Kokai) No. 2-216402.

The sunlight sensor 5 in FIG. 82, in addition to having a cover 6 of the required cover shape to cover the light-detection section, which is not shown, has, between cover 6 and the light-detection section, a diffuser 7. The cover 6 and diffuser 7 are used to control the intensity of illumination striking the light-detection section, to make the intensity correspond to the angle of elevation and direction of the sunlight.

However, in the sunlight sensor shown in FIG. 81, in the case of sunlight at a low angle of elevation, it is extremely difficult to keep the illuminated area of the light detector 2a the same as in the case of a high angle of elevation of the sunlight passing through the light cutoff means 3. For that reason, it is necessary to additionally provide a low-elevation-angle light detector 2b around the outside of light detector 2a, thereby causing the sunlight sensor 1 to be large and complex.

In addition, in the sunlight sensor of FIG. 82, the cover 6 is used to define the illumination level which corresponds to the sunlight elevation angle and direction at the light-detection section. However, in this case, in which a cover is provided at the top of the light-detection section, when the sun is directly overhead, the output of the light-detection section drops suddenly, making it impossible to produce the desired signal. For this reason, it is necessary to locate a diffuser 7 between cover 6 and the light-detection section, thus making the sunlight sensor 5 large and complex.

The present invention, in consideration of the above problems, has as its object the provision of a sunlight sensor of simple construction and small size, which is capable to detecting illumination intensity (sunlight thermal load) with respect to the orientation of the sunlight sensor with good accuracy.

SUMMARY OF THE INVENTION

To achieve the above object, the sunlight sensor of the present invention has a constitution which comprises a light-cutoff means which selectively passes sunlight, a light-detection means having a plurality of planar light-detection sections positioned within the same plane, and an intermediate element inserted between the light-cutoff means and the light-detection section so as to pass the sunlight selected by the light-cutoff means to the light-detection section.

By means of this configuration, the light-cutoff means causes the sunlight to be partially cutoff and to strike the plurality of planar light-detection sections which are of the desired planar shape and which are provided in one and the same plane. In this manner, the total amount of illumination received by each light-detection section will vary, depending upon the sunlight direction, and a signal is output from each light-detection section in response to the overall surface area receiving the sunlight and the intensity of the sunlight. In this configuration, because there is an intermediate element inserted between the light-cutoff means and the light-detection section, the light passing through the intermediate element is diffracted, thereby making the angle of incidence to the light-detection section large, and thus enabling detection of low-angle sunlight with good accuracy.

In addition, by using a configuration which comprises a light-cutoff means capable of passing only the selected sunlight and a light-detection section which outputs a detection signal in response to the direction of the sunlight and by selecting the surface area which is illuminated by the sunlight which passes through the light-cutoff means, it is possible to detect the thermal load of the sunlight with good accuracy.

By using the above-described configuration, it is possible to provide a sunlight sensor which features both small size and simple construction, and which is capable of detecting, with good accuracy the thermal load of sunlight and is responsive to the direction of the sunlight.

BRIEF DESCRIPTION OF THE DRAWINGS

FIG. 56 is a drawing which shows how the light-receiving surface area ratio $S(\theta)S(\theta \max)$ changes.

FIG. 57(a), FIG. 57(b) and FIG. 57(c) are drawings explaing the relationship between the lens conversion angle θL, the change ratio a of the light-receiving surface area ratio S2 (θ)/s(θmax), the light-receiving surface area ratio b which does not change with respect to the sunlight elevation angle θ, the peak elevation angle θmax, the decrease ratio α in the output ratio at a sunlight elevation angle of 90°, the sunlight elevation, and the output ratio.

FIG. 71(a) and FIG. 70(b) show the light-cutoff film pattern and light-detection section pattern of the thirty sixth embodiment of the present invention.

DESCRIPTION OF THE PREFERRED EMBODIMENTS

Figure 1:
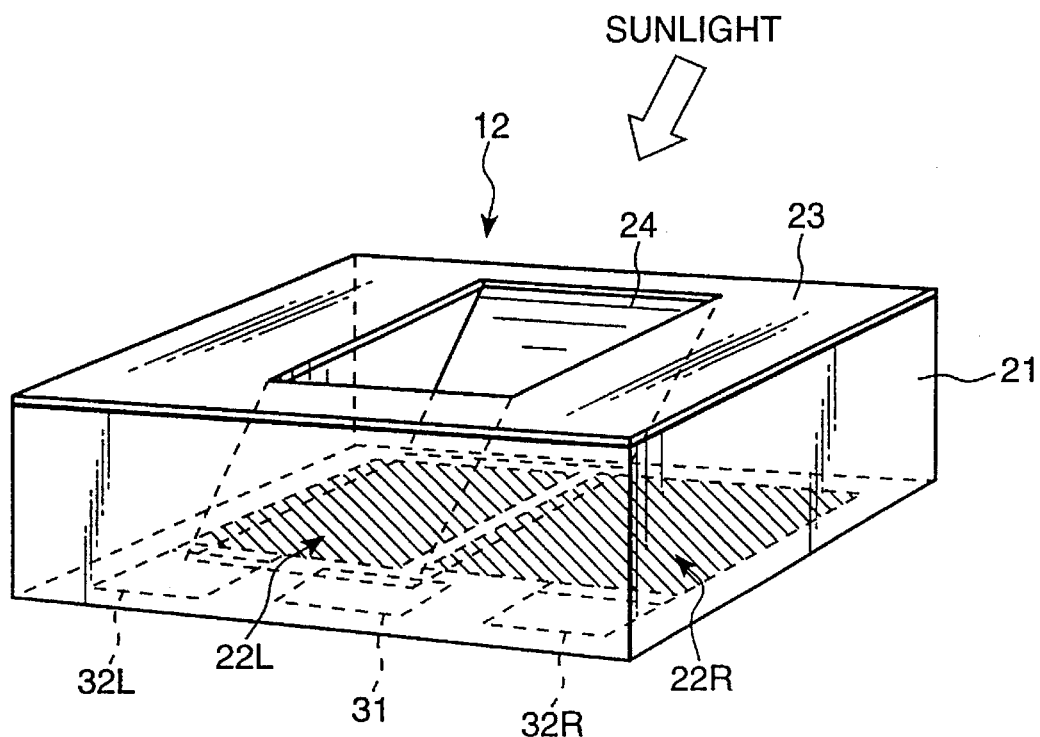
FIG. 1 is a perspective view of the light-sensing element which shows the first embodiment of the present invention.

What follows is a description of the first embodiment of the present invention, based on the drawings FIG. 1 through FIG. 14. First, there will be a simplified explanation of the overall configuration of the sunlight sensor 11, making use of FIG. 4. With the exception of the central part of the upper surface, the light-sensing element 12 of sunlight sensor 11 is held to the transparent holder 14 by the light-blocking resin 13. The transparent holder 14 is housed inside the cylindrically shaped case 15, the case 15 having attached to its upper part a transparent cover 16. The lead wire 17 which runs downward from the said light-sensing element 12 is soldered to a printed circuit board 18 which is fixed to the case 15. The connection terminal 19 which is soldered to the printed circuit board 18 has the end of lead wire 20 crimped onto it, the detection signal passing through this lead wire 20 to the outside.

Figure 2:
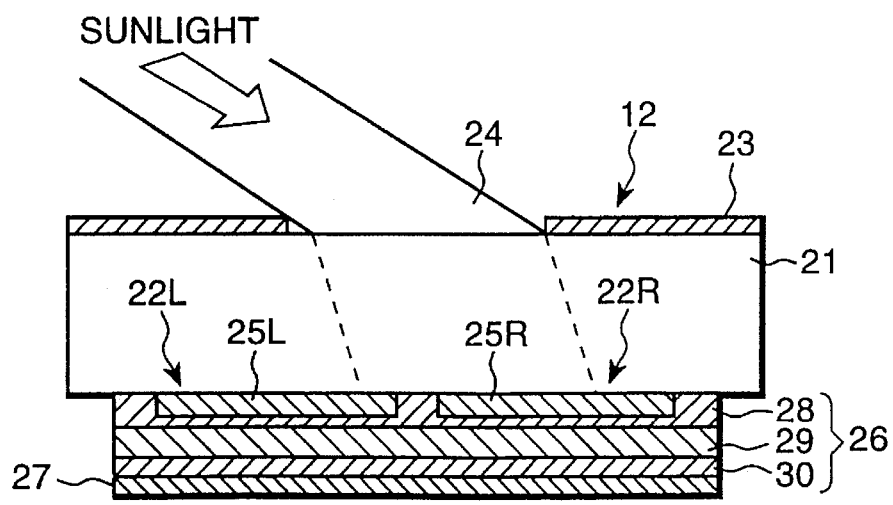
FIG. 2 is a cross-sectional view of a light-sensing element.

The above-noted light-sensing element 12, as shown in FIG. 1 and FIG. 2, is configured so that there are two light-detection sections 22L and 22R formed on the bottom surface of transparent substrate 21 which has an upper surface which is relatively opposite, with a light-cutoff film 23 formed on the upper surface as the light-cutoff means. This light-cutoff film 23 is extremely thin and is formed, for example, by using black epoxy resin printing or metallic film deposition and contains, in the center part, a light-guiding hole 24. The thinner the light-cutoff film 23 around the light-guiding hole 24 is, the smaller the portion of sunlight striking the light-guiding hole that is cutoff by the edge of the light-guiding hole 24, and the greater is the amount of low elevation light that passes, making it desirable to make the light-cutoff film 23 as thin as possible.

Figure 3:
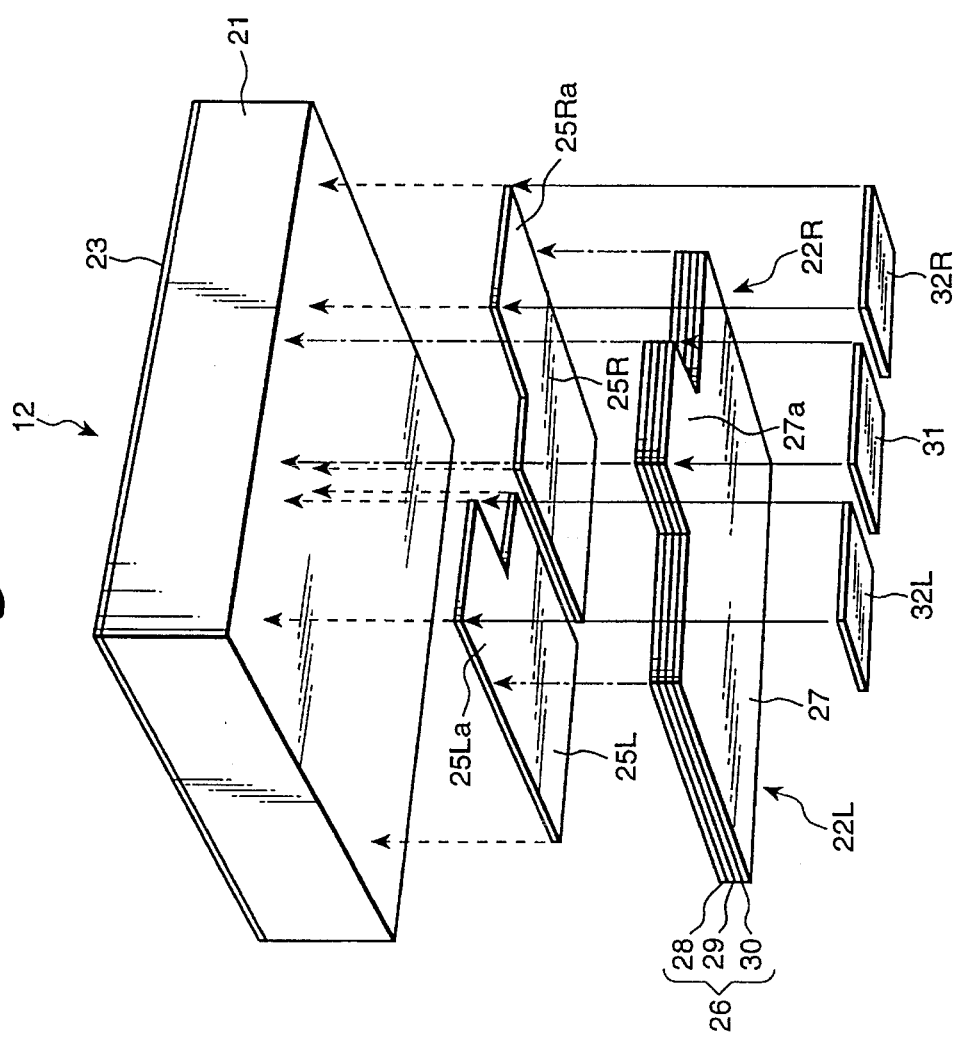
FIG. 3 is an exploded perspective view of a light-sensing element.

The transparent substrate 21 is formed by coating a 1.1-mm thick soda glass plate with. $SiO_2$, but the substrate can also be made of transparent plastic. This transparent substrate 21 corresponds to the "intermediate element" which is an essential constituent element of the present invention, and is formed from a material having an index of refraction higher than 1.0, which is the index of refraction of air. The two light-detection sections 22L and 22R formed on the left and right of the bottom surface of the transparent substrate 21, as shown in FIG. 2 and FIG. 3, are formed by laminating, in the direction of light incidence, transparent conductive layers 25L and 25R, optoelectrical conversion layer 26 and reverse-side electrode 27.

With this configuration, transparent conductive layers 25L and 25R are formed as a thin-film of $SnO2$ having a thickness, for example, of 4500 Angstroms, the sheet resistance of this film being $10\phi\Omega/\square$. The required characteristics of these transparent conductive layers 25L and 25R are that they pass light and that they have a small sheet resistance, and, these film, also can be formed from ZnO, ITO, or an other type of metallic thin film. Both of the light-detection sections 22L and 22R are formed as patterns by means of semiconductor manufacturing techniques. The pattern formation technique can be the formation of a film using a metallic mask, or can be microprocessing by photolithography of the desired pattern on a surface that is entirely transparent and conductive.

The thus formed transparent conductive layers 25L and 25R have, on their bottom surfaces, the optoelectrical conversion layer 26. The optoelectrical conversion layer 26 is constructed as an amorphous silicon (hereafter referred to as a-Si) alloy layer, onto which is laminated a photodiode formed by a p-i-n layer, the 3-layer laminate being, from the direction of the incident light, an a-Sic p-type semiconductor layer 28, an intrinsic a-Si i-type semiconductor layer 29, and a μc-Si (microcrystal) n-type semiconductor layer 30. The layer formation conditions of semiconductor layers 28, 29, and 30 are given in Table 1.

TABLE 1

| Drawing reference symbol | 28 p-type semi-conductor (a-Si) | 29 i-type semiconductor (intrinsic a-SiC) | 30 n-type semiconductor (μc-Si) |
| --- | --- | --- | --- |
| Gas flow | | | |
| $SiH_4$ | 6.6 | 50 | 8 |
| $CH_4$ | 15.4 | — | — |
| $B_2H_6/H_2$ | 68.0 | — | — |
| $PH_3/H_2$ | — | — | 8 |
| $H_2$ | 130 | 200 | 384 |
| Internal pressure (Torr) | 1.0 | 1.1 | 0.5 |
| RF power (W) | 40 | 40 | 100 |
| Substrate temperature (°C.) | 180 | 180 | 180 |
| Layer thickness (Å) | 150 | 4500 | 600 |

1) The $B_2H_6$ concentration is 500 ppm.
2) The $PH_3$ concentration is 1%.
3) SCCM is the flow (cc/min.) under standard pressure and temperature conditions.
4) The RF power is the RF field power in the plasma CVD process.

The optoelectrical conversion layer 26 is not limited to the above-described p-i-n construction, but can also be of n-i-p construction. In the case in which thermal drift does not affect the detection characteristics, the optoelectrical conversion layer 26 can also be an optically conductive type which uses a single i-type layer (intrinsic semiconductor). In addition, the material used to form the optoelectrical conversion layer 26 is not limited to a-Si, but can also be, for example, c-Si, GaAs, CuInSe2, CdS, CdTe p-n junctions, np junctions, pin junctions, or nip junctions.

The reverse-side electrode 27 formed on the bottom surface of the optoelectric conversion layer 26 is formed as a thin film with thickness of 6000 Angstroms, by either Al deposition or sputtering. This reverse-side electrode 27 need not transmit light, and instead of A1, it is possible to use, for example, Ti, Cr, Ni, Mo, or other metals or alloys thereof, or to use TiN, Ag paste, Ni paste, or Cu paste.

As shown in FIG. 3, the optoelectrical conversion layer 26 and reverse-side electrode 27 are formed into the same rectangular shape with a protrusion on one side, with an input electrode 31 formed as a pattern on the protrusion 27a. Each of the transparent conductive layers 25L and 25R has formed on it protrusions 25La and 25Ra from the optoelectrical conversion layer 26 (reverse-side electrode 27), these protrusions 25La and 25Ra having formed on them as patterns the output electrodes 32L and 32R. In this configuration, the region over which the light-detection sections 22L and 22R function is the region in which all three of the transparent conductive layers 25L and 25R, optoelectrical conversion layer 26, and reverse-side electrode 27 overlap, the detection characteristics of the sunlight sensor 11 being established by the positional relationship between this region and the light-guiding hole 24 of the light-cutoff film 23.

The above-noted electrodes 31, 32L and 32R are formed as thin films having a thickness of 3000 Angstroms, using either Ni deposition or sputtering. In addition to use of Ni as this material, it is possible to use, for example the metals Ti, Cr, Al, or Mo or alloys thereof, and also possible to use TiN, Ag paste, Ni paste, or Cu paste, etc.

Figure 5:
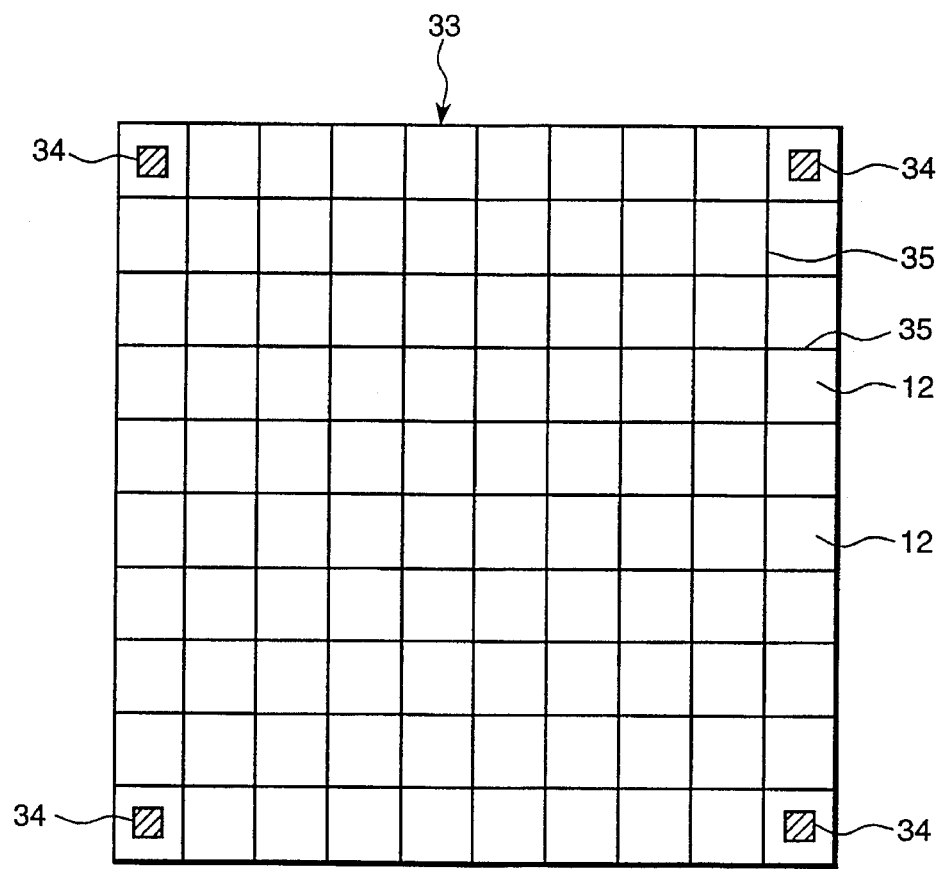
FIG. 5 is a top view of a glass substrate on which a number of light-sensing element are formed.

A high-quality sunlight sensor 12 of the above-described construction can be manufactured as follows, using semiconductor manufacturing techniques. For example, as shown in FIG. 5, alignment marks 34 are formed in the four corners of a glass substrate 33 of a size that enables a large number of sunlight sensor 12 to be fabricated. With the substrate positioned with these alignment marks used as the reference, the left and right light-detection sections 22L and 22R are formed on one side of the glass substrate 33, and the light-guiding holes 24 and light-cutoff films 23 are formed on the other side. After this, the glass substrate 33 is scribed along the scribe lines 35 to enable mass production of the sunlight sensor 12 chips. Each of the sunlight sensors 12 fabricated in this manner is free from variations between the left and right light-detection sections 22L and 22R, these having the same output characteristics. Furthermore, the positioning of the light-guiding holes 24 with respect to the left and right light-detection sections 22L and 22R is highly accurate, because it is established accurately by the alignment marks 34 and the thickness of the glass substrate 33 (transparent substrate 21).

Figure 6:
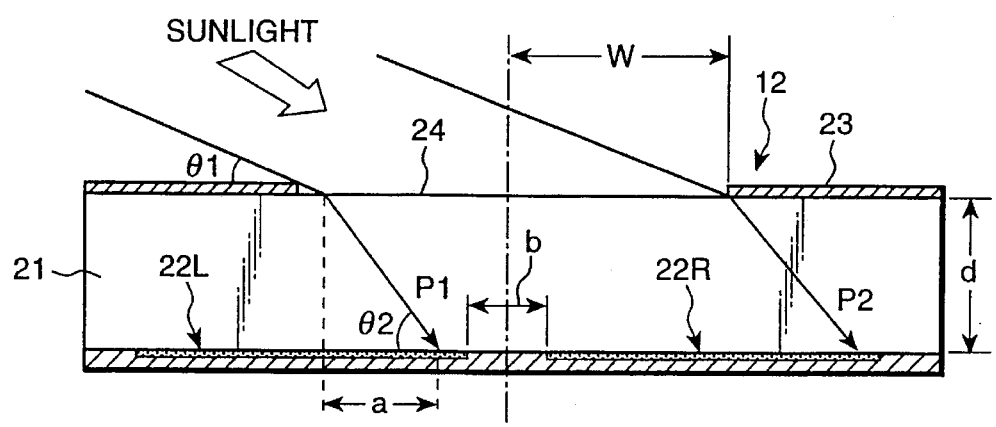
FIG. 6 is a cross-sectional view of a light-sensing element which explains the operating effect.

Next follows an explanation of the positional relationship between the sizes and shapes of the left and right light-detection sections 22L and 22R and the light-guiding hole 24, making reference to FIG. 6 and FIGS. 7(a)–7(d). As shown in FIG. 6, if light strikes the light-guiding hole 24 at an angle of θ1, this light striking the light-detection sections 22L and 22R at angle of θ2, and further if the index of refraction of the medium between the light-guiding hole 24 and the light-detection sections 22L and 22R (transparent substrate 21) is n, and the index of refraction of air is 1, the following relationship of Equation (1) applies.

$$\sin(\pi/2 - \theta_1) = n \cdot \sin(\pi/2 - \theta_2) \quad (1)$$

From the relationship of Equation 1 if, for example, the index of refraction n of the transparent substrate 21 is 1.5, for θ1=0°, θ2 would be 48°.

Further, if the left edge position of the light flux striking the left-side light-detection section 22L is P1, the right edge position of the light flux striking the right-side light-detection section 22R is P2, and the thickness of the transparent substrate 21 is d, the distance a that P1 and P2 move from the position directly beneath the light-guiding hole 24 is given by Equation (2).

$$a = d / \tan \theta_2 \quad (2)$$

This Equation (2), from the relationship of Equation (1), can be expressed as the following, Equation (3).

$$a = \frac{d}{\tan\left[\frac{\pi}{2} - \sin^{-1}\left\{\frac{1}{n}\sin\left(\frac{\pi}{2} - \theta 1\right)\right\}\right]} \quad (3)$$

In this case, because it is necessary to detect the thermal load in the left and right directions of the sunlight at both the left and right light-detection sections 22L and 22R, and since it is necessary that at θ>0° incident light strikes both the left and the right light-detection sections 22L and 22R simultaneously, it is necessary to prevent the point P1 from extending beyond the right edge of the light-detection section 22L. Therefore, the sidewise width 2W of the light-guiding hole 24 must be made larger than the sum of two times the amount of movement a of the incident sunlight and the spacing b between the left and right light-detection sections 22L and 22R, and in general, it is necessary to satisfy the following Equation (4).

$$2W > \frac{1}{\tan[\pi/2 - \sin^{-1}\{1/n\sin(\pi/2 - \theta 1)\}]} + b \quad (4)$$

$$2W > \frac{2d}{\tan[\pi/2 - \sin^{-1}\{1/n\sin(\pi/2 - \theta 1)\}]} + b$$

Figure 7A:
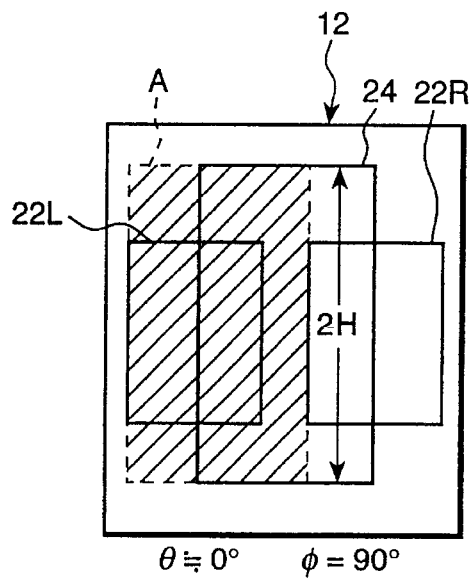
FIG. 7(a), FIG. 7(b), FIG. 7(c) and FIG. 7(d) are first drawings which explain the positional relationship and shape of the left and right-detection sections and the light-guide holes.
Figure 7B:
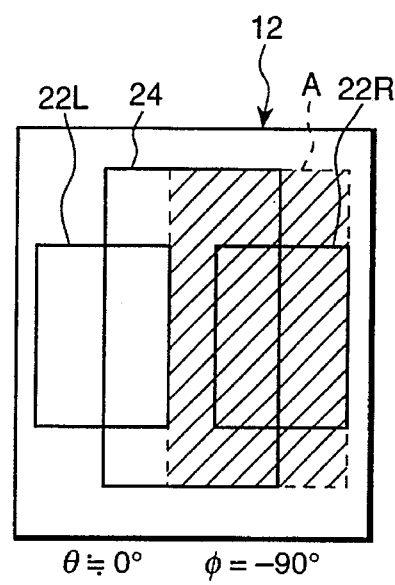
Figure 7C:
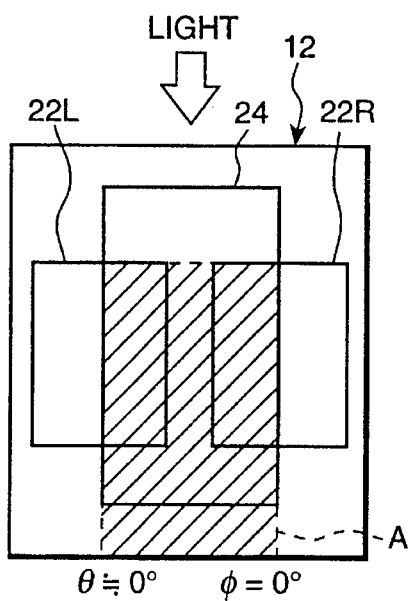
Figure 7D:
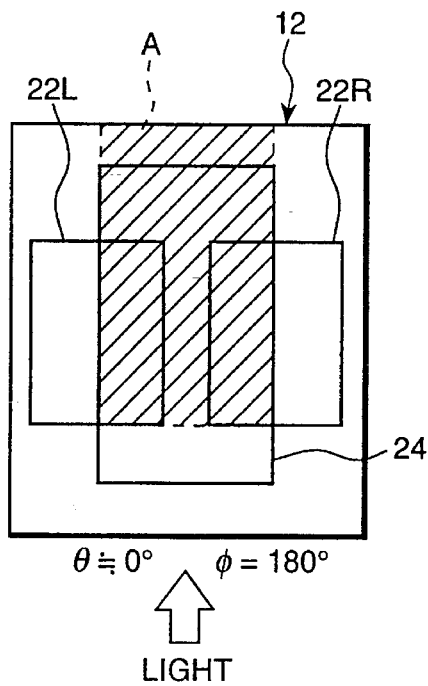

In this first embodiment, as shown in FIGS. 7(a)–7(d), each of the light-detection sections 22L and 22R and the light-guiding hole 24 are formed so as to be rectangular in shape, and set so that only when the when sunlight is incident from the horizontal left and right directions of the sunlight sensor 11 (sunlight elevation θ=0°, direction φ=±90°) does either the left or the right light-detection section 22L or 22R fall entirely within the illuminated region A, the other light-detection section falling entirely in the cutoff region, as shown in FIG. 7(a) and 7(b). Also, the vertical width 2H of the light-guiding hole 24 (refer to FIG. 7(a)) is set so as to be larger than the vertical width of the light-detection sections 22L and 22R, so that when sunlight is incident in the horizontal front and back directions (sunlight elevation θ=approx. 0°, direction φ=0°, 180°), as shown in FIG. 7(c) and 7(d), the front edge or rear edge of the region of illumination region A coincides with the front edges or rear edges of the light-detection sections 22L and 22R. Note, however, that in cases in which the sunlight sensor 11 is mounted on the dashboard at the front of a vehicle, because sunlight from the rear of the sunlight sensor 11 is cutoff by the roof of the vehicle, this must be considered when establishing the vertical width 2H and the position of the light-guiding hole 24.

Figure 8A:
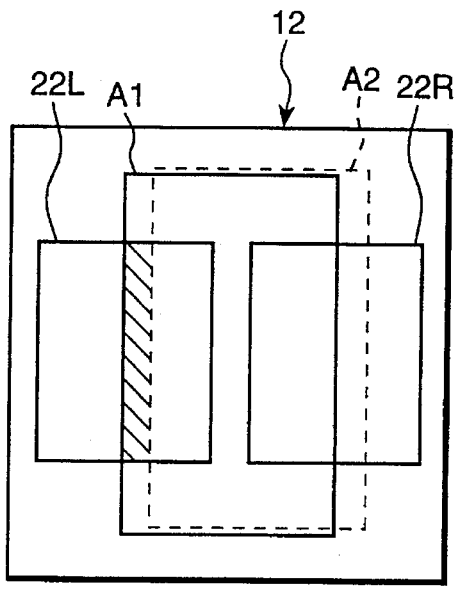
FIG. 8(a), FIG. 8(b), and FIG. 8(c) are the second drawings which explain the positional relationship and shape of the left and right light-detection sections and the light-guide holes.
Figure 8B:
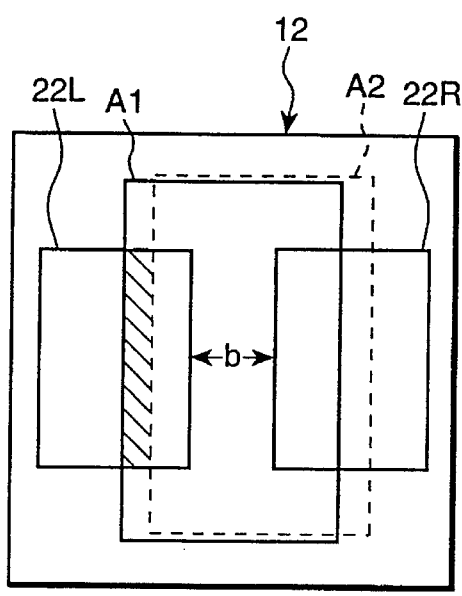
Figure 8C:
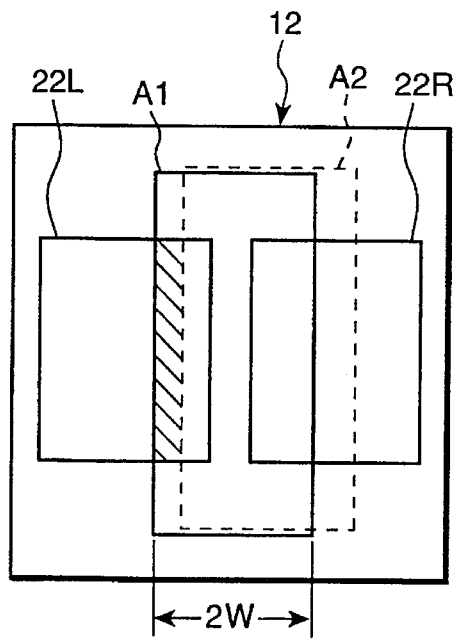

The output difference between the left and right light-detection sections 22L and 22R can be set arbitrarily, by changing the width 2H of the light-guiding hole 24 or the spacing b between the two light-detection sections 22L and 22R, as shown in FIG. 8(a), 8(b), and 8(c). In FIG. 8(a), 8(b), and 8(c), the solid line A1 indicates the illuminated region when the sunlight elevation angle θ is 90°, the dotted line A2 indicates the illuminated region when the sunlight elevation angle θ is lowered by a certain angle, and the shaded area indicates the illuminated region on the left-side light-detection section 22L when the illuminated region moves from A1 to A2.

In FIG. 8(a) the setting is such that when the region illuminated by the light moves from A1 to A2, the output of the left light-detection section 22L is reduced by ⅓.

In FIG. 8(b) the spacing b between the left-side and right-side light-detection sections 22L and 22R is expanded so that the output of the left-side light-detection section 22L is reduced by ½. In FIG. 8(c) the width 2W of the light-guiding hole 24 is made smaller, so that the output of the left-side light-detection section 22L is reduced by ½. Therefore, in accordance with such factors as the purpose of the application, it is possible to change the spacing b between the left and right light-detection sections 22L and 22R, and the width 2W of the light-guiding hole 24 to obtain the desired output characteristics.

The sunlight sensor 11 having the configuration as described above can be mounted horizontally on the top of the dashboard (not shown in the drawings) at the front of a vehicle, so that both light-detection sections 22L and 22R are positioned to the left and right, with the width 2W of the light-guiding hole 24 and the spacing b between the left and right light-detection section 22L and 22R changed arbitrarily. FIG. 8(a),(b), and(c), show the illuminated region for the condition in which the sunlight elevation angle θ is 90° as A1, show the illuminated region when the sunlight elevation angle θ is decreased by a certain amount A2, and show the reduction in the surface area of the illuminated region at the left-side light-detection section 22L when the illuminated region moves from A1 to A2. In FIG. 8(a), when the illuminated region moves from A1 to A2, the output of the left-side light-detection section 22L is reduced by ⅓. In FIG. 8(b), by increasing the spacing b between the left-side and right-side light-detection sections 22L and 22R, the output of the left-side light-detection section 22L is reduced by ½. In FIG. 8(c), by making the width 2W of the light-guiding hole 24 narrow, the output of the left-side light-detection section 22L is reduced by ½. Therefore, according to the purpose of the sunlight sensor 11, it is possible to change the spacing b between the left and right light-detection sections 22L and 22R and width 2W of the light-guiding hole 24 to achieve the desired output characteristics.

Figure 9:
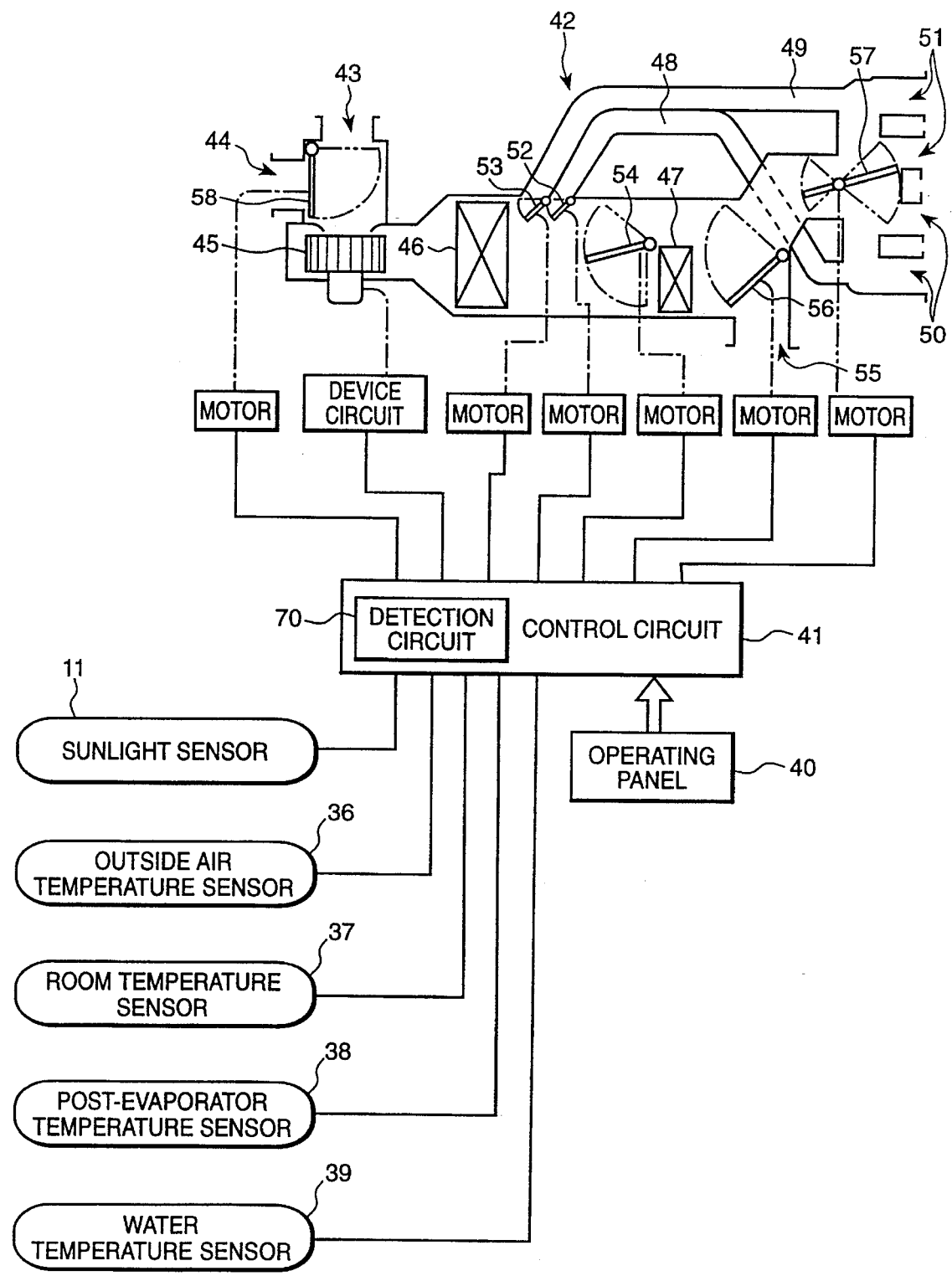
FIG. 9 is a system configuration diagram of an overall air conditioner.

The sunlight sensor 11 having the configuration as described above can be mounted horizontally on the top of the dashboard (not shown in the drawings) at the front of a vehicle, so that both light-detection sections 22L and 22R are positioned to the left and right. It is possible, as shown in FIG. 9, to provide the vehicle, in addition to the sunlight sensor 11, an outside air temperature sensor 36, an inside air temperature sensor 37, a post-evaporator temperature sensor 38 which detects the temperature at the rear of the cooler (not shown), a water temperature sensor 39 which detects the temperature of the engine cooling water, and operating panel onto which are provided various operating switches (not shown in the drawing), the data input by these elements being processed by a control circuit 41 so that the operation of the air conditioner 42 is controlled.

As a simple explanation of the configuration of this air conditioner 42, the air sucked from the outside air intake 44 by the blower 45 is cooled by the evaporator 46. The thus cooled air is sent to the heater core 47, and also passes through the two cool-air bypass ducts 48 and 49, and is sent to the left and right vents 50 and 51. At the input sides of the cool-air bypass ducts 48 and 49, dampers 52 and 53 are provided, and the dampens 52 and 53 vary the amount of cool-air bypass. Upstream from the heater core 47 an air-mixing damper 54 is provided, and the adjustment of the opening of the air-mixing damper 54 regulates the mix of the air which passes through the heater core 47 and the air which does not pass through the heater core 47. Downstream from the above-noted heater core 47 is, along with the left and right vents 50 and 51, a foot-area vent 55, this foot-area vent 55 being opened and closed by a damper 56, and the air flow ratio of left and right vents 50 and 51 being adjusted by damper 57. In addition, inside air intake 43 and outside air intake 44 are opened and closed selectively by means of inside/outside air switching damper 58.

In performing sunlight-compensated control based on a signal from the sunlight sensor 11, the opening of dampers 52 and 53 of vents 50 and 51 is adjusted in response to the sunlight intensity (the sunlight thermal load inside the vehicle), the temperature difference between the output temperature from vents 50 and 51 and the output temperature of from the foot-area vent 55 being regulated, thus providing automatic compensation for the influence of sunlight. In the case in which the sunlight is inclined to either the left or the right, the left and right openings of dampers 52 and 53 of cool-air bypass ducts 48 and 49 are caused to be different, or the output temperate or amount of air flow from the left and right are caused to be different, and the opening of damper 57 can be adjusted to regulate the amount of air flowing from the left and right vents 50 and 51.

Figure 10:
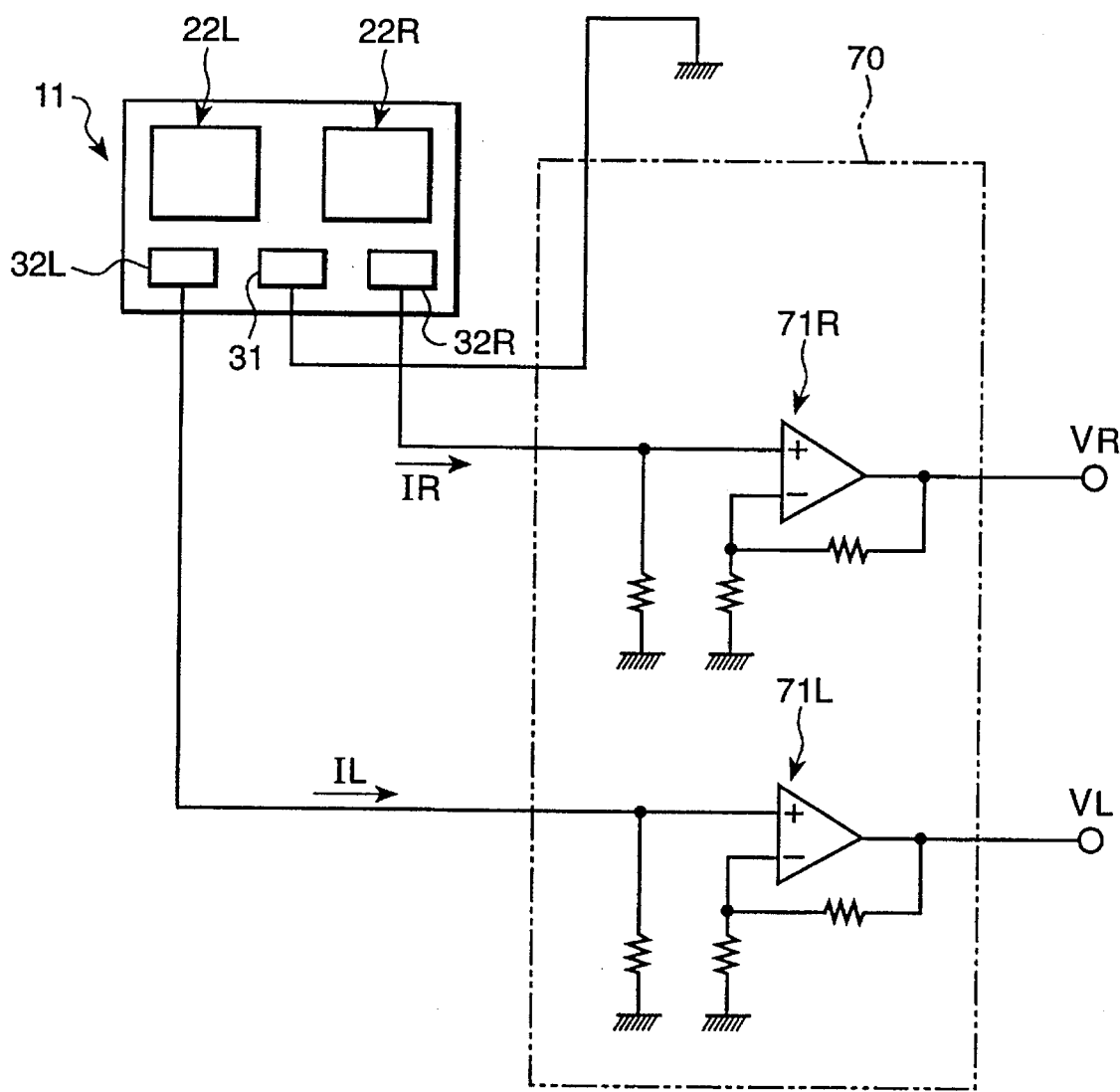
FIG. 10 is an electrical circuit diagram of a detector circuit.

The detection circuit 70 for the purpose of detecting the output of the left and right light-detection sections 22L and 22R is provided within the control circuit 41, the details of this being shown in FIG. 10. The input electrode 31 which is electrically connected to the reverse-side electrode 27 is connected to the ground side, thereby keeping the reverse-side electrode 27 at 0 V. The photocurrent IL which is output through output electrode 32L from the left-side light-detection section 22L is converted to a voltage value VL by means of the current-voltage converter circuit 71L. In the same manner, the photocurrent IR which is output through output electrode 32R from the right-side light-detection section 22R is converted to a voltage value VR by means of the current-voltage converter circuit 71R. Reverse bias is applied to the input electrode 31 (for example +5 V), and the photocurrent is detected.

The detection principle of the sunlight sensor 11 configured as described above is as follows. The sunlight is partially cut off by the light-cutoff film 23, and is selectively caused to strike the transparent substrate 21 as light flux in the shape of a slit from the light-guiding hole 24, this light striking the optoelectrical conversion layer 26 of the left and right light-detection sections 22L and 22R. By doing this, there is a change in the illuminated regions of the optoelectrical conversion layer 26 of the left and right light-detection sections 22L and 22R in response to the direction of the sunlight, the photocurrents IL and IR being generated at the optoelectrical conversion layer 26 in accordance with the illuminated surface area and light intensity. These photocurrents IL and IR are output from the output electrodes 32L and 32R and are converted to voltage values VL and VR by the current-voltage converter circuits 71L and 71R.

Figure 11A:
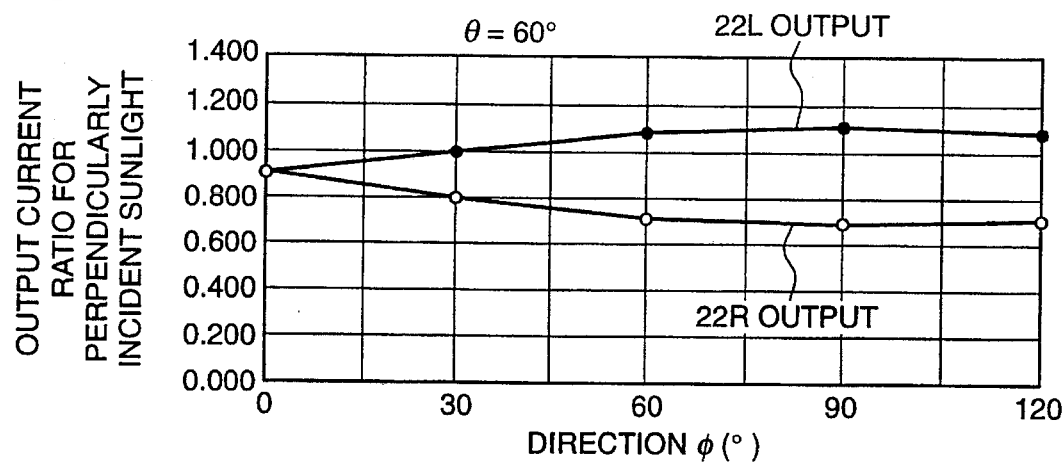
FIG. 11(a), FIG. 11(b), and FIG. 11(c) are graphs of the output characteristics of the left and right light-detection sections.
Figure 11B:
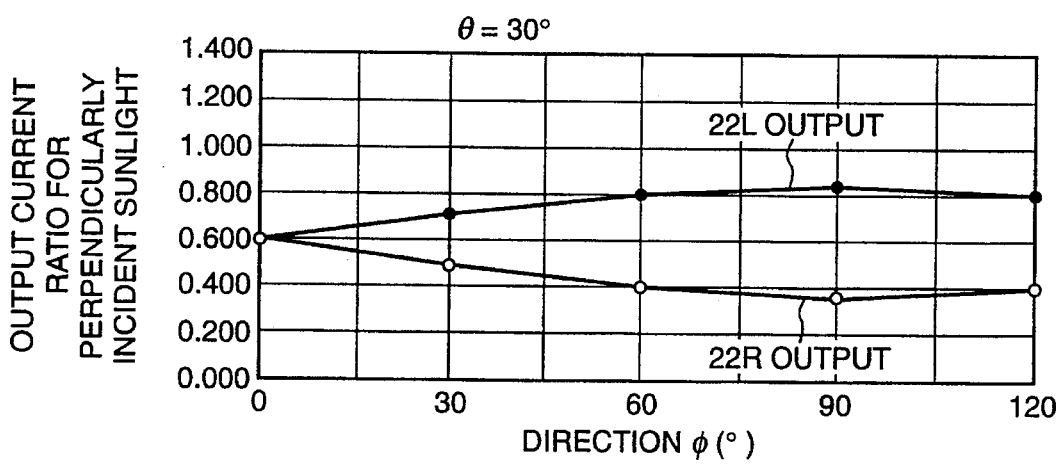
Figure 11C:
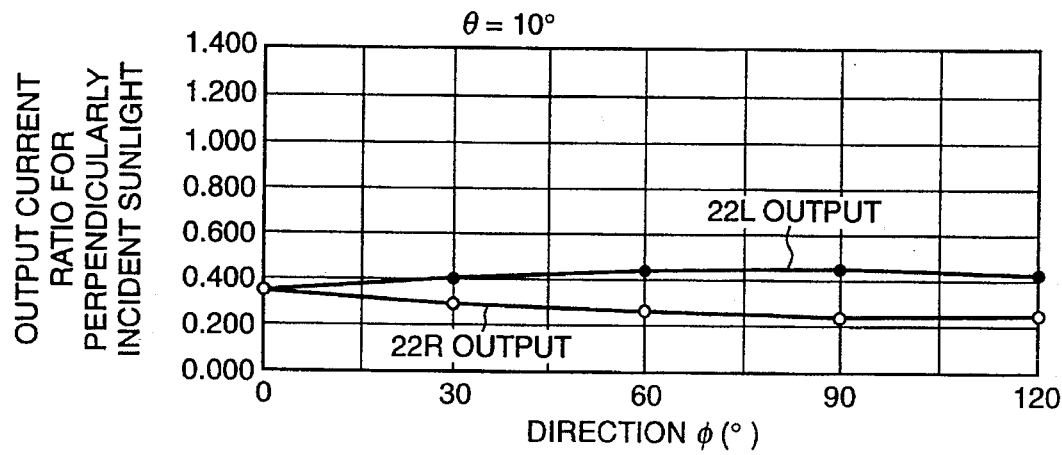

For example, in the case in which the sunlight is incident from the left side, because there would be more sunlight striking the right-side light-detection section 22R, the photocurrent IR (VR) of the right-side light-detection section 22R would be larger than the photocurrent IL (VL) of the left-side light-detection section 22L, making it possible to determine how much sunlight is incident from the left side. According to measurement results of the present invention, the measured left and right output characteristics are as shown in FIG. 11(a), 11(b), and 11(c). In FIGS. 11(a)–11(c) the output ratio with the photocurrent values IL and IR taken as 1.0 for the case of perpendicular sunlight (sunlight elevation angle θ=90°, direction φ=0°).

Figure 12:
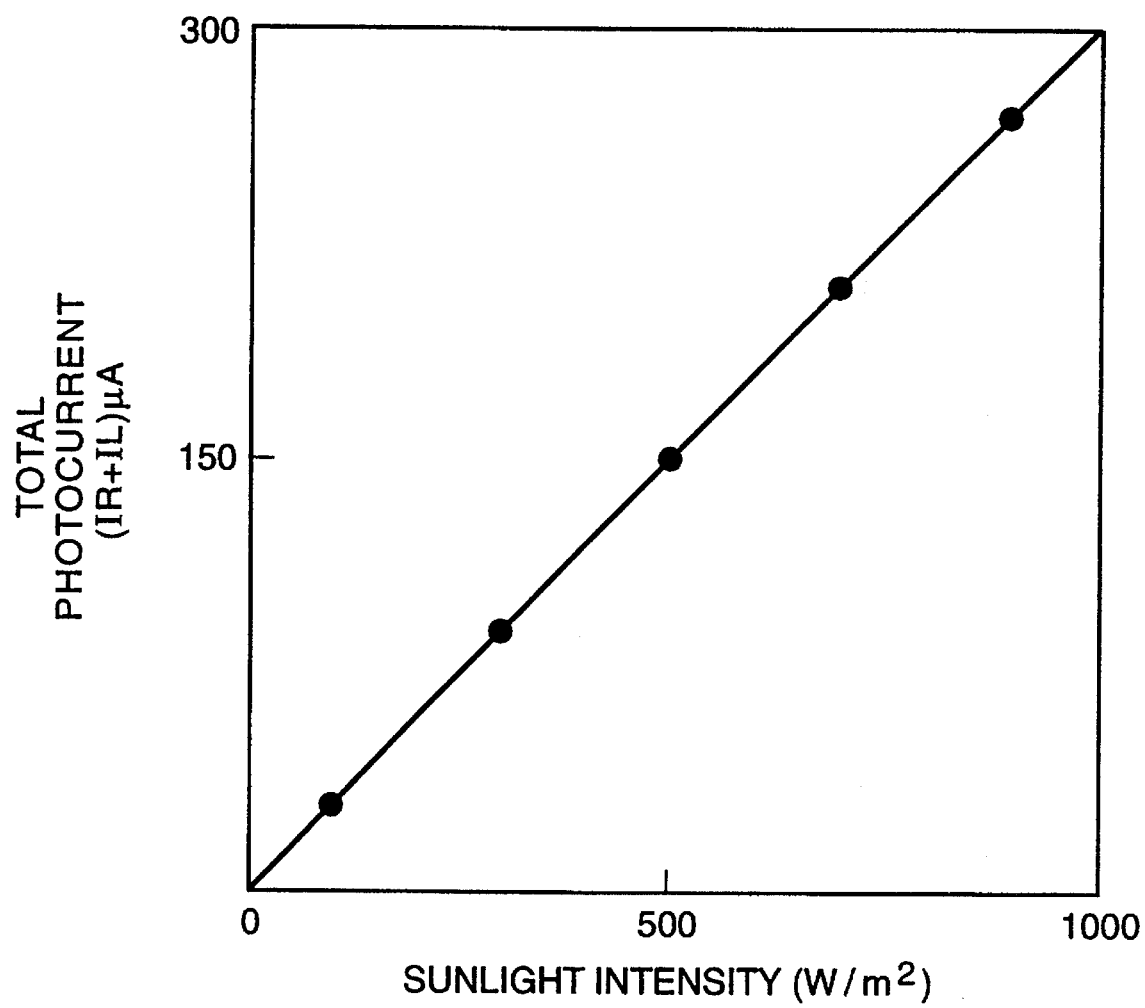
FIG. 12 is a graph showing the relationship between the total photocurrent and the sunlight intensity.
Figure 13:
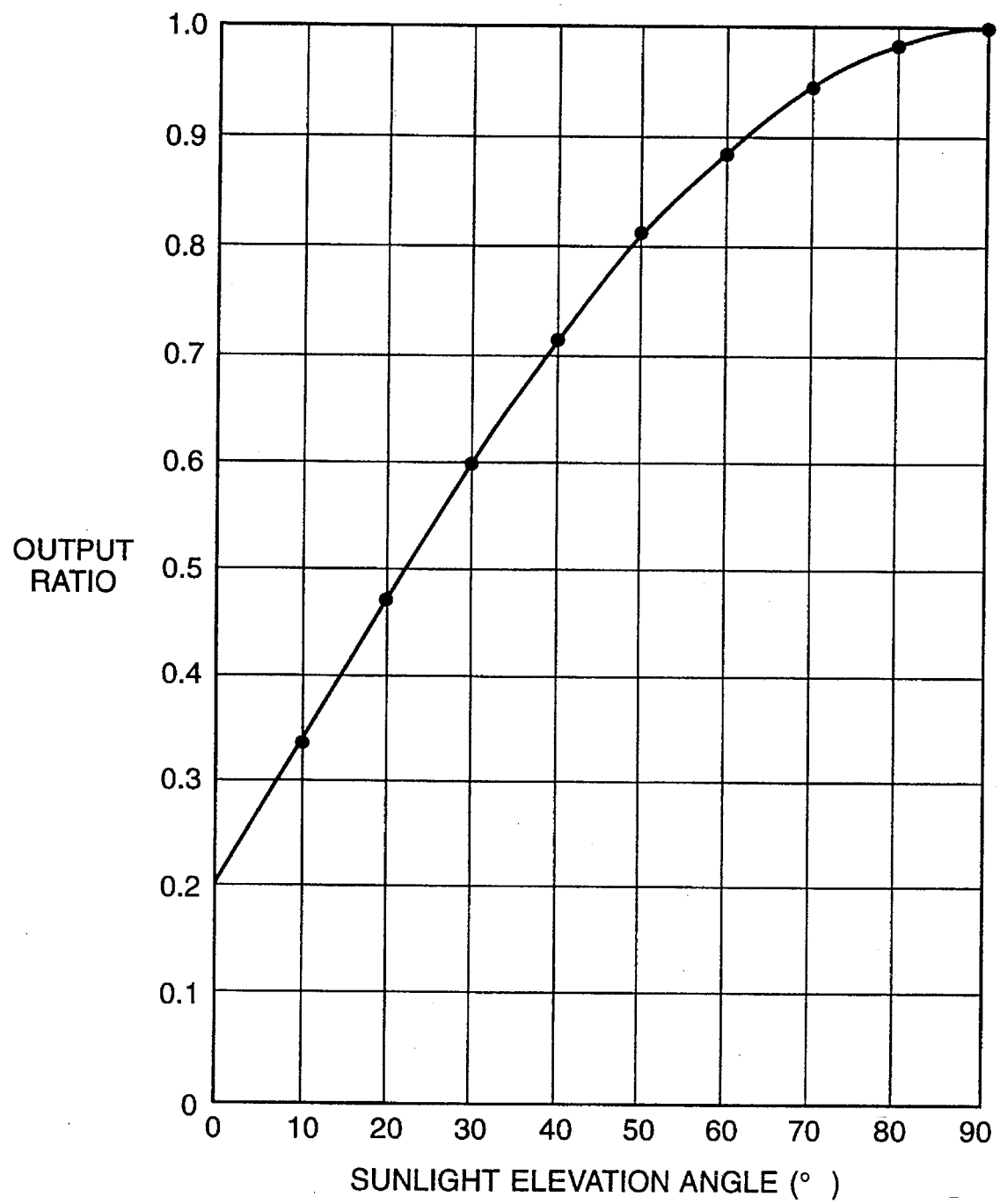
FIG. 13 is a drawing showing the output change characteristics with respect to sunlight elevation.

As shown in FIG. 12, the sunlight intensity is determined as the sum of the photocurrents IL and IR, and is proportional to the intensity of the sunlight. The output characteristics with respect to the sunlight elevation angle θ are shown in FIG. 13. FIG. 13 shows the output characteristics with the sum of the photocurrent IL and IR taken as 1.0 for the case in which the sunlight is perpendicularly incident (sunlight elevation angle θ=90°, direction φ=0°). In FIG. 13, when the sunlight elevation angle θ=0°, the reason an output of 0.2 is still obtained is the existence of diffused sunlight caused by, for example, clouds. These type of output characteristics accurately reflect the thermal load received inside the vehicle from the sunlight, and enable pleasant control of air conditioning which responds accurately to the thermal load inside an actual vehicle.

Furthermore, because the left and right light-detection sections 22L and 22R are provided in one and the same plane, directional dependency is eliminated from the output characteristics of the sunlight sensor 11, so that even if the direction φ is varied, there would be no change in the output characteristics of FIG. 13 previously described, resulting in accurate detection of the sunlight intensity (sunlight thermal load).

In the first embodiment, because the incident sunlight is refracted at the transparent substrate 21 (intermediate element) before it reaches the light-detection sections 22L and 22R, the angle of incidence, θ2, of the sunlight with respect to the light-detection sections 22L and 22R is larger than the above-noted angle sunlight elevation angle θ1 (angle of elevation with respect to the transparent substrate 21). For this reason, along with the reduction in the sunlight elevation angle θ1, the amount the sunlight illuminated region moves to the outside within the light-detection sections 22L and 22R is reduced in comparison with the prior art, making it possible not only to make light-detection sections 22L and 22R small, but also to improve the accuracy of detection of sunlight at a low elevation angle.

Figure 14:
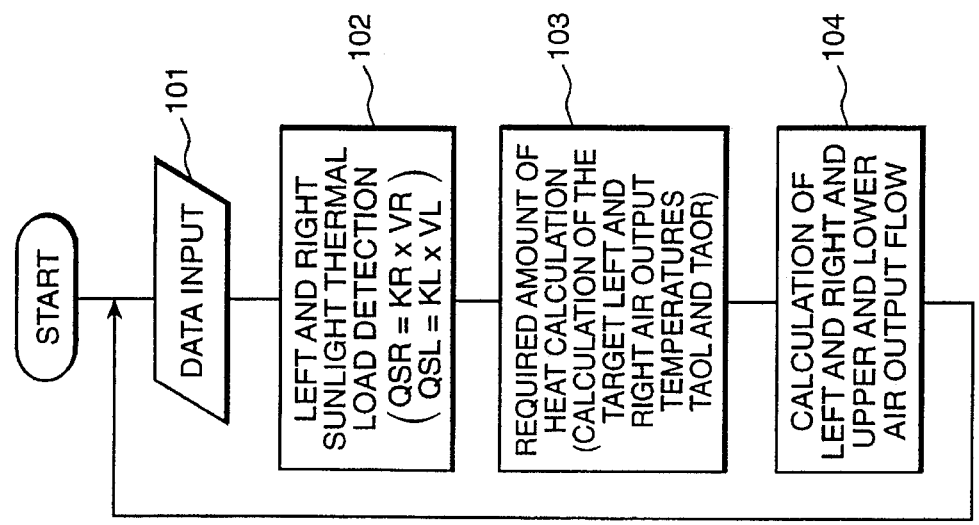
FIG. 14 is a flowchart showing the flow of air conditioning control.

Next, the flow of air conditioner control of the control circuit 41 will be explained, using the flowchart of FIG. 14.

First, data is read in from the sunlight sensor 11 and other sensors 36 to 39 and from the operating panel 40 (step 101). After that, the voltages VL and VR corresponding to the left and right photocurrents IL and IR output from the left and right light-detection sections 22L and 22R are multiplied by the compensation coefficients KL and KR, and the left and right sunlight thermal loads QSL and QSR responsive to the sunlight direction are calculated (step 102). Then the amount of heat required for the left and right air conditioning of the inside of the vehicle (left and right air output target temperatures TAOL and TAOR) are calculated from the above-noted left and right thermal loads QSL and QSR, using the following equations (step 103).

$$TAOL = Kset \cdot Tset - Kr \cdot Tr - Kam \cdot Tam - Ks \cdot QSL + C$$

$$TAOR = Kset \cdot Tset - Kr \cdot Tr - Kam \cdot Tam - Ks \cdot QSR + C$$

In the above equations, Kset, Kr, Kam·Ks, and C are constants, Tset is the temperature setting made manually by a temperature setting switch (not shown in the drawing) on the operating panel 40, Tr is the inside temperature detected by the inside temperature detector 37, and Tam is the outside air temperature detected by the outside air temperature detector 39.

Based on the left and right target output temperatures TAOL and TAOR determined in this manner and the temperature after the evaporator detected by means of the post-evaporator temperature sensor 38, the left and right and upper and lower output air temperatures and flows are calculated (step 104). Thereafter, the execution of above-noted steps 101 to 104 is repeated, the air conditioner 42 being controlled each time in accordance with the calculated left and right and upper and lower air output temperatures and flows.

In the above-described first embodiment, since the left and right light-detection sections 22L and 22R are provided in one and the same plane, the left and right sunlight thermal loads QSL and QSR calculated at step 102 do not exhibit directional dependency, so that even if the direction φ changes accurate values can be determined. For this reason, if the left and right sunlight thermal loads QSL and QSR are summed, this QS=QSL+QSR coincides accurately with the total amount of thermal load received on the inside of the vehicle, making possible pleasant control of air conditioning which responds accurately to the thermal load inside an actual vehicle.

Figure 15:
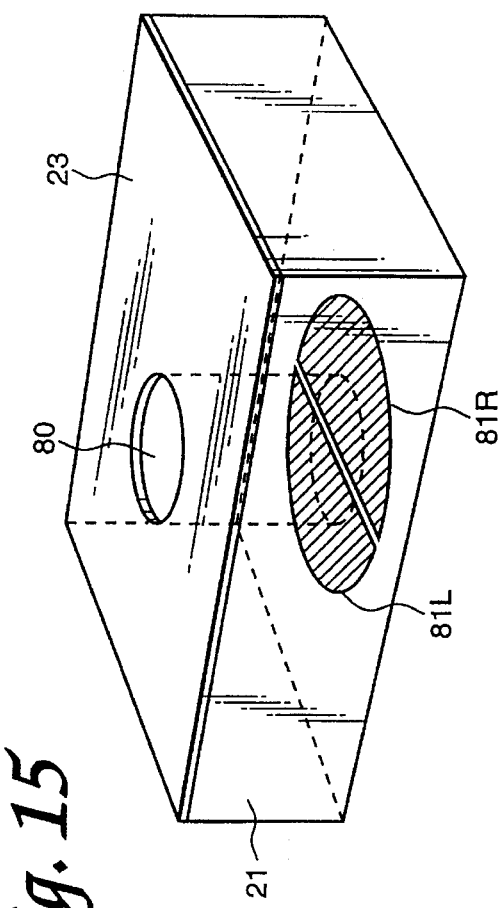
FIG. 15 is a perspective view of a light-sensing element which shows the second embodiment of the present invention.
Figure 16:
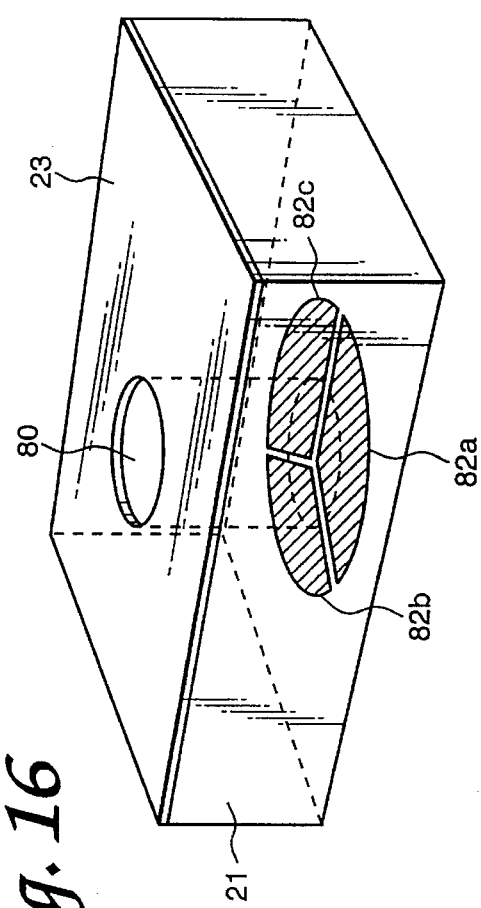
FIG. 16 is a perspective view of a light-sensing element which shows the third embodiment of the present invention.
Figure 17:
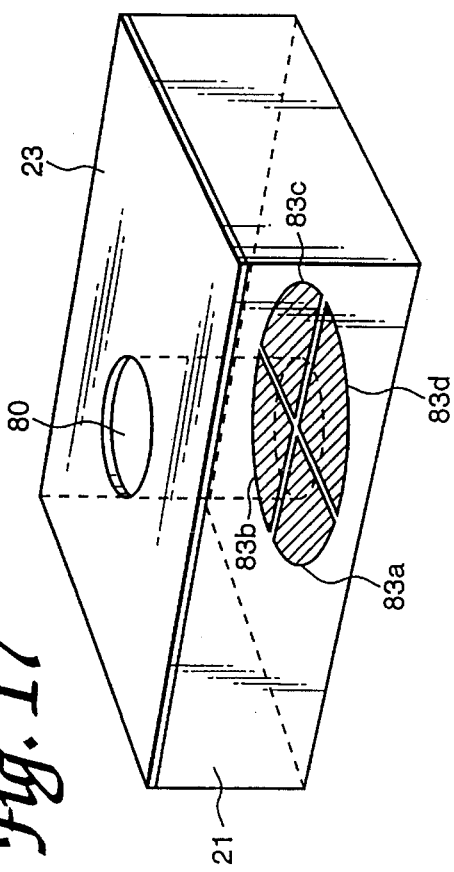
FIG. 17 is a perspective view of a light-sensing element which shows the forth embodiment of the present invention.

In addition, in the above-described first embodiment, although the light-detection sections 22L and 22R and the light-guiding hole 24 are rectangular in shape, as in the second embodiment of the present invention which is shown in FIG. 15, the light-guiding hole 80 can be made round with round left and right light-detection sections 81L and 81R formed to match this, and of course it is obvious that other shapes are also possible. Also, the number of light-detection sections is not limited to two, and can be three, as shown in FIG. 16, which illustrates the third embodiment of the present invention, in which there is the combination of the three fan-shaped light-detection sections 82a, 82b, and 82c, enabling the detection three independent sunlight thermal loads from three directions. It is also possible, as shown in FIG. 17, which shows the forth embodiment of the present invention, to have the combination of the four fan-shaped light-detection sections 83a, 83b, 83c, and 83d, enabling the detection four independent sunlight thermal loads from four directions.

Figure 18:
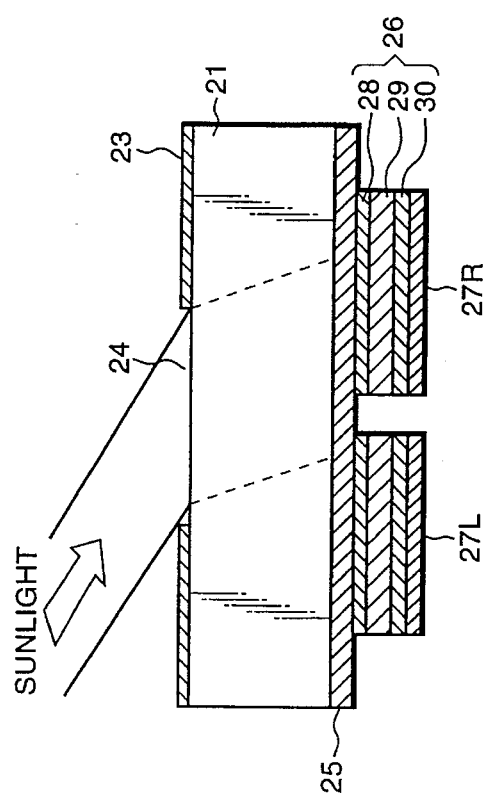
FIG. 18 is a cross-sectional view of a light-sensing element which shows the fifth embodiment of the present invention.

Also, while in the above-noted first embodiment, the light-sensing element 12 has the reverse-side electrode 27 as the common input electrode, the transparent conductive layers 25L and 25R being separated left and right, with output signals taken from each of the transparent conductive layers 25L and 25R, it is also possible to do the opposite of this, as shown in FIG. 18, which illustrates the fifth embodiment of the present invention, and to take the transparent conductive layer 25 as the common input electrode, and to separate the reverse-side electrodes 27L and 27R right and left, the output signals being taken from the reverse-side electrodes 27L and 27R.

Figure 19:
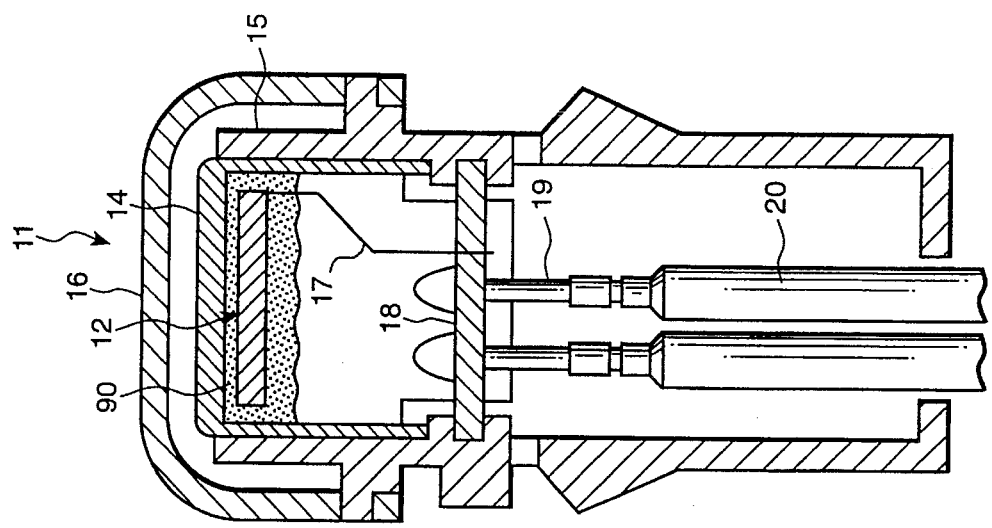
FIG. 19 is a cross-sectional view of a light-sensing element which shows the sixth embodiment of the present invention.

Also, in the previously described first embodiment, while, with the exception of the central part of the upper surface, the light-sensing element 12 is held by means of the light-blocking molded resin piece 13, so that light does not enter from the bottom or side of the transparent substrate 21, it is also possible, as shown in FIG. 19, which shows the sixth embodiment of the present invention, to mold the entire of light-sensing element 12 (including the top surface) into transparent molded resin 90, made of a transparent silicone resin or other material, the transparent molded resin 90 filing the space between the top surface of the light-sensing element 12 and the transparent holder 14. In this case, to prevent light from entering from the side or bottom of the transparent substrate 21, it is possible either to cover the side and bottom of the transparent substrate 21 with a light-blocking layer, or to make the outer circumference of the transparent holder 14 have light-blocking properties.

As shown in this sixth embodiment, if the transparent resin 90 is filled into the space between the top surface of the light-sensing element 12 and the transparent holder 14, it is possible to reduce the reflection of light occurring when incident light passes through the bottom surface of the transparent holder 14 and the top surface of the light-sensing element 12, thereby producing the advantage of making the amount of light incident to the light-sensing element 12 large. In contrast to this, if there is a layer of air (index of refraction n=1) between the top surface of the light-sensing element 12 and the transparent holder 14, light will tend to reflect at the boundary between the transparent holder 14 and the layer of air and at the boundary between the layer of air and the light-sensing element 12.

Examples of detecting sunlight thermal loads from two to four directions have been described above as the first to sixth embodiments. In the examples of the third and fourth embodiments, in which there are three or more light-detection sections, it is possible from this information to calculate the sunlight elevation angle θ1, the sunlight direction φ, and the sunlight intensity A.

Figure 20:
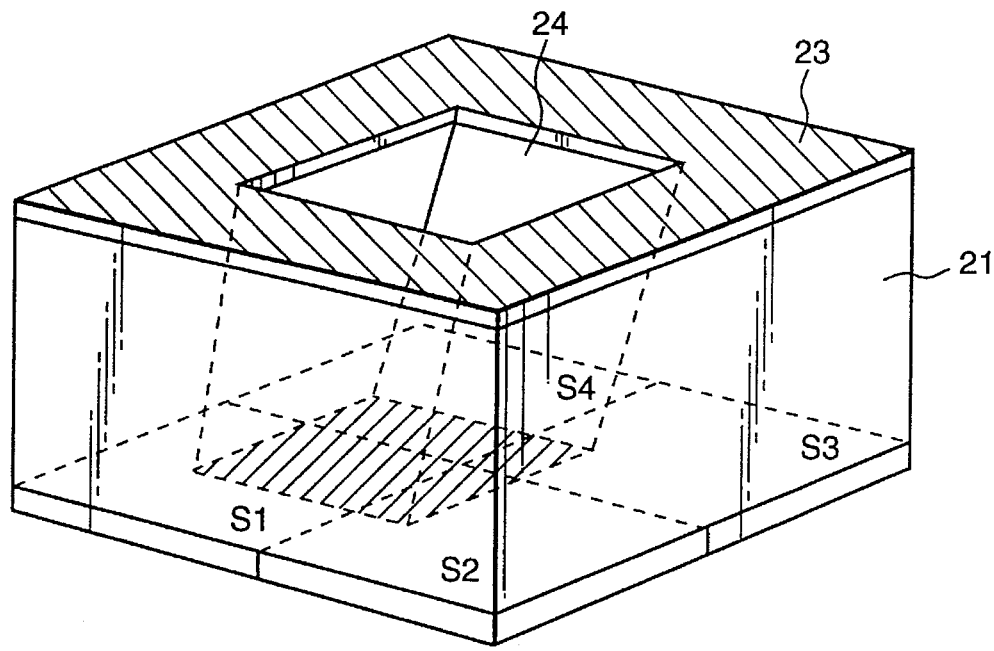
FIG. 20 is a perspective view of a light-sensing element which shows the seventh embodiment of the present invention.

The following is an explanation of the method of calculating the sunlight elevation angle θ1 and sunlight direction φ, based on the seventh embodiment of the present invention shown in FIG. 20. In the seventh embodiment, four square light-detection sections S1, S2, S3, and S4 are formed on the bottom surface of the transparent substrate 21. The remainder of the configuration is the same as the 1st embodiment, which was previously described.

If the output currents of the light-detection sections S1, S2, S3, and S4 are I1, I2, I3, and I4, respectively and the shape of the light-guiding hole 24 of the light-cutoff film 23 is a square having a side length of r, the center of the area of the illuminated region is given by Equation (5) and Equation (6) as follows.

$$X = r \times (I1 - I2)/(2I1 + 2I2) \qquad (5)$$

$$Y = r \times (I1 - I4)/(2I1 + 2I4) \qquad (6)$$

Also, if the transparent substrate 21 thickness is t, the angle θ2 of elevation of the sunlight to the light-detection sections S1, S2, S3, and S4 is determinable by the following Equation (7)

$$\theta 2 = \tan^{-1}\left(\frac{t}{\sqrt{X^2 + Y^2}}\right) \qquad (7)$$

Further, if the index of refraction of the transparent substrate 21 is n (n>1), the sunlight elevation angle (angle of elevation of incidence with respect to the transparent substrate 21) is given by the following Equation (8).

$$\theta_1 = \cos^{-1}(n \times co\theta 2) \qquad (8)$$

The sunlight direction φ is calculable from the following Equation (9) through Equation (11).

1 For X>0 and Y>0:

$$\phi = \tan^{-1}(X/Y) - \pi \qquad (9)$$

2 For X<0 and Y>0:

$$\phi = \tan^{-1}(X/Y) + \pi \qquad (10)$$

3 For Y<0:

$$\phi = \tan^{-1}(X/Y) \qquad (11)$$

The sunlight intensity A can be determined from the following Equation (12).

$$A = (I1 + I2 + I3 + I4)/\sin\theta_1 \qquad (12)$$

Figure 21:
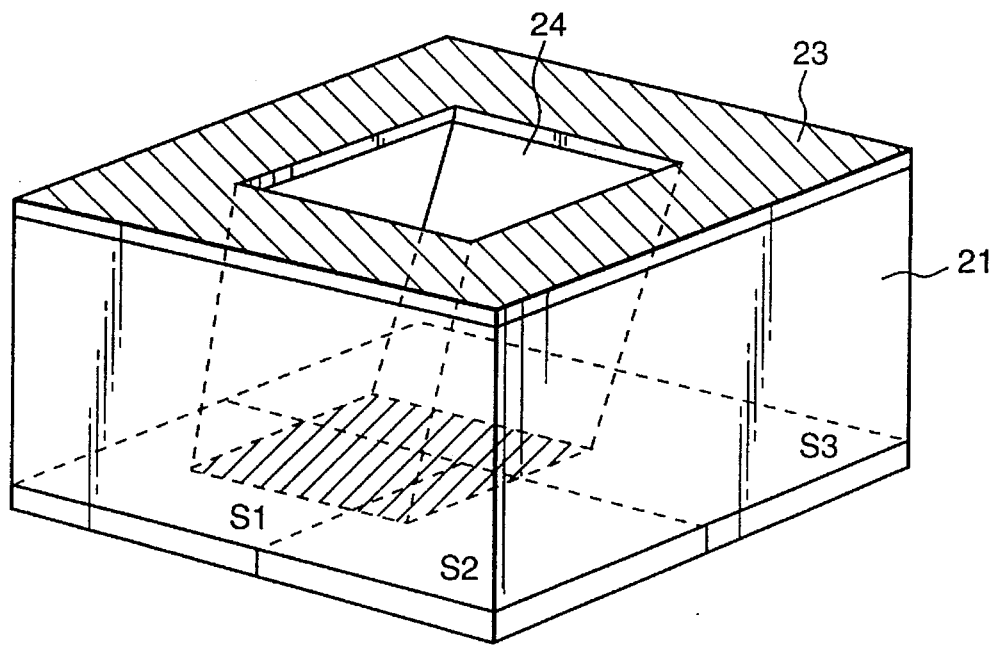
FIG. 21 is a perspective view of a light-sensing element which shows the eighth embodiment of the present invention.

In the above-described seventh embodiment, although there are four light-detection sections, it is also possible, as shown in the eighth embodiment of the present invention which is illustrated in FIG. 21, to use a light detector which is divided into the three light-detection sections S1, S2, and S3, in which case the only change would be the following change in Equation (6).

$$Y = r^x(I1+I2-I3)/(2I1+2I2+2I3) \tag{6'}$$

Aside from this equation, exactly the same equations can be used in the calculations.

What follows is an explanation of the ninth embodiment of the present invention, based on FIG. 22 through FIG. 35.

Figure 4:
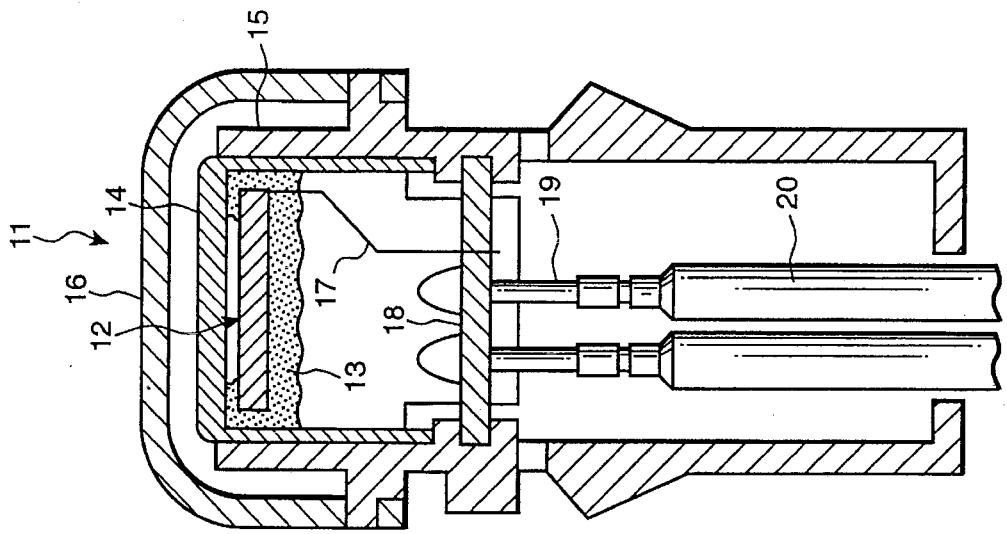
FIG. 4 is a cross-sectional view of a sunlight sensor.

Because the overall configuration of the sunlight sensor of the ninth embodiment is basically the same as the overall configuration of the first embodiment, which is shown in FIG. 4, the description of elements having the same reference symbols will be omitted and only those elements which differ will be described.

Figure 22:
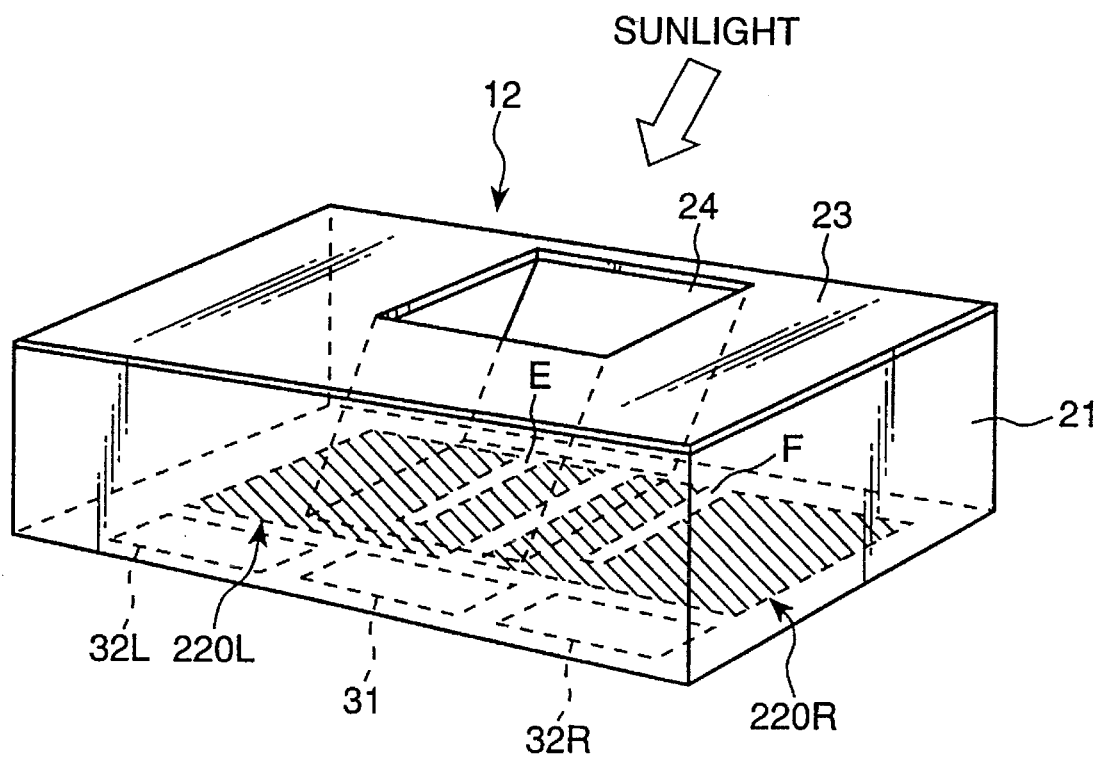
FIG. 22 is a perspective view of a light-sensing element which shows the ninth embodiment of the present invention.
Figure 23:
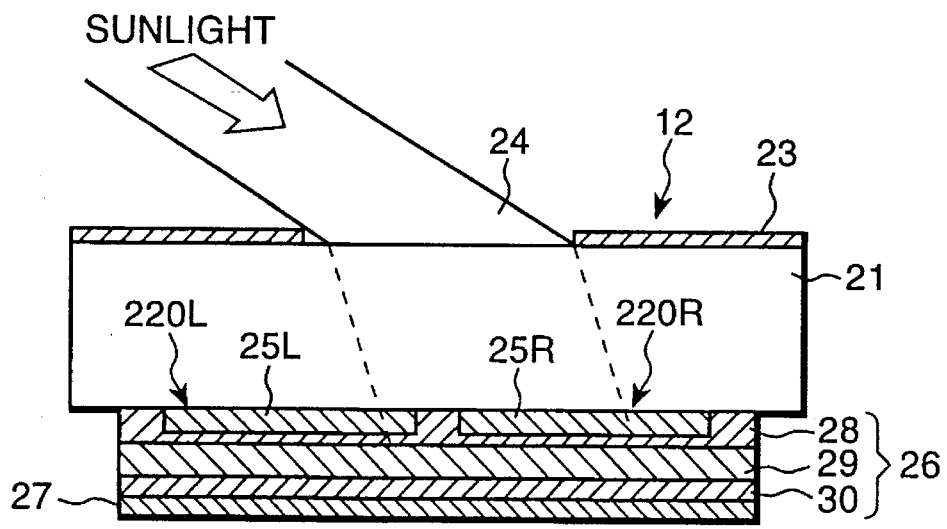
FIG. 23 is a cross-sectional view of a light-sensing element.
Figure 24:
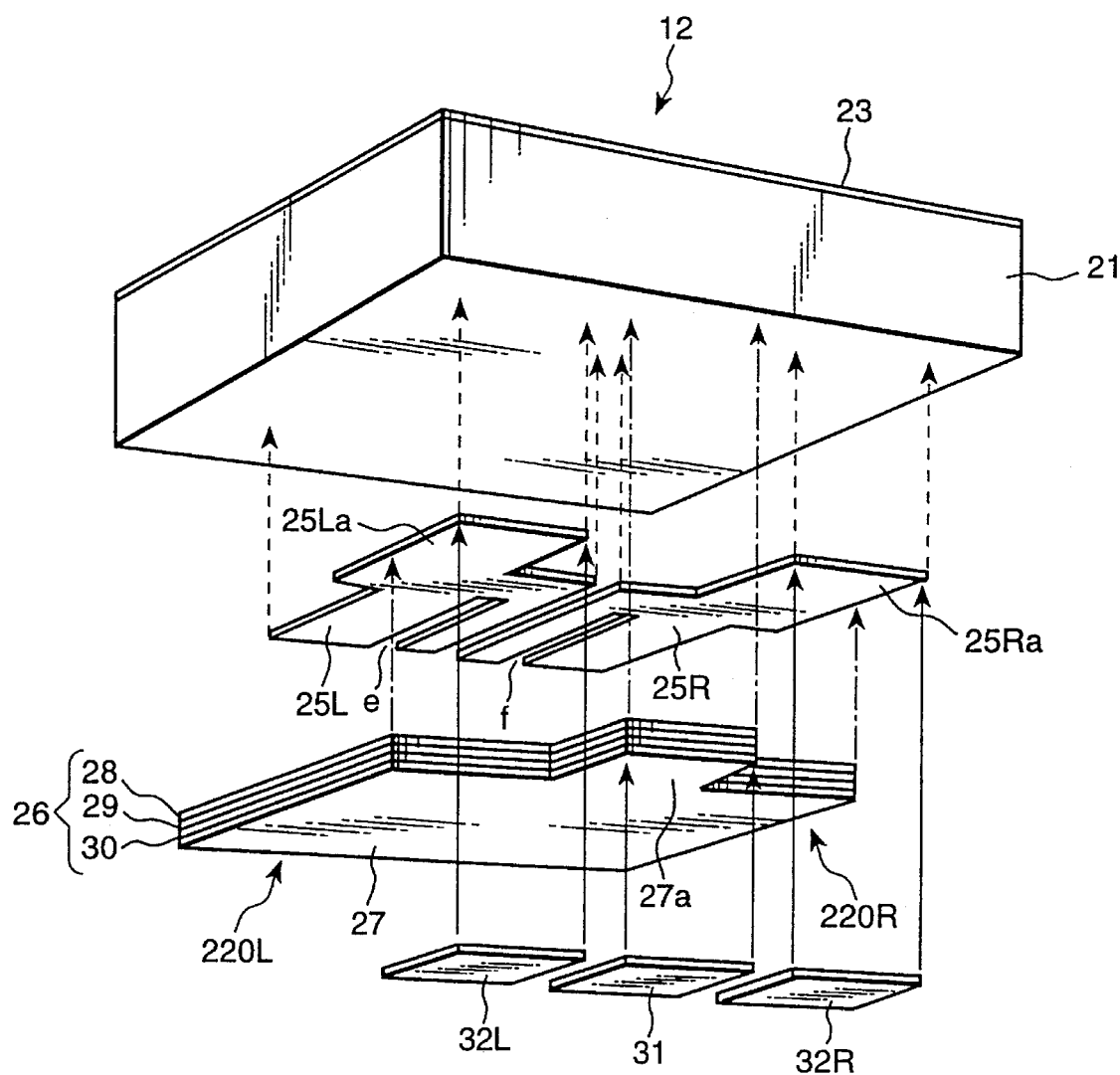
FIG. 24 is an exploded perspective view of a light-sensing element.

The overall configuration of the sunlight sensor of the ninth embodiment is shown in FIG. 22, FIG. 23, and FIG. 24, the difference between this and the 1st embodiment being the shape of the left and right light-detection sections 220L and 220R. What follows is a detailed description the characteristic features of the ninth embodiment.

Figure 25A:
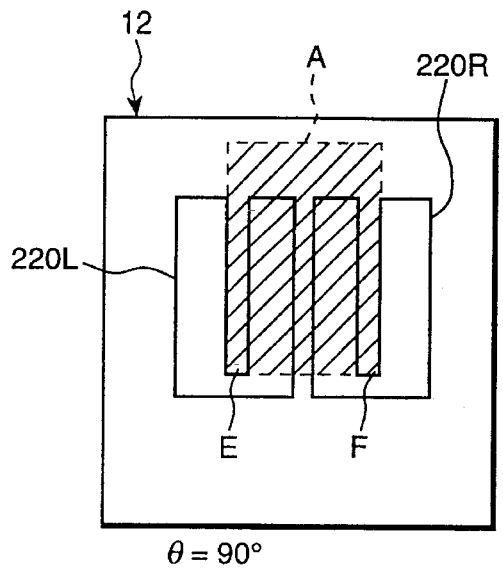
FIG. 25(a), FIG. 25(b), FIG. 25(c) and FIG. 25(d) are the first drawings which explain the positional relationship and light-receiving region of the left and right light-detection sections and the light-guide holes.

As shown in FIG. 22, the light-guiding hole 24 is formed in a rectangular shape, with the slit-shaped non-detecting regions E and F, which do not detect sunlight, formed so as to extend from the front (upper side of the drawing) to the rear (lower side of the drawing). Each of these non-detecting regions E and F, as shown in FIG. 24, are made by forming slits e and f in the transparent conductive layers 25L and 25R. The positional relationship between the light-guiding hole 24 of the first embodiment and each of the light-detection sections 220L and 220R, as shown in FIG. 25(a), is such that for a sunlight elevation angle of θ=90° the left and right edges of the illuminated region A indicated by the shaded area coincide with the outer edges of the left and right non-detecting regions E and F, with the rear edge (lower side of the drawing) of the illuminated region A coinciding with the rear edge of the non-detection regions E and F (upper side of the drawing).

Figure 25B:
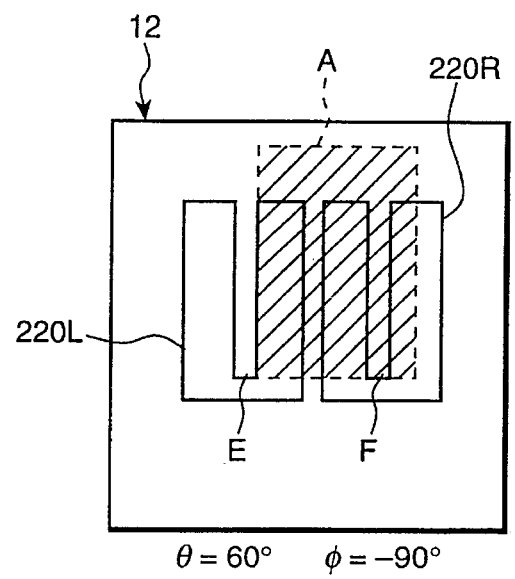
Figure 25C:
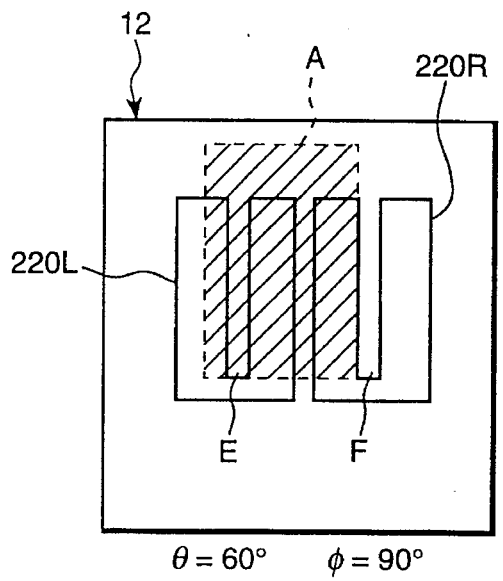

In addition, as shown in FIG. 25(b) and 25(c), for the case in which the sunlight elevation angle θ=60° and the sunlight direction φ=±90° (sunlight from the left and right directions), the illuminated region A is skewed off from either the E or the F non-detection region. Therefore, when the sunlight direction φ=±90°, with the sunlight elevation angle θ in the range 90° to 60° even if the sunlight elevation angle θ drops, there will be no change in the illuminated surface area of one of the light-detection sections 220OL and 220R, there being an increase in the illuminated region surface area in only the other light-detection section. With a sunlight elevation angle θ of below 60° however, because the illuminated region A is skewed off from either the E or the F non-detection region, there is a reduction in the illuminated region surface area of one of the light-detection sections 220L and 220R, and an equal increase in the illuminated region surface area of the other light-detection section.

Figure 25D:
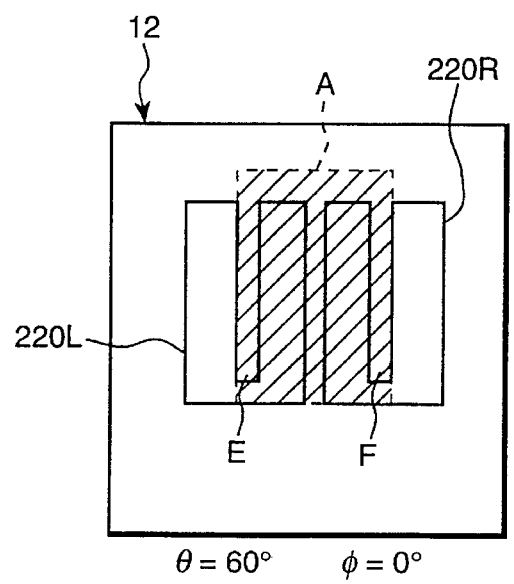

As shown in FIG. 25(d), in the case in which the sunlight direction φ=0° (sunlight from the front direction) and the sunlight elevation angle θ becomes θ=60°, the rear edge (lower side of the drawing) of the illuminated region A coincides with the rear, edge (low side of the drawing) of the light-detection sections 220L and 220R. Therefore, when the sunlight direction φ=0°, if the sunlight elevation angle is in the range 90° to 60°, although as the sunlight elevation angle θ becomes low, the amount of surface area illuminated by the sunlight with respect to the light-detection sections 220L and 220R increases, along with a reduction in the sunlight elevation angle θ, the output per unit of surface area of the light-detection sections 220L and 220R decreases in proportion to sin θ, so that when the sunlight elevation angle θ is in the range 90° to 60°, the increase in the illuminated region surface area and the decrease in output per unit surface area cancel each other out, thereby reducing making small the change in the output of the light-detection sections 220L and 220R.

However, in the case in which the sunlight direction φ=0°, if the sunlight elevation angle θ is below 60°, because the illuminated region surface area of light-detection sections 220L and 220R does not change, but remains constant, the outputs of light-detection sections 220L and 220R are reduced in proportion to sin θ, resulting in an output responsive to the sunlight intensity (sunlight thermal load).

Figure 26A:
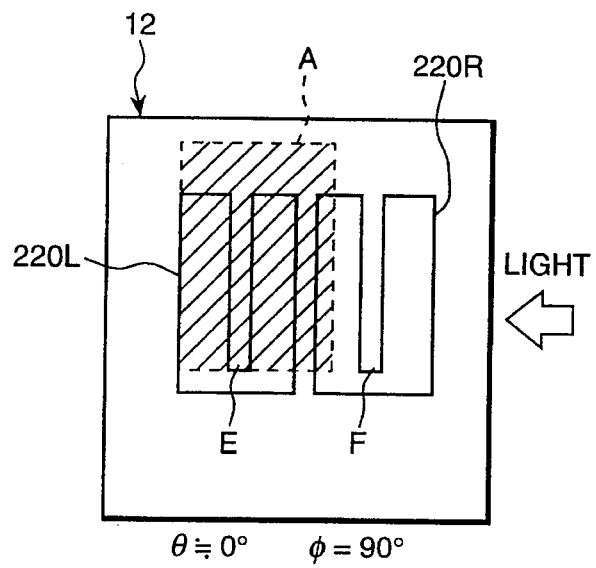
FIG. 26(a), FIG. 26(b), FIG. 26(c) and FIG. 26(d) are second drawings which explain the positional relationship and light-receiving region of the left and right light-detection sections and the light-guide holes.
Figure 26B:
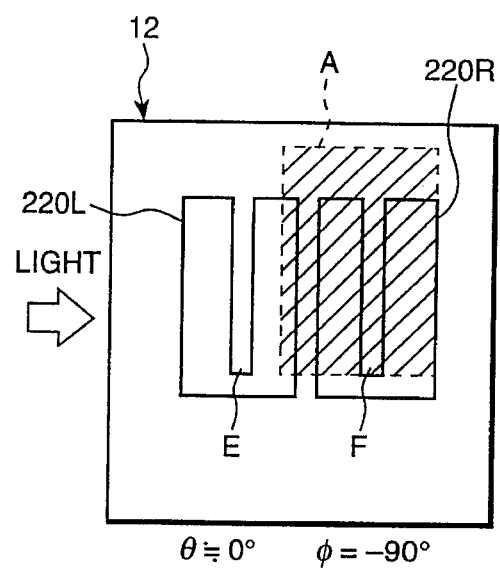
Figure 26C:
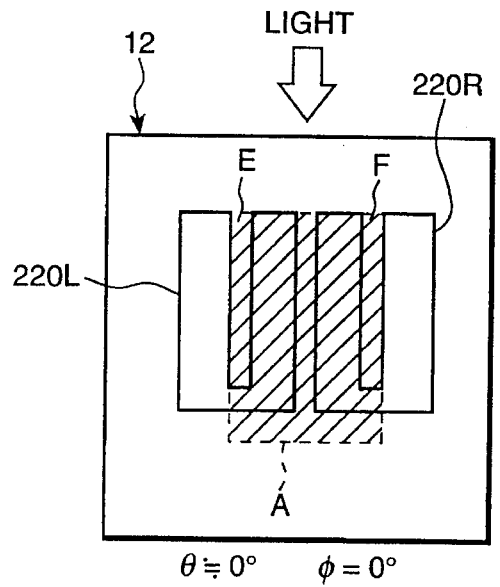

In the case in which the sunlight is incident in the horizontal left and right direction (sunlight elevation angle θ=approximately 0°, direction φ=±90°), as shown in FIG. 25(a) and 25(b), the entire surface of either light-detection section 220L or 220R is inside the illuminated region A. In addition, if the sunlight is incident from the horizontal front direction (sunlight elevation angle θ=approximately 0°, direction φ=0°), as shown in FIG. 26(c), the front edge of the illuminated region (top edge in the drawing) coincides with the front edge of transparent holder light-detection sections 220L and 220R (top edges in the drawing). Further, in the case in which the sunlight sensor 11 is installed on the dashboard at the front of the vehicle, because sunlight from the rear direction is cutoff by the roof of the vehicle, the shape of the light-detection sections 220L and 220R can be established accordingly.

A sunlight sensor having the configuration of the ninth embodiment, as in the case of the first embodiment, can be mounted horizontally on the top surface of the dashboard at the front of a vehicle, with the light-detection sections 220L and 220R positioned to the left and right. As was shown for the case of the first embodiment in FIG. 9, the vehicle can also be fitted with, in addition to the sunlight sensor, such elements as an outside air sensor, a cabin temperature sensor, a post-evaporator temperature sensor that detects the temperature at the rear of the cooler (not shown in the drawing), a water temperature sensor that detects the temperature of the engine cooling water, and an operating panel which is provided with a variety of operating switches (not shown in the drawing), for the purpose of automatically controlling the air conditioner. The control circuit used in the ninth embodiment is basically similar to that used in the first embodiment, and the flow of air conditioning control is the same as shown in the flowchart of the first embodiment (refer to FIG. 14).

The detection principle of the sunlight sensor having the above-described configuration is the same as that of the 1st embodiment, with its output values being as follows.

Figure 27A:
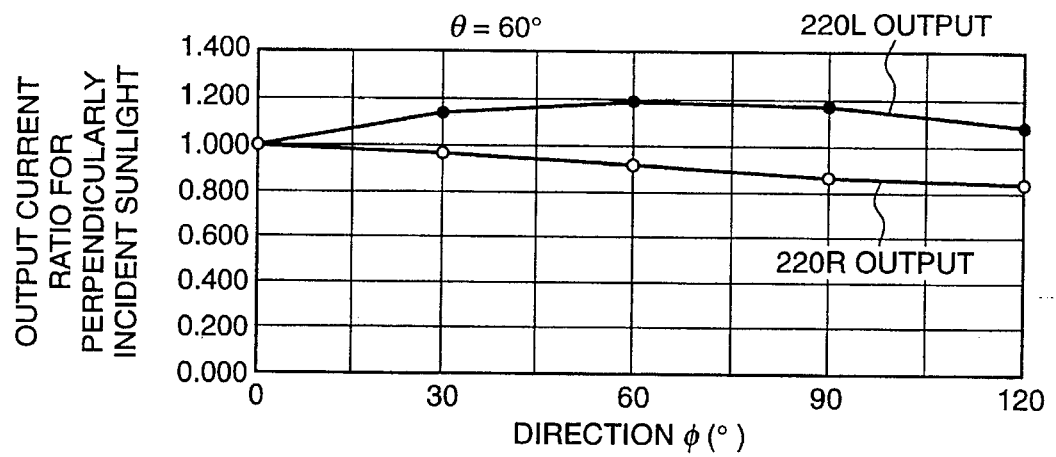
FIG. 27(a), FIG. 27(b), FIG. 27(c) are graphs showing the output characteristics of the left and right light-detection sections.
Figure 27B:
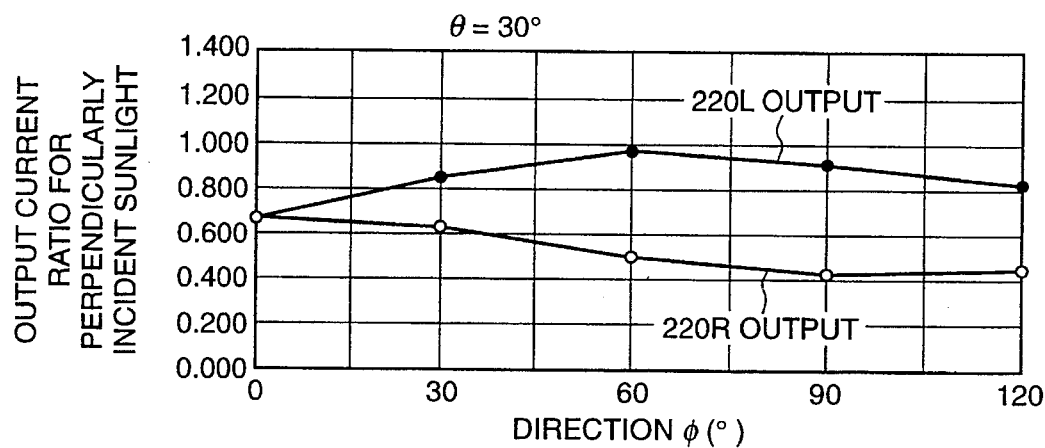
Figure 27C:
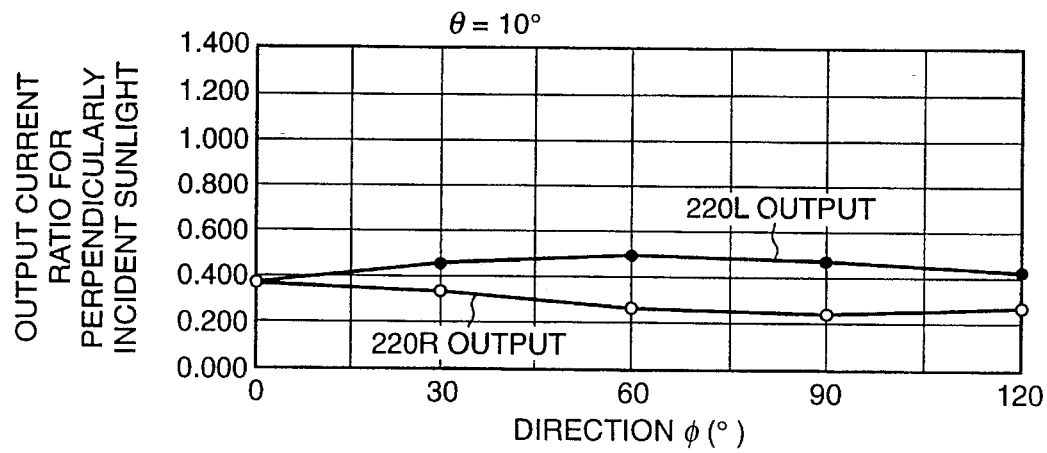

For example, if the sunlight is incident from the left side, because there will be more sunlight striking the right-side light-detection section 220R, the photocurrent IR (VR) of the right-side light-detection section 220R will be larger than the photocurrent IL of the left-side light-detection section 220L, making it possible to determine how much sunlight is incident from the left side. According to measurement results of the present invention, the measured left and right output characteristics are as shown in FIG. 27 (a), 27(b), and 27(c). FIGS. 27(a)–27(c) show the output ratio with the photocurrent values IL and IR taken as 1.0 for the case of perpendicular sunlight (sunlight elevation angle $\theta=90°$, direction $\phi=0°$).

Figure 28:
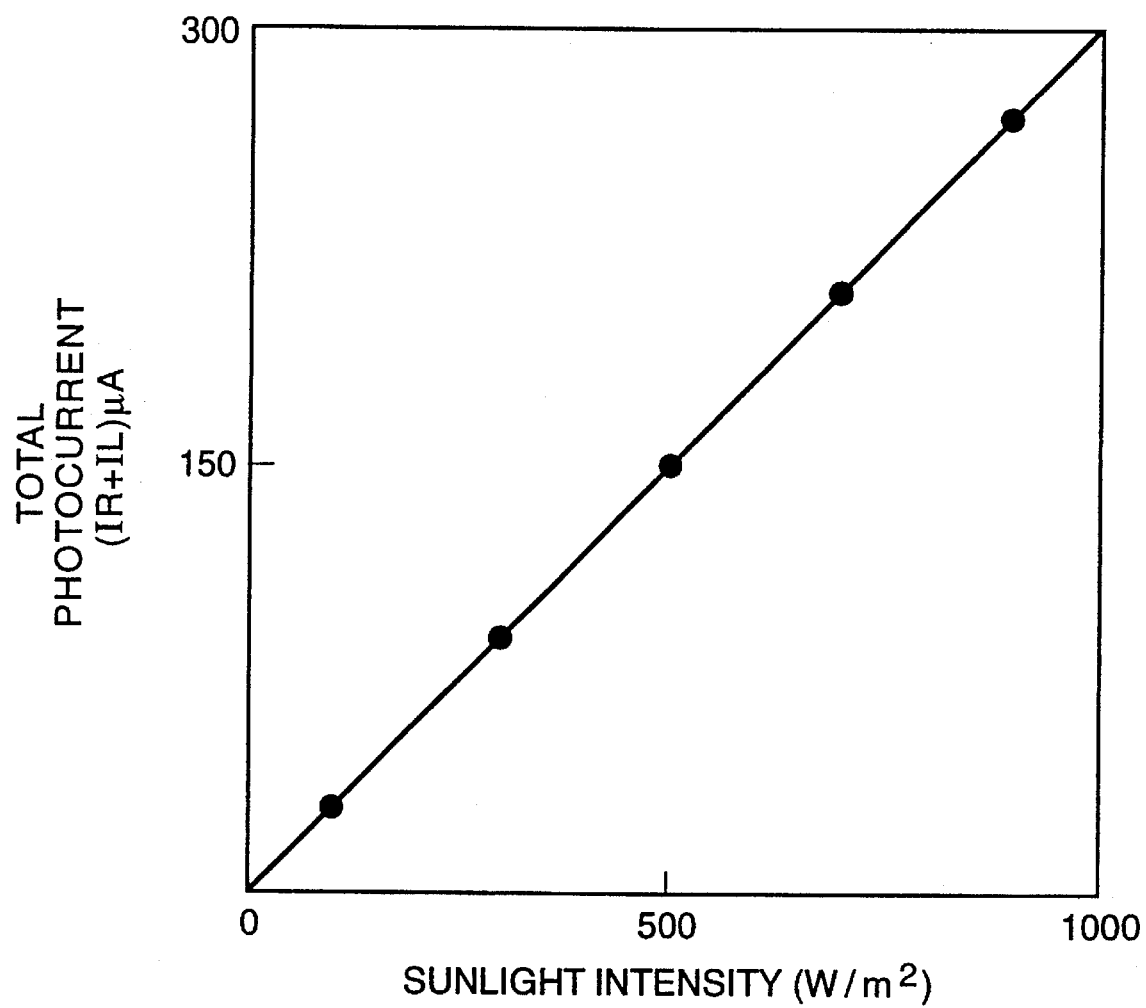
FIG. 28 is a graph showing the relationship between the total photocurrent and the sunlight intensity.
Figure 29:
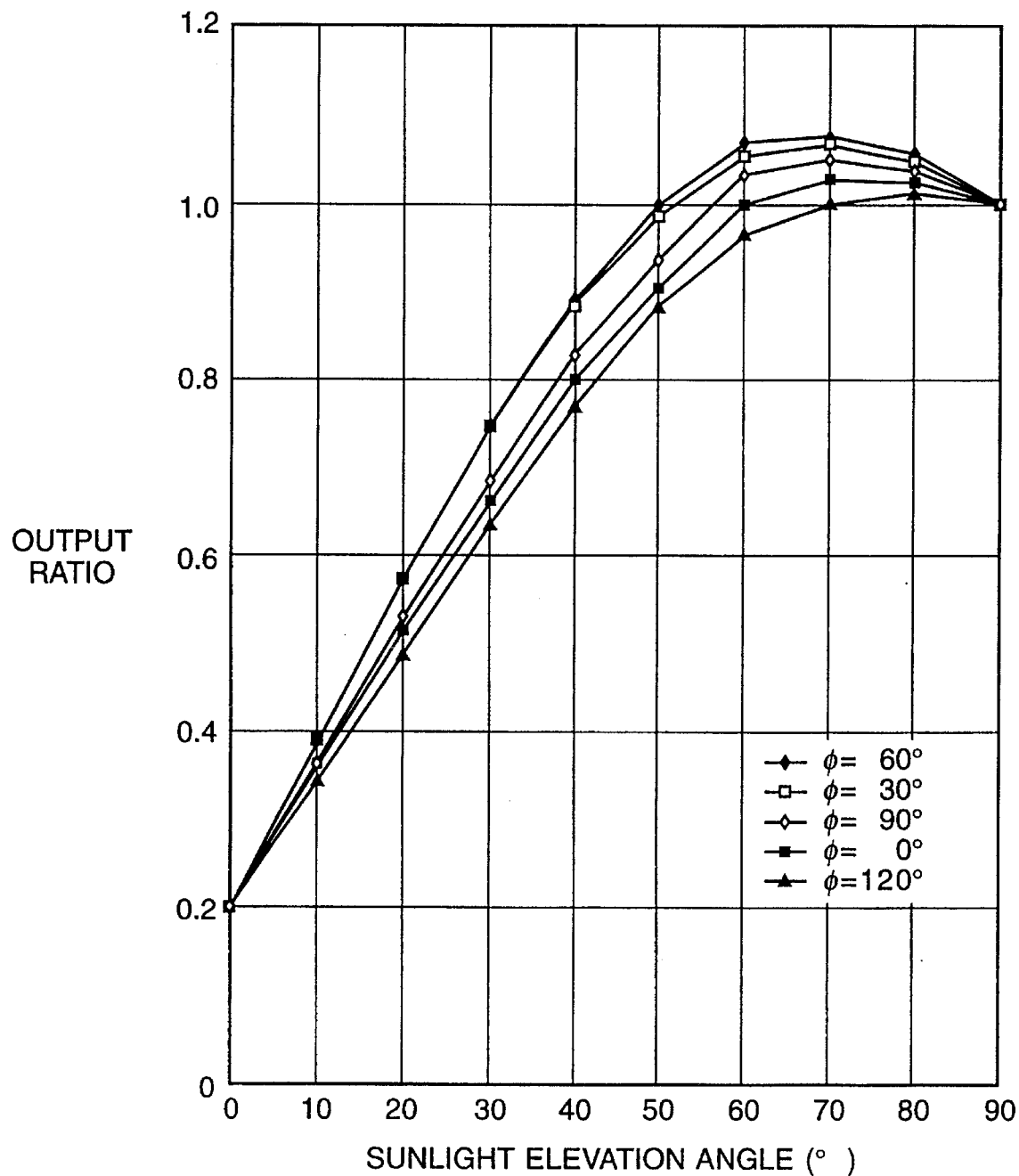
FIG. 29 is a graph showing the output change characteristics with respect to sunlight elevation.

As shown in FIG. 28, the sunlight intensity is determined as the sum of the photocurrents IL and IR, and is proportional to the intensity of the sunlight. The output characteristics with respect to the sunlight elevation angle $\theta$ are shown in FIG. 29. FIG. 29 shows the output characteristics with the sum of the photocurrent IL and IR taken as 1.0 for the case in which the sunlight is perpendicularly incident (sunlight elevation angle $\theta 0=90°$, direction $\phi=0°$). In FIG. 29, when the sunlight elevation angle $\theta=0°$, the reason an output of 0.2 is still obtained is the existence of diffused sunlight caused by, for example, clouds.

A feature of the output characteristics of FIG. 29 is that when, for example, the sunlight elevation angle $\theta$ is below 60° (i.e., when there are relatively few shadows inside the vehicle), the output increases along an approximately sinusoidal curve, but when the proportion of shadows becomes large, at for example 60°, the output rate of increase reaches a ceiling, and in the region of 70° to 80° the output begins to decrease. Output characteristics such as these are preferred in the case in which the sunlight sensor 11 is to be used in air conditioner control of a vehicle, and because the higher the sunlight elevation angle $\theta$ becomes the larger the proportion of shadows inside the vehicle becomes, this characteristic is ideal, since it accurately reflects the special situation in a vehicle in which the thermal load does not increase even if the sunlight elevation angle becomes larger than, for example, 60° C., thus enabling pleasant control of air conditioning which responds accurately to the thermal load inside an actual vehicle. Such ideal sensor output characteristics are achieved by the forming the slit-shaped non-detection regions E and F in the left and right light-detection sections 220L and 220R.

With respect to this, in contrast to the ninth embodiment, if a configuration is used in which the non-detection regions E and F are not provided in the light-detection sections 220L and 220R (that is, the configuration in which light is detected even over the regions E and F), even if the sunlight elevation angle $\theta$ increases beyond 60°, the output will continue to increase along a sinusoidal curve, making it impossible to achieve an output that accurately reflects the sunlight thermal load inside the vehicle.

In the ninth embodiment, because the left and right light-detection sections 220L and 220R are provided in one and the same plane, directional dependency is eliminated from the output characteristics of the sunlight sensor 11, so that even if the direction $\phi$ is varied, there would be no change in the output characteristics of FIG. 29 previously described, enabling accurate detection of the sunlight intensity (sunlight thermal load).

In the above-described ninth embodiment as well, because the left and right light-detection sections 220L and 220R are provided in one and the same plane, the left and right sunlight thermal loads QSL and QSR calculated in step 102 do not exhibit directional dependency, so that even if the direction $\phi$ changes, it is possible to obtain highly accurate values. For this reason, if the sum of the left and right sunlight thermal loads QSL and QSR is taken, this corresponds closely to the total sunlight thermal load received by the vehicle from the sunlight, so that QS can be treated as being equal to QSL+QSR.

Furthermore, in the ninth embodiment, because of the provision of the non-detection regions E and F at the appropriate position on the light-detection sections 220L and 220R, in the range of sunlight elevation angle $\theta$ in which the inside of the vehicle has a large portion of shadows caused by the vehicle roof (for example, at 60° or greater), even if the sunlight elevation angle $\theta$ increases further, the summed outputs of the light-detection sections 220L and 220R reaches a ceiling, and in the region of 70° to 80° the output begins to decrease. For this reason, these output characteristics are ideal in accurately reflecting the special situation in a vehicle in which the thermal load does not increase even if the sunlight elevation angle becomes larger than, for example, 60° C., thus enabling pleasant control of air conditioning which responds accurately to the thermal load inside an actual vehicle.

That is, by forming the non-detection regions in the light-detection sections, the surface area which receives sunlight is varied to enable measurement of the sunlight thermal load.

In the above-described ninth embodiment, although the special situation of a vehicle can be considered in performing compensating the output change so that the summed output of the light-detection sections 220L and 220R reach a ceiling when the sunlight elevation angle exceeds 60°, the compensation range, of course, can be changed, according to the type of vehicle into which the sunlight sensor 11 is installed, as well as other installation location conditions.

Figure 26D:
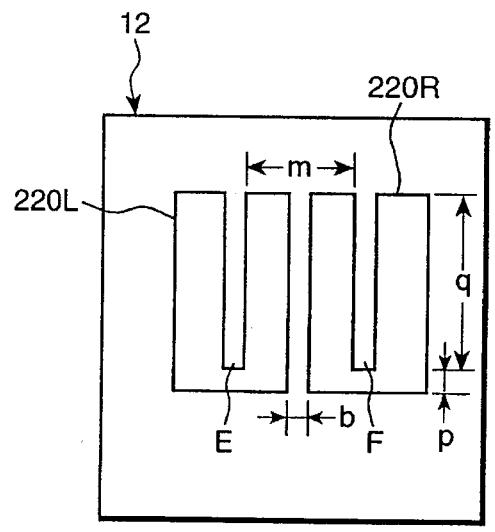

For example, to increase the compensation range with sunlight from the left and right directions, the spacing m between non-detection regions E and F (refer to FIG. 26(d)) can be made small, and to make the compensation range narrow, the spacing m between non-detection regions E and F can be made large. To change the degree of compensation, regardless of the sunlight elevation angle being high or low, it is possible to change the ratio of the region upon which the sunlight impinges. In this case, to increase the degree of compensation, it is possible, for example, to make the spacing b between the light-detection sections 220L and 220R large, and to make the degree of compensation small, it is possible to make the spacing b between the light-detection sections 220L and 220R small.

On the other hand, to broaden the compensation range with respect to light incident from the front direction, it is possible to make the width p of the rear of the detection region (bottom in the drawing) (refer to FIG. 26(d)) larger than the non-detection regions E and F, and to make the compensation range narrow, it is possible to make p smaller. To change the degree of compensation, it possible to change the ratio of the non-detection regions E and F with respect to p. In this case, to increase the degree of compensation, the ratio of q with respect to p can be made small, and to decrease the degree of compensation, the ratio of q to p can be made large.

Figure 30:
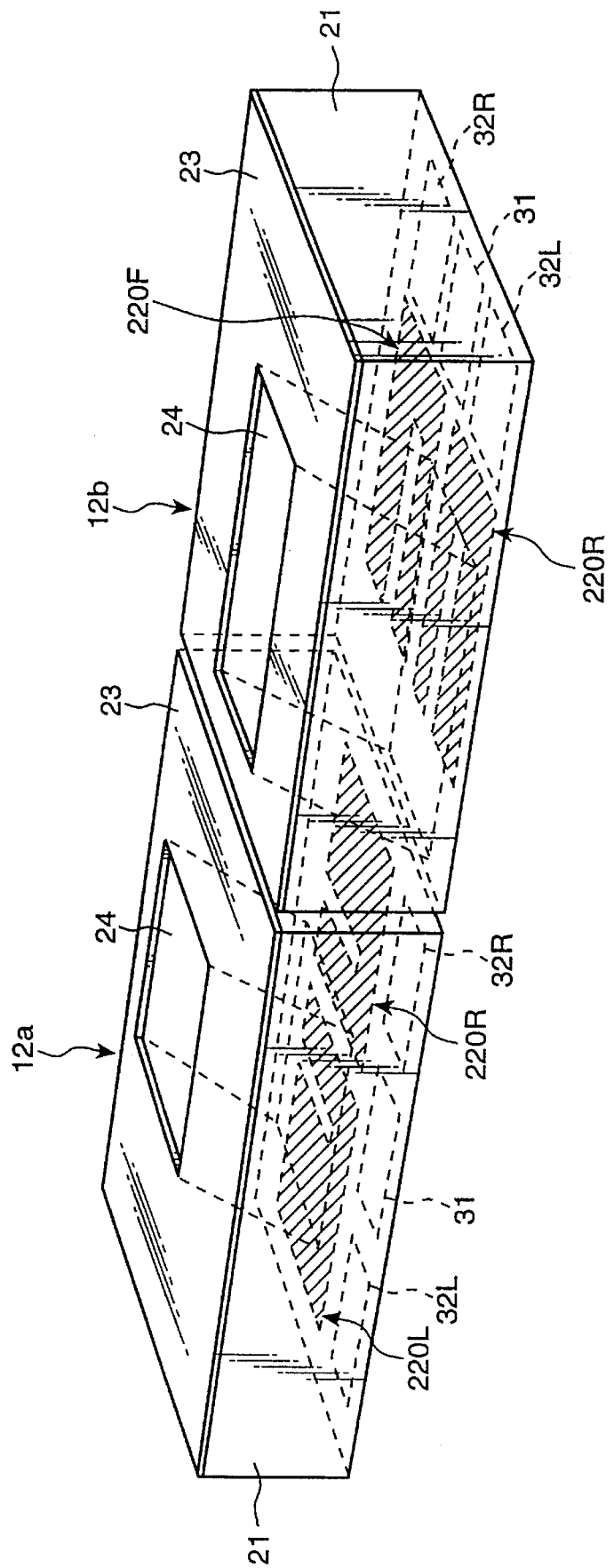
FIG. 30 is a perspective view of a light-sensing element which shows the tenth embodiment of the present invention.

The present invention is not limited to the above-described embodiments, but rather, as shown in the tenth embodiment of the present invention in FIG. 30, can be configured with two light-sensing element 12a and 12b, having the same construction, with four light-detection sections 220L, 220R, 220F, and 220R located in one and the same plane. In this case, if one of the light-sensing elements 12b is positioned so that the light-detection sections 220F and 220R are in the front and rear, the summed outputs of all the light-detection sections 220L, 20R, 220F, and 220R will be the same for all directions (0° to 360°), so that directional dependency is completely eliminated.

Figure 31:
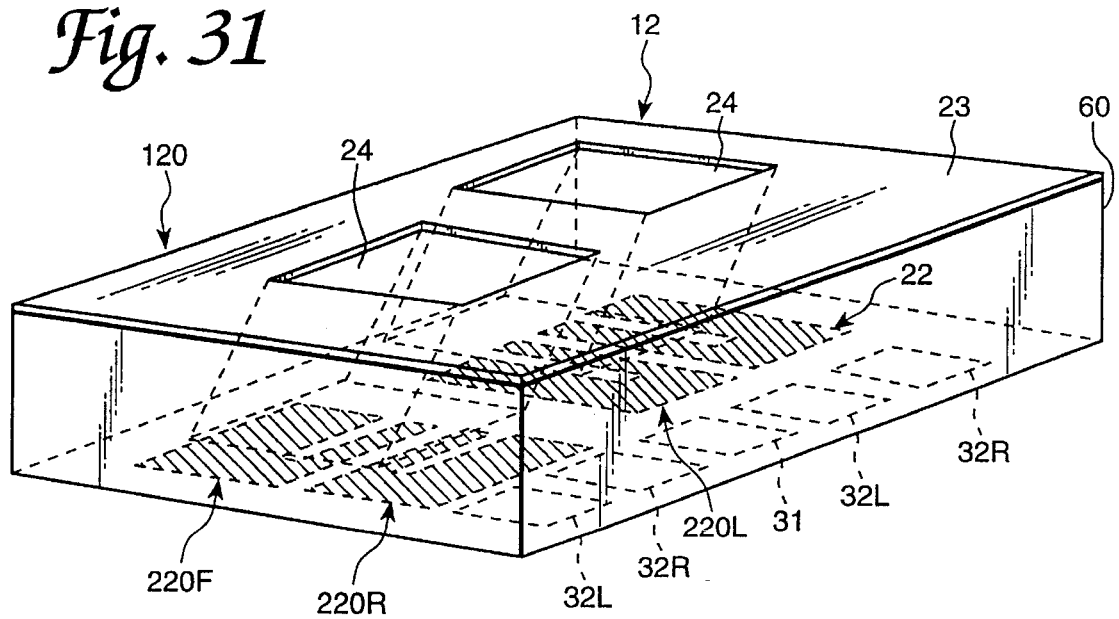
FIG. 31 is a perspective view of a light-sensing element which shows the eleventh embodiment of the present invention.

Instead of the configuration of the tenth embodiment, as shown in the eleventh embodiment in FIG. 31, the two light-sensing element 12a and 12b are formed as one unit, that is, if the four light-detection sections 220L, 220R, 220R and 220R are formed on the bottom surface of one and the same transparent substrate 60, it is possible to achieve even better air conditioner control.

Figure 32:
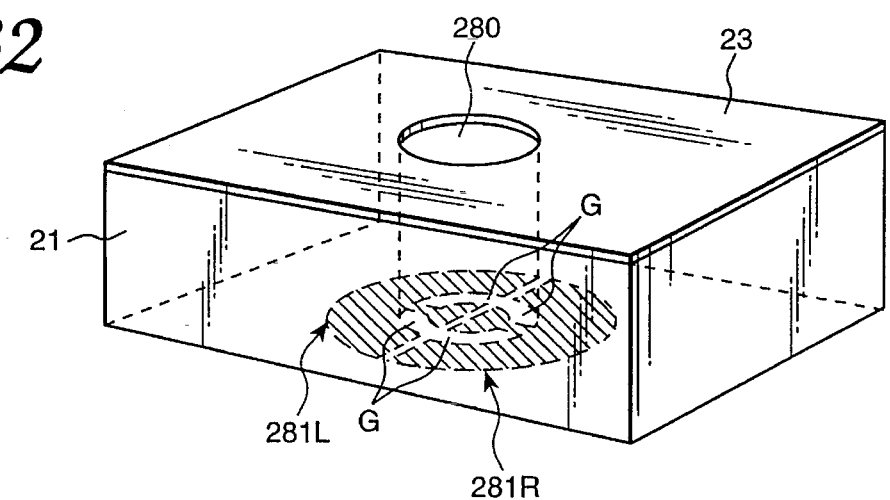
FIG. 32 is a perspective view of a light-sensing element which shows the twelfth embodiment of the present invention.
Figure 33:
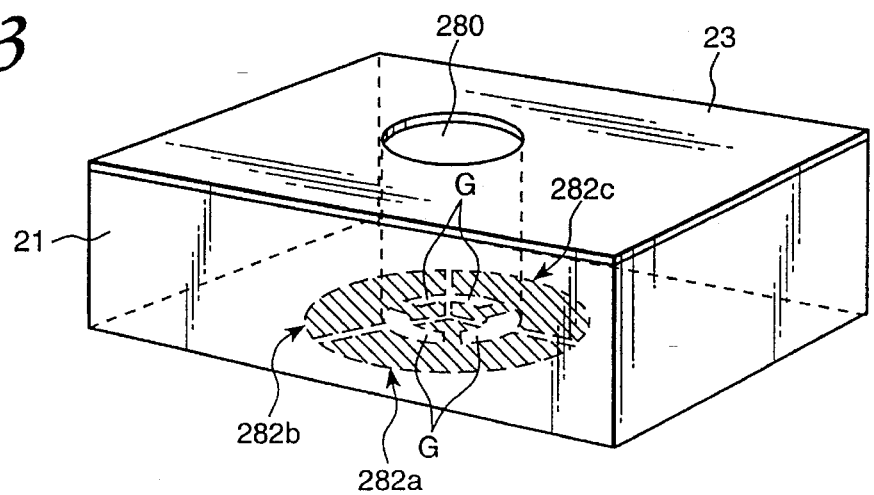
FIG. 33 is a perspective view of a light-sensing element which shows the thirteenth embodiment of the present invention.

In each of the above-described embodiments, while the shape of the light-detection sections 22L, 22R, 22OL, 22OR, 22OF, and 22OR as well as the shape of the light-guiding hole 24 is rectangular, as shown in the twelfth embodiment, which is illustrated in FIG. 32, it is possible to form the light-guiding hole 280 in a round shape, and to match this, form the left and right light-detection sections 281L and 281R as semicircles. By means of this type of point-symmetrical configuration, it is possible to achieve a configuration that is still more free of directional dependency. In this case, if a non-detection region G is formed in the shape of an arc at the appropriate position in each of the light-detection sections 281L and 281R, it is possible to achieve the desired output characteristics, for example, those of the ninth embodiment. Of course, the shape of the light-detection sections and the shape of the light-guiding hole is not limited to rectangular or round, and can be other shapes as well. In essence, it is merely necessary to form non-detection regions at the appropriate positions in the light-detection sections and with a shape corresponding to the shape of the light-guiding hole.

Figure 34:
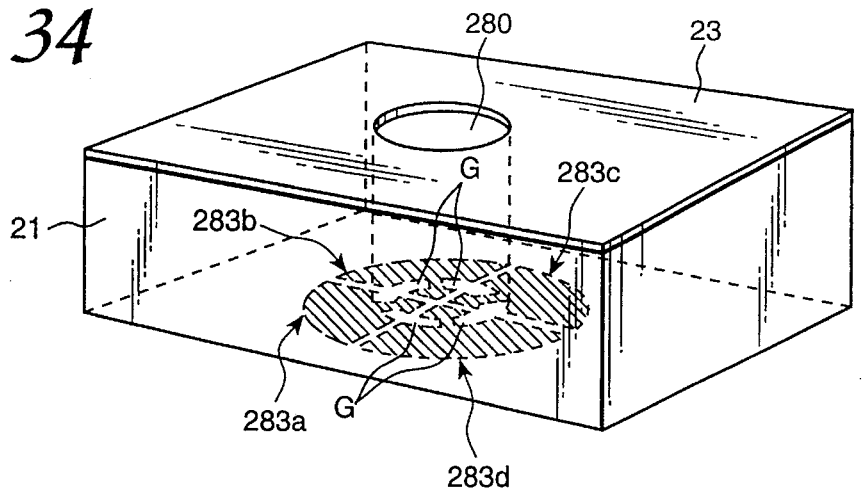
FIG. 34 is a perspective view of a light-sensing element which shows the fourteenth embodiment of the present invention.

In addition, the number of light-detection sections is not limited to two. For example, as in the case of the thirteenth embodiment shown in FIG. 33, it is possible to have the combination of three fan-shaped light-detection sections 282a, 282b, and 282c, making it possible to detect sunlight thermal load from three directions independently. It is also possible, as in the case of the fourteenth embodiment, which is shown in FIG. 34, to have the combination of four fan-shaped light-detection sections 283a, 283b, 283c, and 283d, making it possible to detect the sunlight thermal load from four directions independently. In these thirteenth and 14 embodiments as well, non-detection regions G are formed at the appropriate positions in each of the light-detection sections 282a to 282c and 283a to 283d, in the shape of arcs to match the shape of the light-guiding hole 280.

In the above-described embodiments, while each of the light-detection sections is not completely split apart by the non-detection regions, part of the detection regions (conductive regions) being left intact, it is also possible to use a configuration in which each of the light-detection sections is completely split apart by the non-detection regions, and in this case as well if the both of the light-detection signals from the non-detection regions of each of the light-detection sections are summed, the output obtained is virtually the same as in the above-described embodiments.

Figure 35:
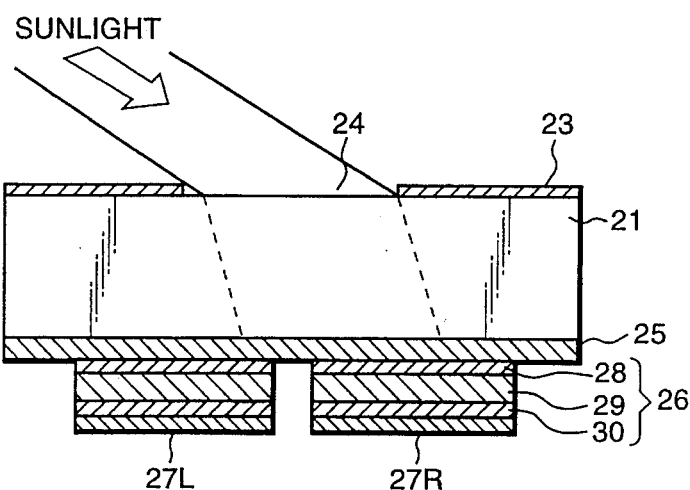
FIG. 35 a cross-sectional view of a light-sensing element which shows the fifteenth embodiment of the present invention.

Also, while the light-sensing element 12 of the previously described first embodiment had the reverse-side electrode 27 as the common input electrode, with the transparent substrate split into 25L and 25R and output signals taken from each of the transparent substrates 25L and 25R, it is also possible to do the opposite, as in the case of the fifteenth embodiment, shown in FIG. 35, in which the transparent substrate 25 is used as the common input electrode and the reverse-side electrode is split into reverse-side electrodes 27L and 27R, output signals being taken from these reverse-side electrodes 27L and 27R.

In the above-described embodiments, since a number of light-detection sections 22L and 22R (22OL and 22OR) are fabricated on a single chip using semiconductor manufacturing techniques, in addition to the advantage of the fact that variations between each of the light-detection sections 22L, 22R (22OL and 22OR) are eliminated, the number of parts and assembly steps for the sunlight sensor 11 are also reduced. However, the present invention can also be configured as the combination of a plurality of light-receiving elements (light-detection sections) formed on separate chips, in which case the desired object of the present invention is still achieved.

In the above-described embodiments, although the light-cutoff film 23 (light-cutoff means) is formed on the upper surface of the transparent substrate 21 and the light-detection sections 22L and 22R (22OL and 22OR) are formed on the bottom surface of the transparent substrate 21, it is also possible to use the configuration in which a plurality of light-detection sections is provided on the upper surface of a substrate, with a light-cutoff plate (light-cutoff means) located above the light-detection sections and separated by a space. In this case, if a transparent filler (silicone, epoxy, etc.) is filled in the spacing between the light-cutoff plate and the light-detection sections, the sunlight can be refracted by this filler before striking the light-detection sections, so that it is possible to have the filler serve to bring about the same optical effect as the transparent substrates 21 and 60 in the each of the above-described embodiments.

In the ninth embodiment, although the sunlight sensor 11 is mounted horizontally, it is also possible to incline it in the forward direction of the vehicle, to make the sunlight elevation angle large. The light-cutoff means is not limited to a light-cutoff film 23 (light-cutoff plate) with a light-guiding hole 24, but can also be, for example, one or two or more light-cutoff walls which are set up perpendicularly with respect to the substrate.

In the ninth embodiment, with the exception of the central part of the upper surface, the light-sensing element 12 is held by means of the light-blocking resin piece 13, so that light does not enter from the bottom or side of the transparent substrate 21, it is also possible, as in the case of both the sixth and the sixteenth embodiments of the present invention (refer to FIG. 19), to mold the entire of light-sensing element 12 (including the top surface) into transparent molded resin, made of a transparent silicone resin or other material, the transparent molded resin filing the space between the top surface of the light-sensing element 12 and the transparent holder 14. In this case, to prevent light from entering from the side or bottom of the transparent substrate 21, it is possible either to cover the side and bottom of the transparent substrate 21 with a light-blocking layer, or to make the outer circumference of the transparent holder 14 have light-blocking properties.

Figure 36:
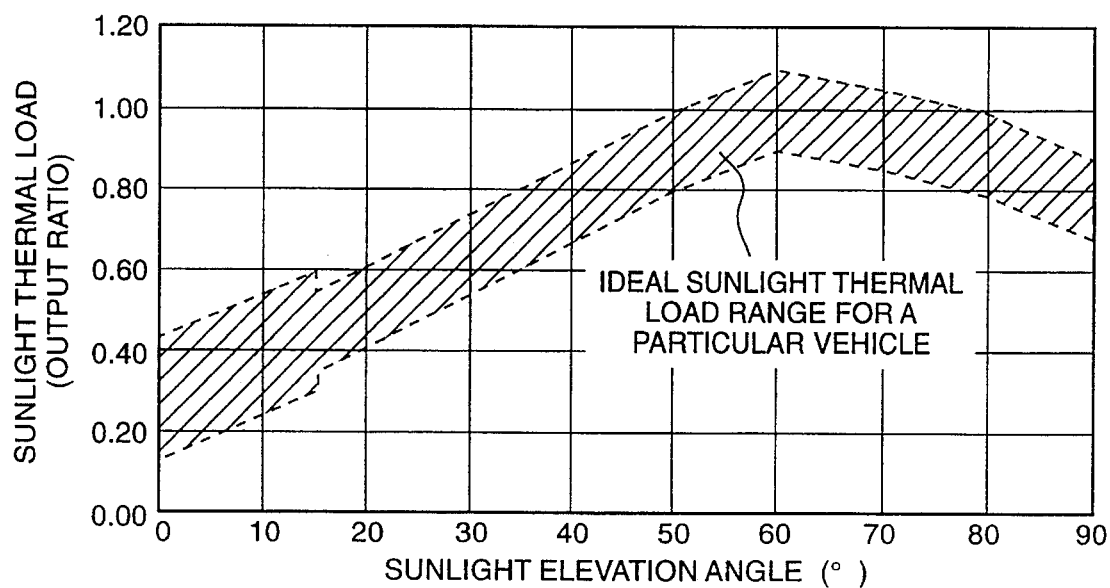
FIG. 36 is a characteristics graph which shows the ideal range of sunlight thermal load for a particular vehicle.

In the previously described ninth embodiment, by imparting detectional characteristics such that the sensor output reaches a ceiling at sunlight elevation angles greater than 60°, it is possible to achieve pleasant control of air conditioning which responds accurately to the thermal load inside an actual vehicle, and it is possible to vary the sunlight elevation angle at which the sunlight thermal load reaches a maximum over the range, for example of 40° to 60°, according to the type of vehicle the sunlight sensor is installed in and the installation location. FIG. 36 shows the ideal thermal load characteristics for a particular type of vehicle, and in this example the sunlight thermal load (sensor output) reaches a peak at a sunlight elevation angle of 60°, and when this peak is exceeded, the sunlight thermal load starts to decline with further increase in the sunlight elevation angle, it reaching about 80% of the peak value at a sunlight elevation angle of 90°, these characteristics having been verified as being more closely approximating the ideal characteristics. To enable a more pleasant control of air conditioning, it is necessary, therefore, to satisfy the following two conditions.

1 That the output peak be set in the occur in the sunlight elevation angle range of 40° to 60°, according to the type of vehicle, and 2 that the sensor output decline after exceeding the elevation angle at which the sensor peak occurs.

Even in the case of the light-detection section 22OL and 22OR patterns (hereafter referred to as the "light-detection section patterns") in the previously described ninth embodiment, by making the value of m in FIG. 26(d) small, it is possible to satisfy the above conditions 1 and 2. When sizes of the light-sensing element 12 size and light-guiding hole 24 size are fixed, the absolute output will drop, leading to the possible problems such as that of erroneous detection because of noise.

To solve this problem, a light-detection section pattern was devised which makes effective use of the surface area of the elements and has sunlight thermal load characteristics that are close to the ideal, with a minimum of loss of absolute output, the method used to design this being described below. First, the basic design formula used was as follows.

Figure 37:
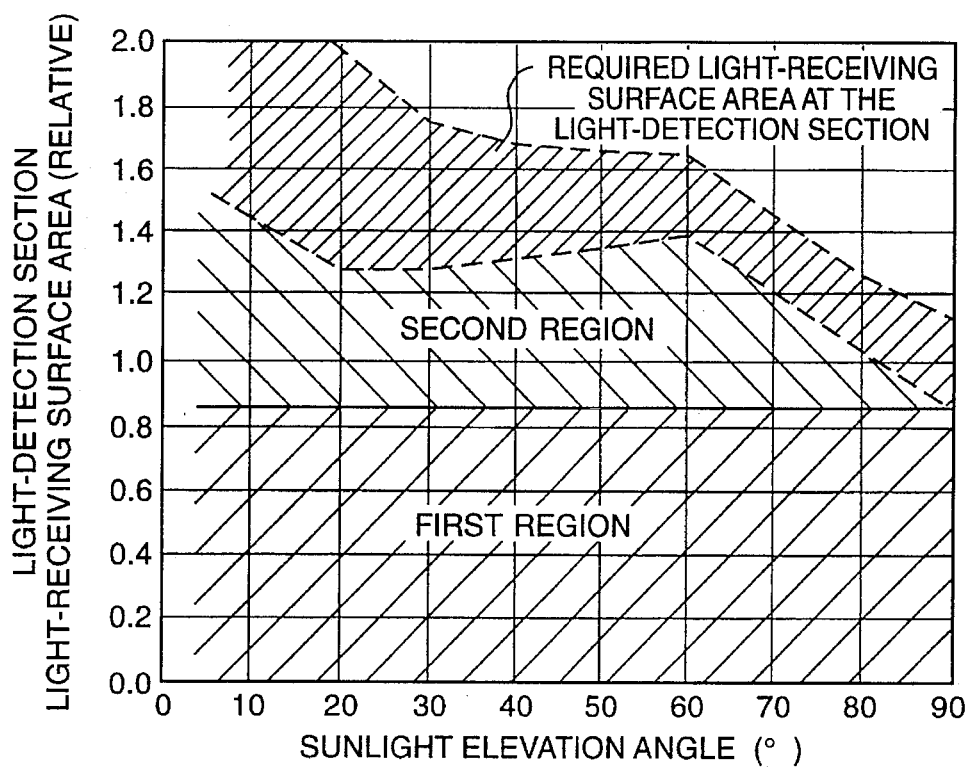
FIG. 37 is a characteristics graph which shows the relationship between the sunlight elevation and the required light-receiving surface area of the light-detection section.
Figure 38A:
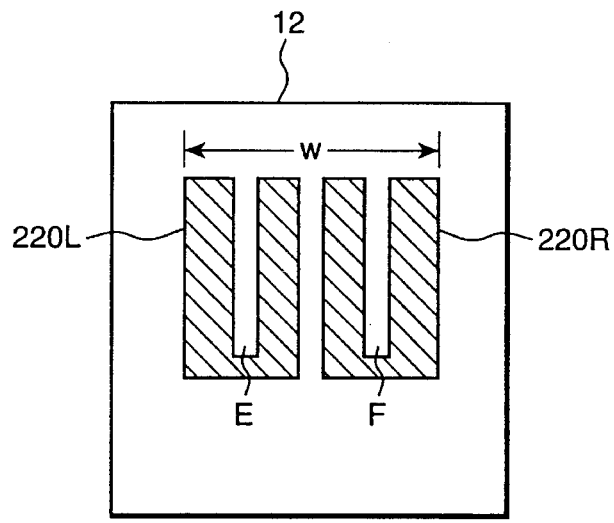
FIG. 38(a) and FIG. 38(b) show the light-detection section pattern of the seventeenth embodiment of the present invention (a) and the light-cutoff film pattern (b).
Figure 38B:
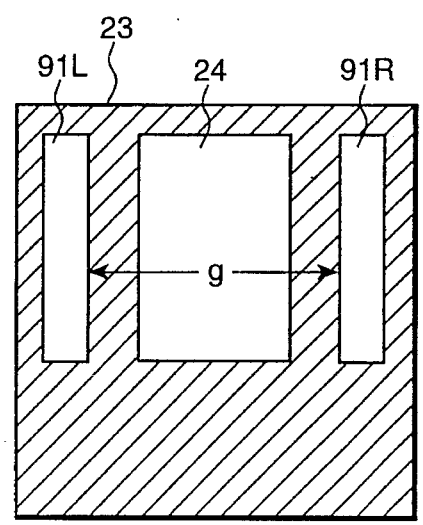

Output current ($\theta$)∝light-detection section light-receiving surface area ($\theta$)×sin $\theta$ The actual output current is obtained by multiplying the above formula by the output current value per unit surface area and other values. In the above expression, with regard to sin $\theta$, since it is physically impossible to change these characteristics, to approximate the actual sunlight thermal load characteristics by the sensor output, it is necessary to intentionally vary the sunlight elevation angle dependency of the light-detection section light-receiving surface area. For example, in the case of sunlight thermal load characteristics as shown in FIG. 36, making a reverse calculation from the above expression, it is necessary to vary the light-detection section light-receiving surface area as shown in FIG. 37 in accordance with the varying of the sunlight elevation angle. Performing the design using the data of FIG. 37 and the previously presented Equation (3), it is possible to determine the ideal light-detection section pattern (or light-cutoff film pattern).

Consider the change in light-detection section light-receiving surface area in two regions, shown in FIG. 37. The first region is that in which the sunlight is incident with a sunlight elevation angle of 90°, in which even if the sunlight elevation angle becomes low, the light-receiving surface area is not reduced, but rather remains constant. In this region 1, to establish the absolute output value, it is necessary to make the surface area as large as possible. In contrast to this, the second region is that in which the sunlight thermal load is affected, and at a sunlight elevation angle of 90°, the light-receiving surface area is zero, the light-receiving surface area increasing as the sunlight elevation angle becomes low. If this second region is established properly, it is possible to satisfy both the conditions 1 and 2 described above.

The embodiments to be described later are ones which were designed with two approaches to establishing the above-described second region, for the purpose of making effective use of the light-sensing element size.

The first method is that of establishing the second region by providing a side slit in the outside light-cutoff film which does not make effective use of the light-sensing elements, and an actual example of this is the seventeenth embodiment of the present invention, which is shown in FIGS. 38(a) and 38(b) and FIGS. 39(a)–39(d).

Figure 39A:
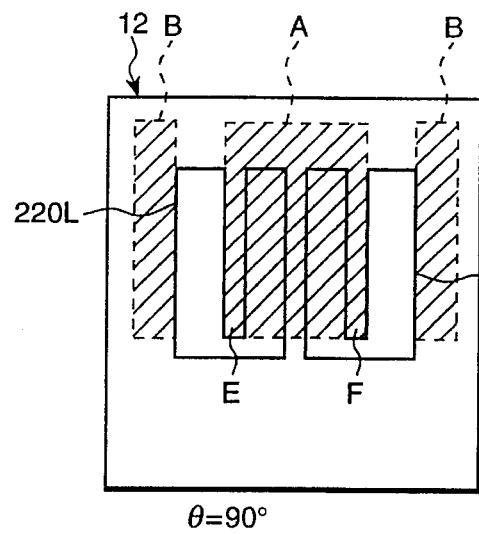
FIG. 39(a), FIG. 39(b), FIG. 39(c) and FIG. 39(d) are drawings explaining the positional relationship and light-receiving regions of the left and right light-detection sections and the light-guide holes and slits.
Figure 39B:
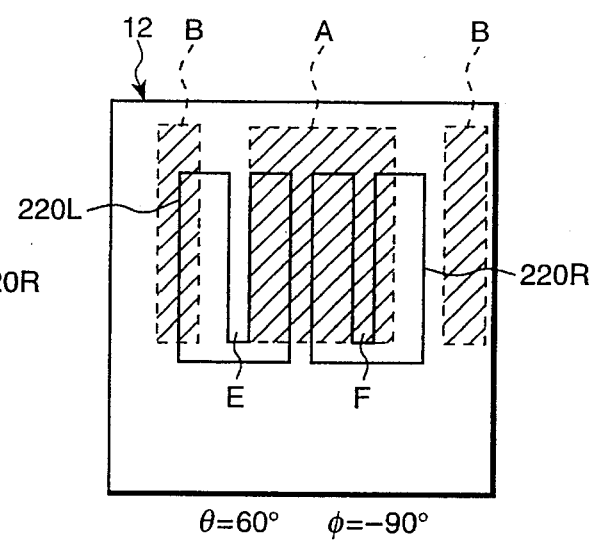
Figure 39C:
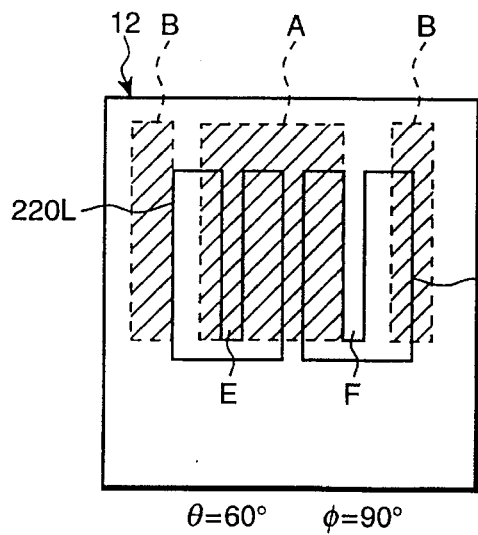
Figure 39D:
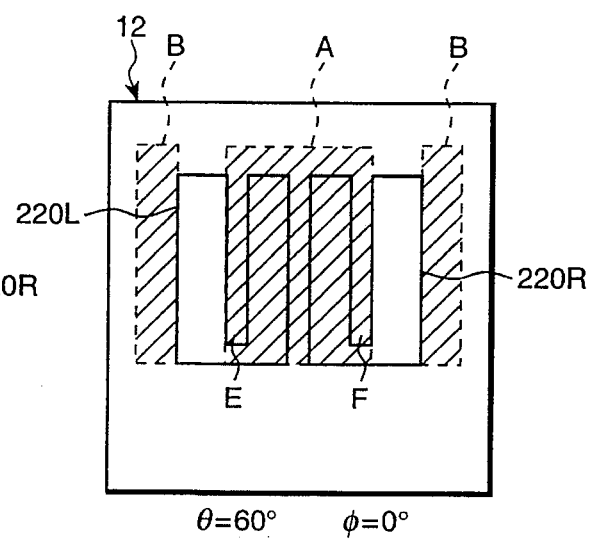

In this seventeenth embodiment, two side slits 91R and 91L are formed parallel to one another with the appropriate spacing at the left and right sides of the rectangular light-guiding hole 24, the spacing g between these side slits being set to be equal to the width of the light-detection sections 22OL and 22OR. By doing this, as shown in FIG. 39(a) and 39(d) for a sunlight elevation angle of $\theta$=90° and a sunlight direction of $\phi$=0°, the illuminated regions B from the sunlight passing through each of the side slits 91L and 91R are positioned outside of the light-detection sections 22OL and 22OR, and if the sunlight elevation angle $\theta$ is lower than 90° and the sunlight direction $\phi$ moves to either the left or to the right, one of the illuminated regions from the sunlight passing through the side slits 91L and 91R overlaps either the light-detection section 22OL or with 22OR, as shown in FIG. 39(b) and 39(c), so the light-receiving surface area is increased thereby establishing the above-described second region.

In the above-noted seventeenth embodiment, although the side slits 91L and 91R are provided to the left and right of the light-guiding hole 24, it is also possible to provide them in front and back of the light-guiding hole 24 (in which case it is necessary to enlarge the front-to-back dimension of the light-detection sections 22OL and 22OR). In addition, it is also possible to provide four side slits to the left, right, front, and rear of the light-guiding hole 24, mutually connecting them to form a single frame-shaped slit. Of course, depending upon the installation location, it is possible to provide side slits only at the front and back of the light-guiding hole 24, or to provide side slits on three sides of the light-guiding hole 24.

Figure 40A:
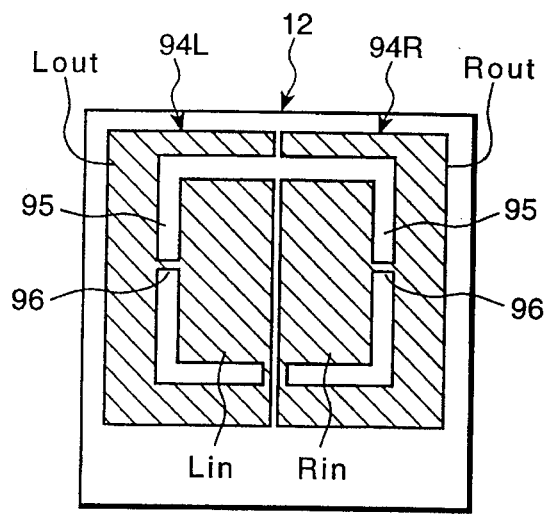
FIG. 40(a) and FIG. 40(b) show the light-detection section pattern of the eighteenth embodiment of the present invention and the light-cutoff film pattern, respectively.
Figure 40B:
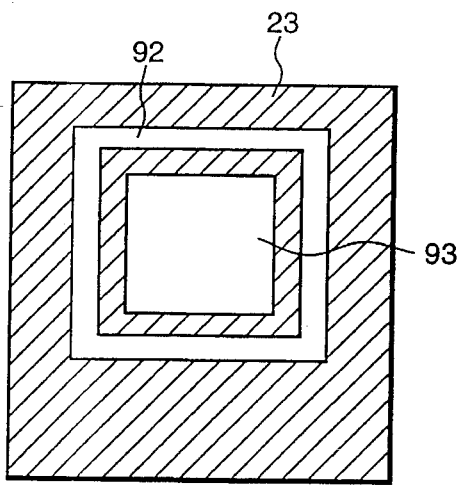
Figure 42:
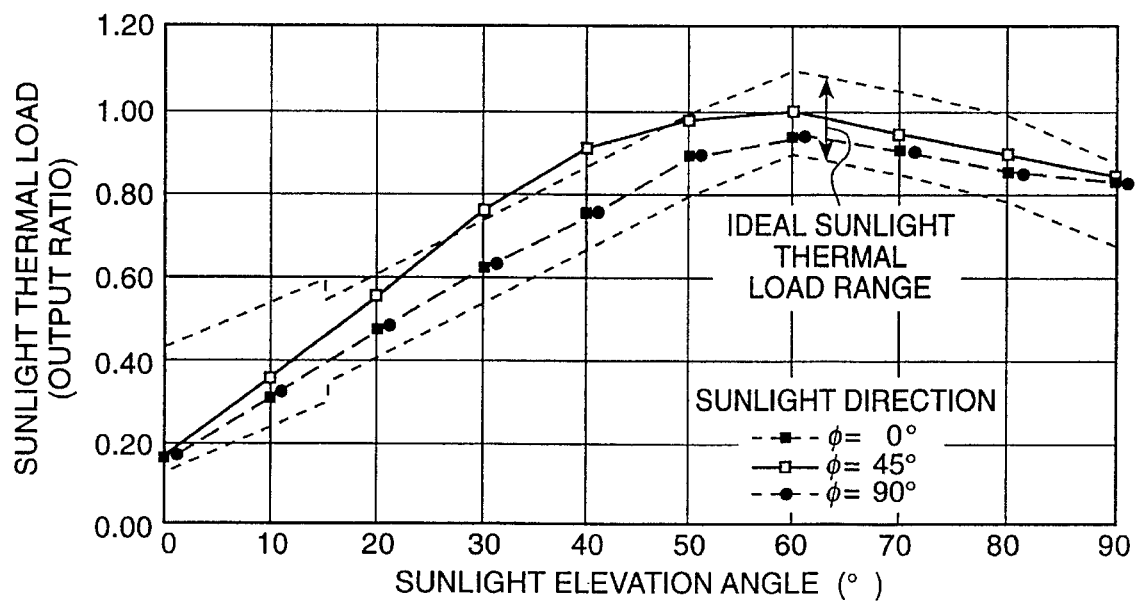
FIG. 42 is a characteristics graph showing the change in output with respect to the sunlight elevation.

The second method of establishing the second region is that of the eighteenth embodiment of the present invention, which is shown in FIG. 40(a)–40(b) through FIG. 42. FIG. 40(a) illustrates the light-detection section, and FIG. 40(b) illustrates the light-cutoff film pattern. In the eighteenth embodiment, a frame-shaped slit 92 is formed in the light-cutoff film 23, with a rectangular light-guiding hole 93 formed inside of this frame-shaped slit 92, and the with a non-detection region 95 formed in the light-detection sections 94L and 94R in the same shape as the above-noted frame-shaped slit 92. The internal parts Lin and outer parts Lout, the internal parts Rin and outer parts Rout of the non-detection 95 in the light-detection sections 94L and 94R are electrically connected by means of the thin connecting bridge 96.

Figure 41A:
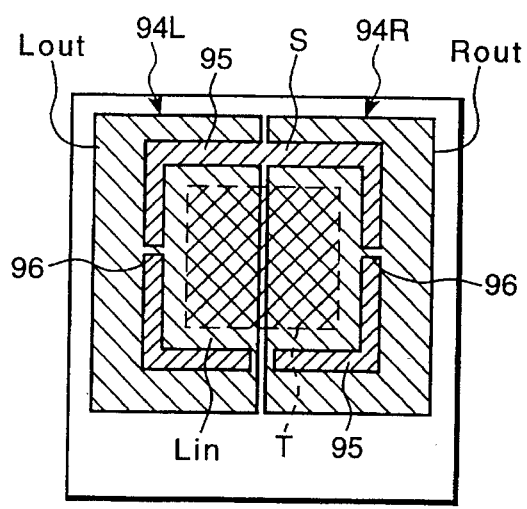
FIG. 41(a), FIG. 41(b), FIG. 41(c) and FIG. 41(d) are drawings explaining the positioned relationship of the eighteenth embodiment of the present invention, 41(a) and the light-cutoff film pattern 41(b).
Figure 41B:
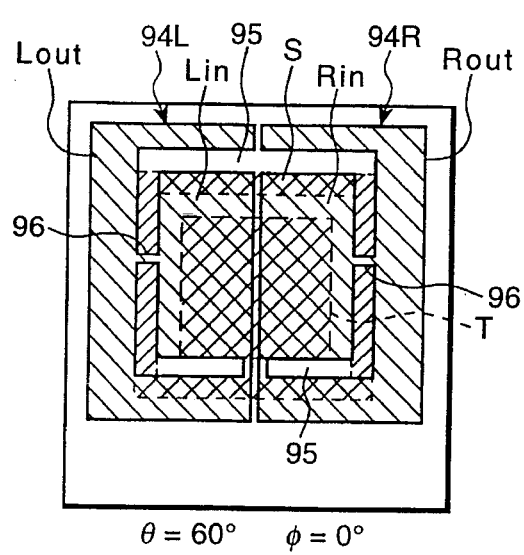

In this eighteenth embodiment, as shown in FIG. 41(a), when the sunlight elevation angle $\theta$=90°, the illuminated region S from the sunlight that passes through the frame-shaped slit 92 is inside the non-detection region 95 of the light-detection sections 94L and 94R, so that only the illuminated region of the sunlight passing through the inside light-guiding hole 93 overlaps with the inner parts Lin and Rin of the light-detection sections 94L and 94R (the overlapped hatched area is the light-receiving region of light-detection sections 94L and 94R). As the sunlight elevation angle is reduced from $\theta$=90°, the illuminated region S of sunlight that passes through the frame-shaped slit 92 gradually comes over onto the light-detection sections 94L and 94R so that, as shown in FIG. 41(b) and 41(d), at a sunlight elevation angle of $\theta$=60° and a sunlight direction of $\phi$=0° or 90°, the two-side section which is opposite the illuminated region S (corresponding to ½ of the illuminated region S) is completely inside the light-detection sections 94L and 94R (and while this is not shown in the drawing, the same thing is true when the sunlight direction $\phi$=180° or 270°).

In this case, in the range of sunlight elevation angle $\theta$ of 90° to 60°, the entirely of the illuminated region T illuminated by the sunlight passing through the light-guiding hole 93 is inside the light-receiving region of the light-detection sections 94L and 94R, with the light-guiding hole 93 on the inside serving to establish the above-described first region. Also, in the sunlight elevation angle θ of 90° to 60°, as the sunlight elevation angle becomes low, the illuminated region S of sunlight passing through the outside frame-shaped slit 92 gradually comes over the light-detection sections 94L and 94R, this increasing the light-receiving region, and serves to establish the previously described second region.

Figure 41C:
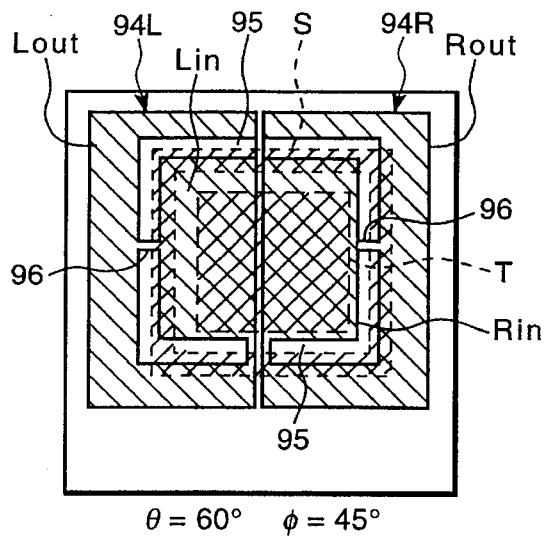
Figure 41D:
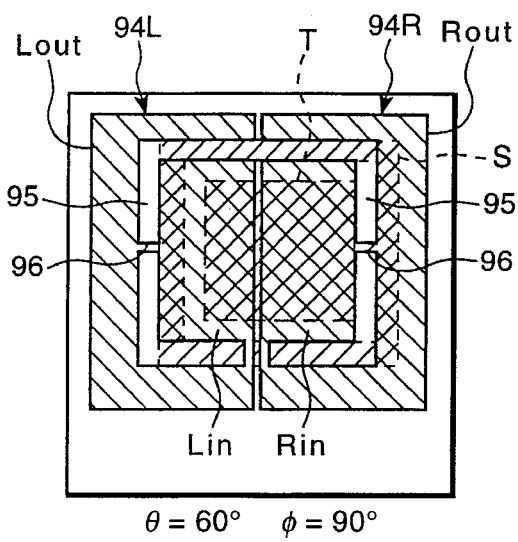

It happens that in the above-described eighteenth embodiment, because the frame-shaped slit 92 that establishes the second region is rectangular, in the case in which the sunlight is incident on an inclination from the side (sunlight direction φ≠0°, 90°, 180°, 270°), as shown in FIG. 41(c), the four sides of the illuminated region S of sunlight overlap partially with the light-detection sections 94L and 94R, so that the light-receiving surface area will vary slightly depending upon the difference in sunlight direction φ, causing a slight degree of directional dependency (refer to FIG. 42).

Figure 43A:
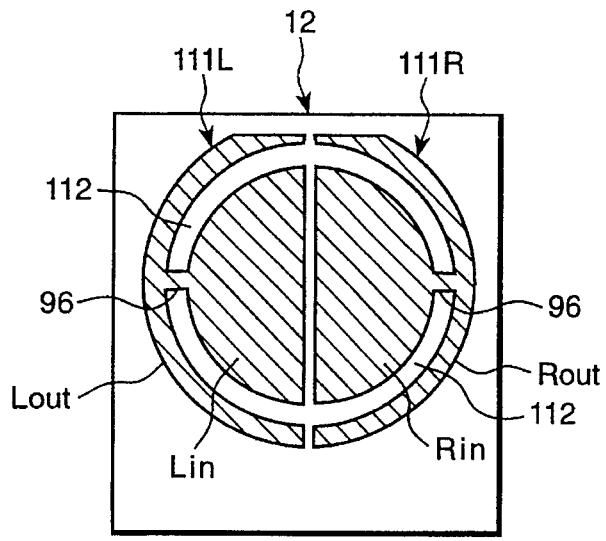
FIG. 43(a) and FIG. 43(b) show the light-detection section pattern of the nineteenth embodiment of the present invention, 43(a), and the light-cutoff film pattern, 43(b).
Figure 43B:
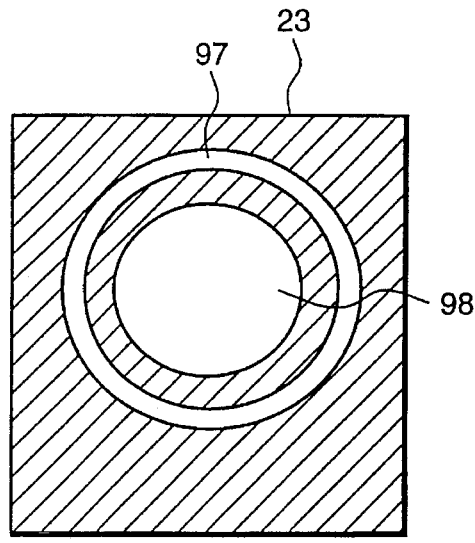
Figure 45:
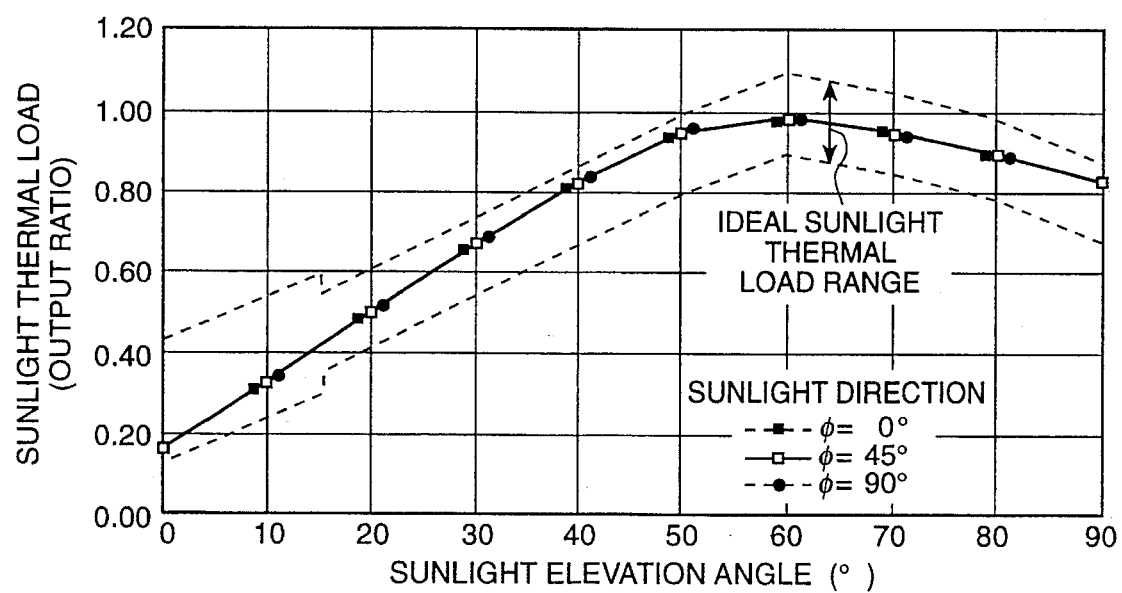
FIG. 45 is a characteristics graph showing the change in output with respect to the sunlight elevation.

In the case in which priority is given to eliminating this directional dependency, as in the nineteenth embodiment of the present invention, shown in FIGS. 43(a)–43(b) through FIG. 45, it is possible to not only to make the frame-shaped slit 97 and the light-guiding hole 98 round, but to also make the light-detection sections 111L and 111R and the non-detection region 112 formed by these round as well. FIG. 43(a) illustrates the light-detection section pattern, and FIG. 43(b) illustrates the light cutoff film pattern.

Figure 44A:
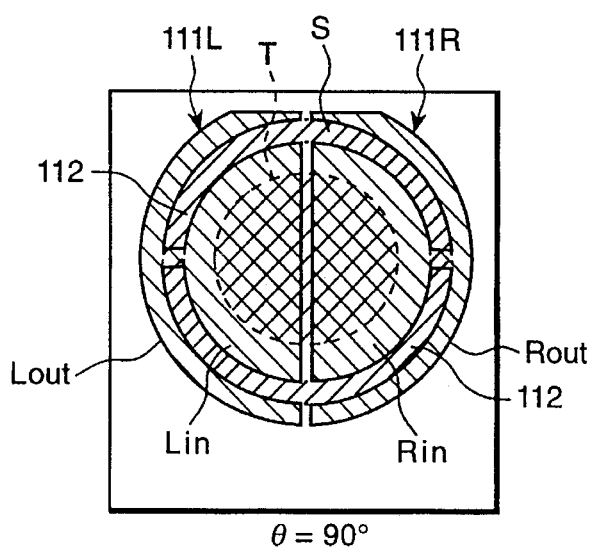
FIG. 44(a), FIG. 44(b), FIG. 44(c), and FIG. 44(d) are drawings explaining the positional relationship and light-receiving regions of the left and right light-detection sections and the light-guide holes and slits.
Figure 44B:
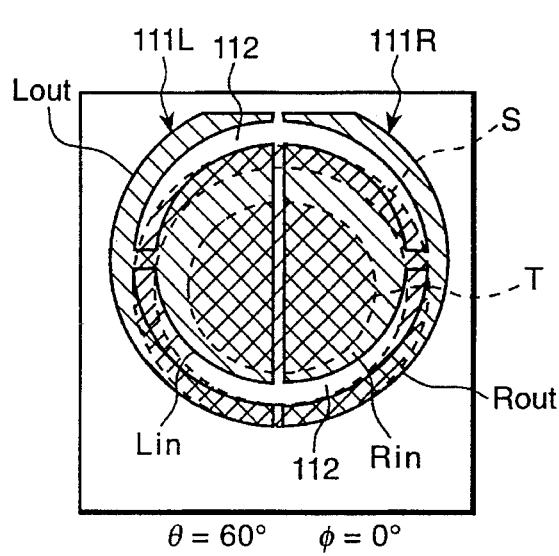
Figure 44C:
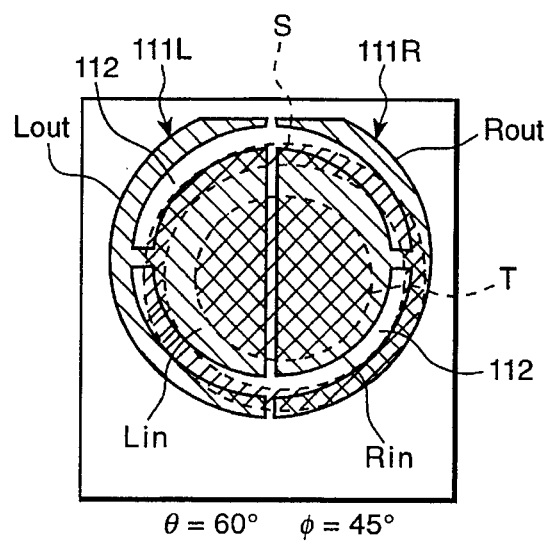
Figure 44D:
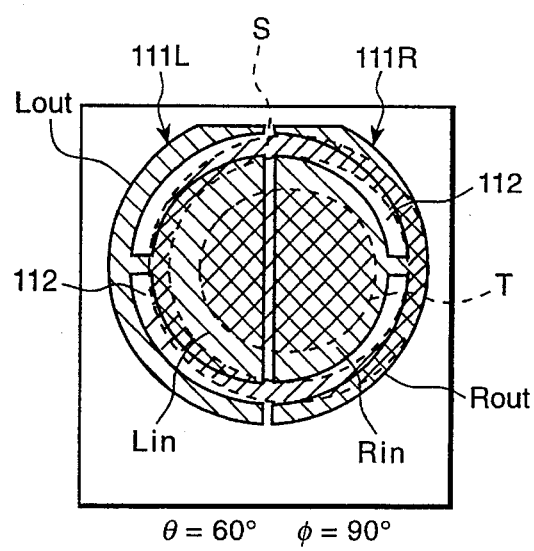

In this nineteenth embodiment as well, as shown in FIG. 44(a), when the sunlight elevation angle θ=90°, the illuminated region S of sunlight which passes through the frame-shaped slit 97 is positioned inside the non-detection region 112 of the light-detection sections 111L and 111R, and only the illuminated region T of sunlight that passes through the inside light-guiding hole 98 overlaps the inside Lin and Rin parts of the light-detection sections 111L and 111R. As the sunlight elevation angle θ becomes low, the illuminated region S of sunlight that passes through the frame-shaped slit 97 gradually is incident on the light-detection sections 111L and 111R, thus increasing the light-receiving surface area and serving to establish the previously described second region. However, because the frame-shaped slit 97 used to establish the second region in this nineteenth embodiment is round, as shown in FIG. 44(b), 44(c), and 44(d), for the same sunlight elevation angle θ, even if the sunlight direction φ varies, the light-receiving surface area remains constant, so that directional dependency is completely eliminated (refer to FIG. 45). Note, however, that the absolute output current value (light-receiving surface area) is slightly less than the previously described eighteenth embodiment.

In such cases as the above-described seventeenth to nineteenth embodiments, in which a side slit (or frame-shaped slit) is used for the purpose of establishing the second region, the left-to-right difference in output the output of the light-detection sections is reduced, so that even if there is a slight drop in sunlight direction φ detection accuracy, by providing a side slit (or a frame-shaped slit), it is possible to better approximate actual sunlight thermal load characteristics of a vehicle with the total output characteristics of the light-detection section.

Figure 46A:
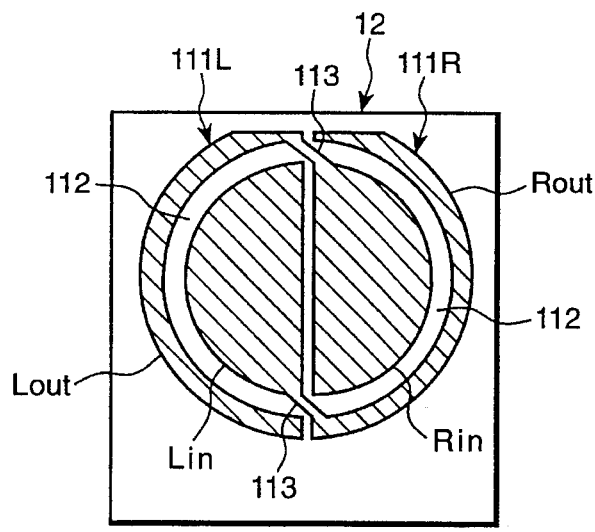
FIG. 46(a) and FIG. 46(b) show the light-detection section pattern of the twentieth embodiment of the present invention (a) and the light-cutoff film pattern (b).
Figure 46B:
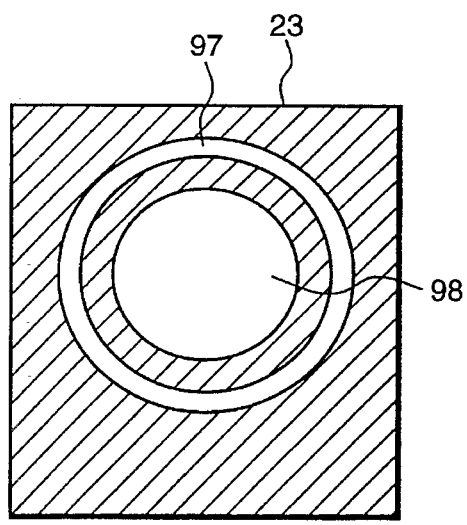
Figure 47A:
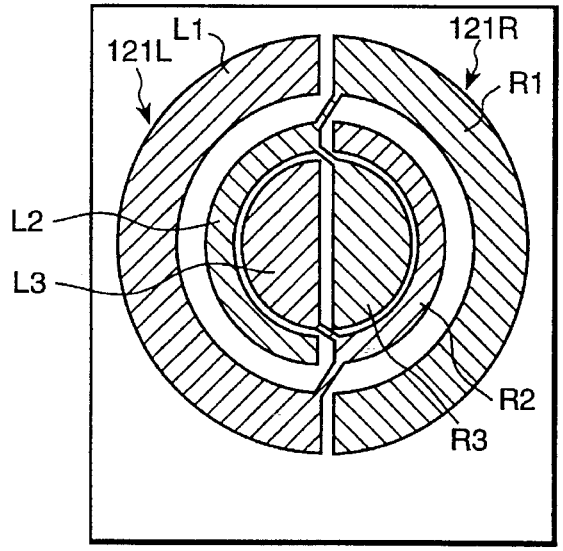
FIG. 47(a), FIG. 47(b), FIG. 47(c) and FIG. 47(d) are drawings explaining the positional relationship and light-receiving regions of the left and right light-detection sections and the light-guide holes in the twenty first embodiment of the present invention.
Figure 47B:
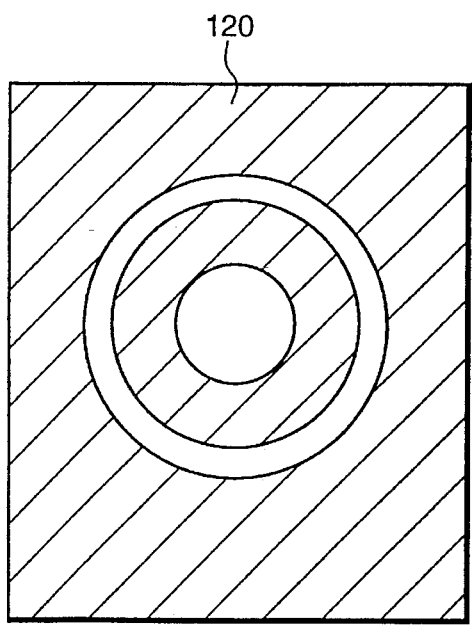
Figure 47C:
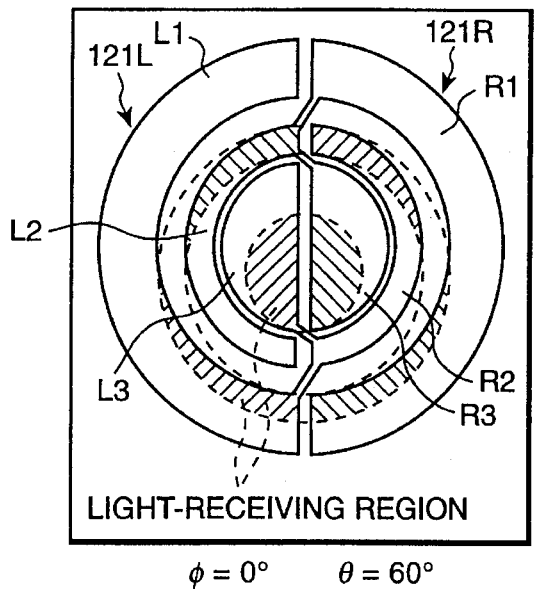
Figure 47D:
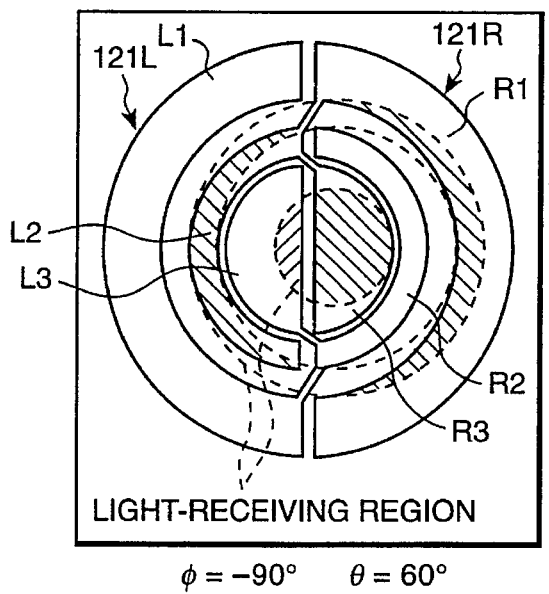
Figure 48A:
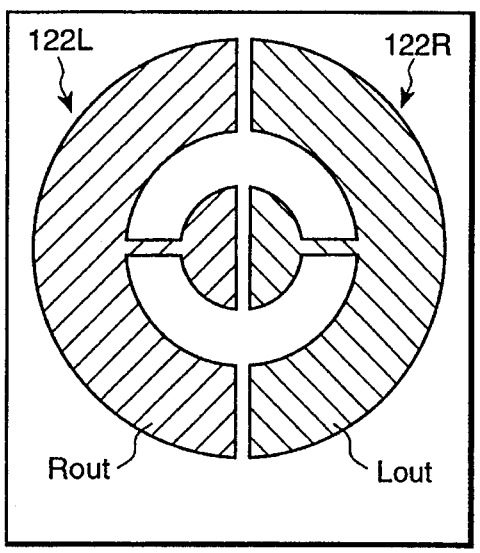
FIG. 48(a), FIG. 48(b), FIG. 48(c) and FIG. 48(d) are drawings explaining the positional relationships and light-receiving regions of the left and right light-detection section and light-guide holes in the twenty second embodiment of the present invention.
Figure 48B:
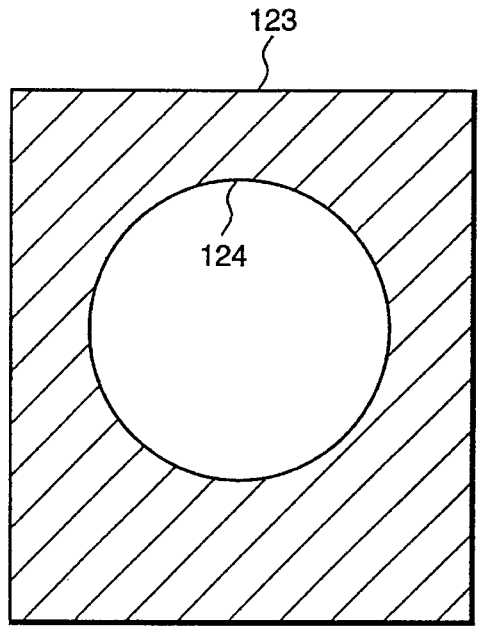
Figure 48C:
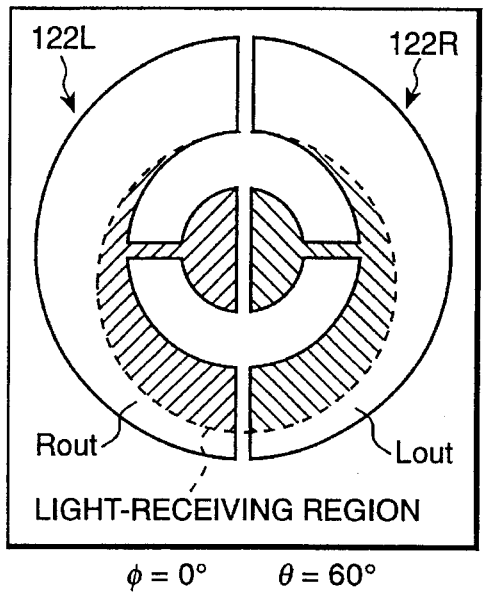
Figure 48D:
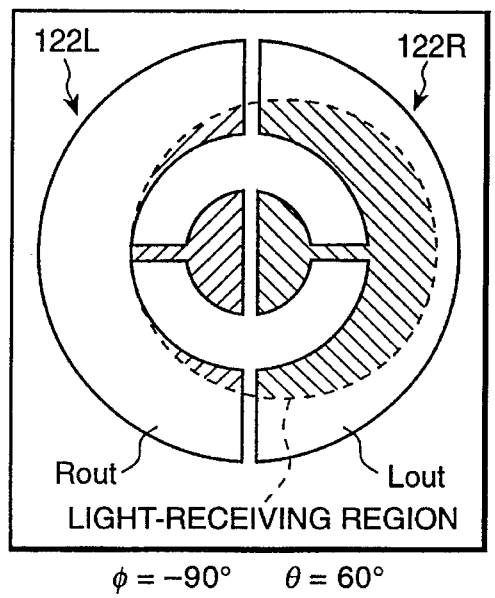

When providing a side slit (or frame-shaped slit), to increase the left-to-right output difference of the light-detection sections, as in the case of the twentieth embodiment of the present invention, shown in FIGS. 46(a)–46(b), it is possible to make an electrical connection from each of Lin and Rin internal parts of the light-detection sections 111L and 111R with the opposing Rout and Lout parts by means of a thin connecting bridge 113. FIG. 46(a) illustrates the light-detection section pattern, and FIG. 46(b) illustrates the light-cutoff film pattern.

That is, the left-to-right difference in output between Lin+Rout and Rin+Lout is determined to detect the sunlight direction φ with good accuracy. If this is done, it is possible to achieve both the establishment of the second region and improvement in the sunlight direction φ detection accuracy. It is possible to apply the above method of determining the left-to-right output difference as described in the twentieth embodiment, to the previously described seventeenth and eighteenth embodiments as well.

In addition, as shown in FIGS. 47(a)–47(d), which illustrates the twenty first embodiment of the present invention, it is also possible to coaxially divide each of the light-detection sections 121L and 121R into three parts L1, L2, L3, R1, R2, and R3, with the central light-detection sections L2 and R2 electrically connected to the light-detection sections of R1, R3, L1, and L3 that are on the opposite sides. In this case, the positional and dimensional relationship of the light-detection section 121L and 121R patterns and light-cutoff film 120 pattern is established as shown in FIGS. 47(a)–47(d), and if the left-to-right output difference is determined by the difference between Li+R2+L3 and R1+L2+R3, a further improvement is possible in the accuracy of determining the sunlight direction φ.

However, even if parts of the light-detection section patterns are not interchanged as shown in FIG. 46 and FIG. 47, as shown in the twenty second embodiment of present invention, illustrated in FIG. 48, by changing the dimensional relationship between the light-detection section pattern and the light-cutoff film pattern, it is possible to increase the difference in output between the light-detection sections 122L and 122R. In this twenty second embodiment, by making the diameter of the light-guiding hole 124 of the light-cutoff film 123 larger than the inner diameter of the outer detection regions Rout and Lout of the light-detection sections 122L and 122R, the left-to-right output difference between light-detection sections 122L and 122R is increased. Further, it is also possible to combine the light-detection section patterns and light-cutoff film patterns of the embodiments shown in FIGS. 46(a)–46(b); FIGS. 47(a)–47(b); and FIGS. 48(a)–48(d) as desired.

Figure 49:
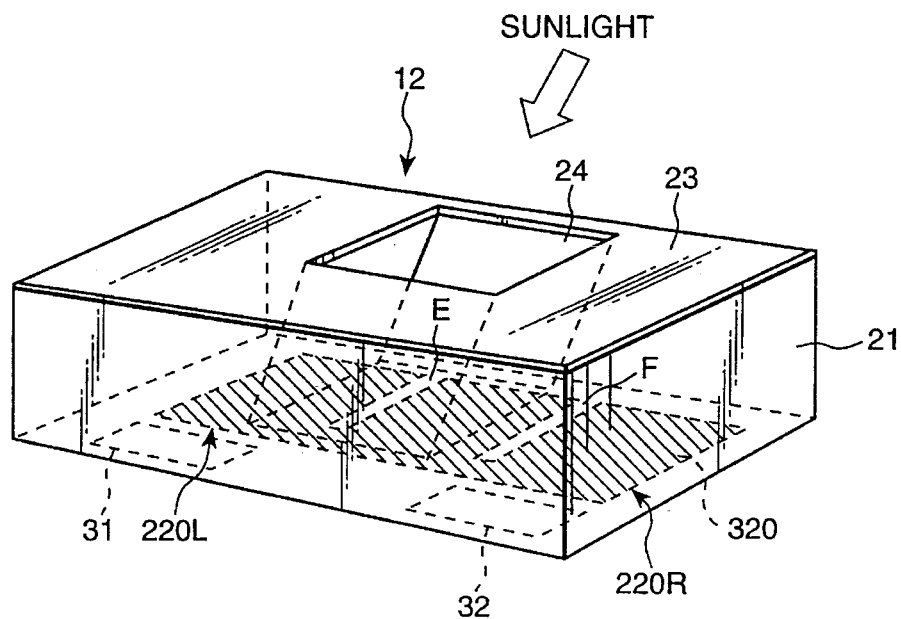
FIG. 49 is a perspective view of a light-sensing element which shows the twenty third embodiment of the present invention.

Note, however, that the present invention does not necessarily have to determine the left-to-right output difference, and if the design is made so that the varying characteristics of the total output of the light-detection sections is matched to the sunlight thermal load characteristics of an actual vehicle, it is possible to achieve pleasant air conditioner control within the vehicle. The reduction to practice of this is shown in FIG. 49 as the 23rd embodiment of the present invention.

The light-detection section pattern of the twenty third embodiment is a variation of the pattern previously described for the ninth embodiment, and has as a characteristic feature left and right light-detection sections 22OL and 22OR continuously formed as the light-detection section 320. In this case as well, the total output of the left-to-right light-detection section 320 is substantially the same as in the ninth embodiment, and it is possible to obtain the same degree of pleasant air conditioner control as with the ninth embodiment. Further, in the twenty third embodiment, because the left-to-right output difference is not detected, it is only necessary to provide the two electrodes 31 and 32.

In addition to the above-described embodiment, as shown in FIGS. 50(a)–50(g) and FIGS. 51(a)–51(h), it is possible to combine a variety of shapes of light-detection section patterns and light-cutoff film patterns. In FIGS. 50(a)–50(g) and FIGS. 51(a)–51 (n), the regions shown with shading lines are the illuminated regions of sunlight passing through the light-guiding hole of the light-cutoff film when the sunlight elevation angle is 90°.

Figure 50A:
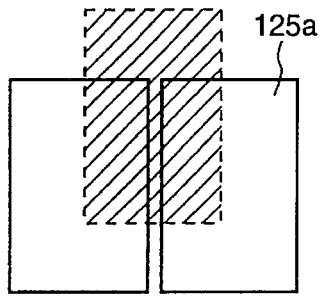
FIG. 50(a), FIG. 50(b), FIG. 50(c), FIG. 50(d), FIG. 50(e), FIG. 50(f) and FIG. 50(g) show combinations of various light-detection section patterns and light-cutoff film patterns used in the present invention.
Figure 50B:
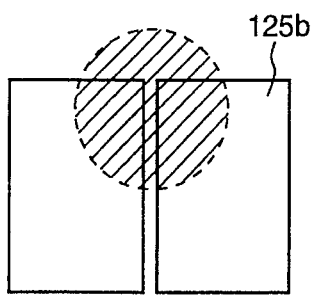
Figure 50C:
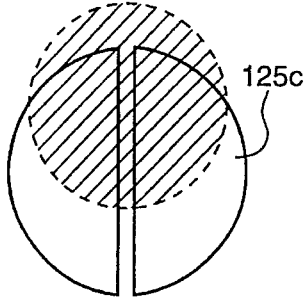

For example, to cause a ceiling in the increase ratio of the sensor output in the range in which the sunlight elevation angle is above the certain level, it is possible to cause the total illuminated surface area to change, depending upon the sunlight direction of incidence. That is, as shown in FIG. 50(a), 50(b), and 50(c) in addition to causing part of the illuminated region (shaded region) to extend to the outside of the light-detection sections 125a, 125b, and 125c when the sunlight elevation angle exceeds a certain angle, it is possible to make the configuration such that in this sunlight elevation angle range as the sunlight elevation angle decreases the illuminated region surface area (light-receiving surface area) of light striking the light-detection sections 125a, 125b, and 125c increases, or as shown in FIG. 50(d) to 50(g), to provide a non-detection region H within the light-detection sections 125d to 125g over which light is not detected. Of course, it is also possible to combine the above-noted two methods (and the ninth embodiment corresponds to such a combination).

Figure 50D:
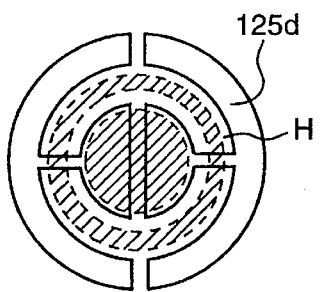
Figure 50E:
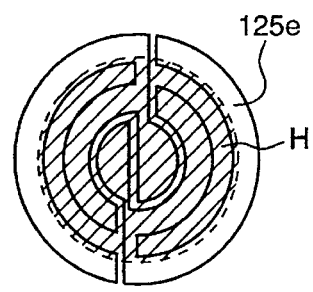
Figure 50F:
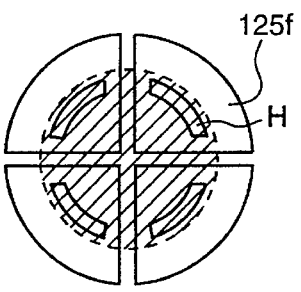
Figure 50G:
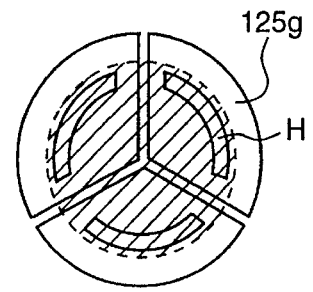
Figure 51A:
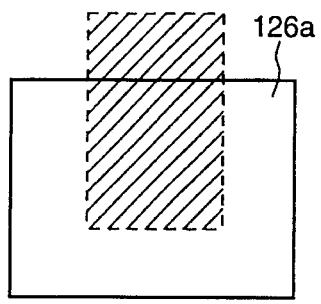
FIG. 51(a), FIG. 51(b), FIG. 51(c), FIG. 51(d), FIG. 51(e), FIG. 51(f), FIG. 51(g), and FIG. 51(h) show combinations of various light-detection section patterns and light-cutoff film patterns used in present invention.
Figure 51B:
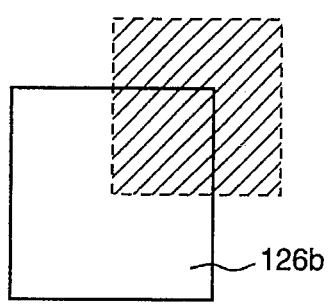
Figure 51C:
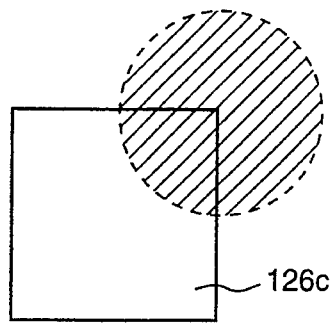
Figure 51D:
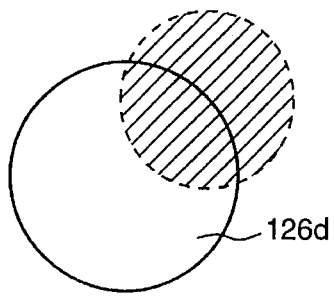
Figure 51E:
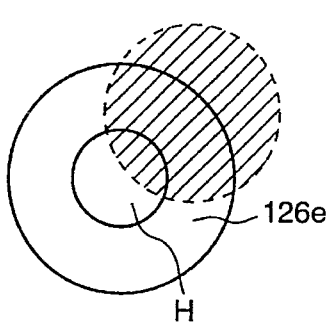
Figure 51F:
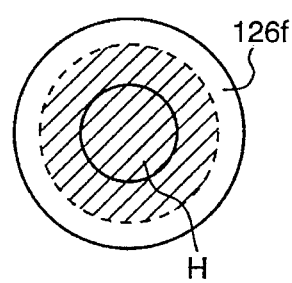
Figure 51G:
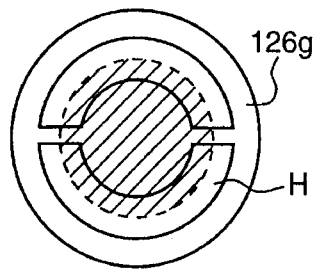
Figure 51H:
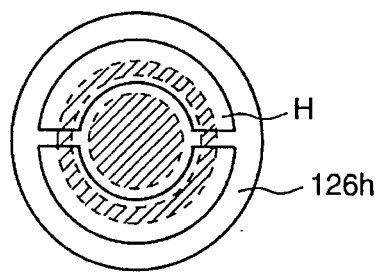

In FIG. 50(d), by doubling the light-guiding hole (illuminated region of sunlight) of the light-cutoff film, the amount of change of the light-receiving surface area with respect to changes in sunlight elevation angle and sunlight direction is increased, and in FIG. 50(e), as is the case in the embodiment shown in FIGS. 46(a)–46(b) and FIGS. 47(a)–47(d), part of the light-detection section 125e pattern is interchanged left-to-right, resulting to in an increased left-to-right output difference.

In FIGS. 51(a)–51(h), as is the case in the previously described embodiment of FIGS. 48(a)–48(d), there is a single light-detection section that is not divided left-to-right. In this case as well, it is possible, as shown in FIG. 36(a) to(e), to make the configuration such that part of the illuminated region of sunlight extends to the outside of the light-detection sections 126a to 126e when the sunlight elevation angle is above a certain angle, and if, as shown in FIG. 51(e) to 51(h), a non-detection region H is provided inside the light-detection sections 126e to 126h, it is possible to match the sensor output change characteristics to the sunlight thermal load characteristics of an actual vehicle.

As the sunlight elevation angle becomes low, in addition to the amount of incident light itself being reduced, because of the increase in reflection at the top surface of the light-sensing element 12, the sensor output drops with a decrease in sunlight elevation angle, causing a worsening of detection accuracy. Therefore, unless some countermeasures are taken, it is difficult to detect sunlight at an elevation angle near 0° with good accuracy.

Figure 52:
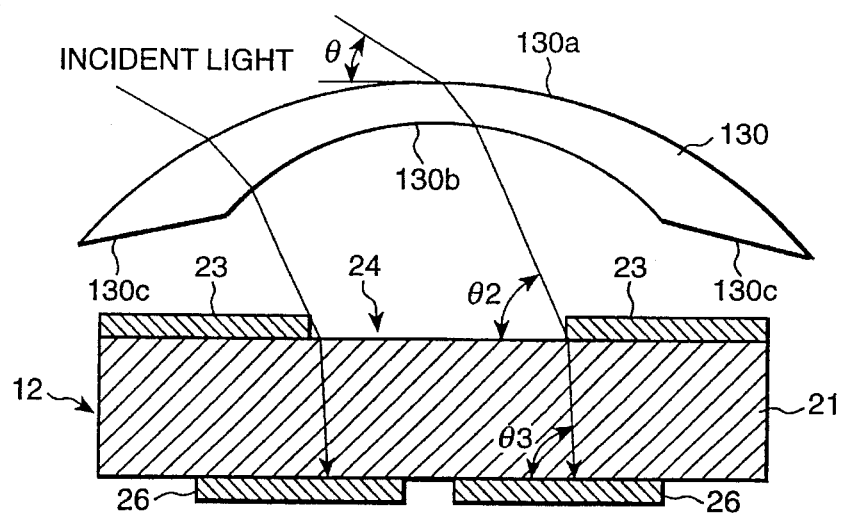
FIG. 52 is a cross-sectional view of a light-sensing element which shows the twenty fourth embodiment of the present invention.

To solve this problem, as shown in the twenty forth embodiment of the present invention, illustrated in FIG. 52, it is possible to locate a dome-shaped lens 130 above the light-sensing element 12. This lens 130 can be formed from, for example, polycarbonate resin, acrylic resin or other materials or glass, with a convex top surface 130a as its upper surface and a concave surface 130b as its lower surface. This lens 130 is designed to have an infinite focal length, so that the optical flux that head toward the light-guiding hole are refracted to parallel paths.

When sunlight strikes this lens 130, as shown in FIG. 52, the sunlight is refracted at both the upper surface (convex surface 130a) and the lower surface (concave surface 130b) and is lead to the light-guiding hole 24. By doing this, the angle of incidence θ2 of sunlight with respect to the transparent substrate 21 (top surface of the light-sensing element 12) becomes larger than the sunlight elevation angle θ, this enabling a reduction in the light reflected at the upper surface of the transparent substrate 21, thereby increasing the sensor output at low sunlight elevation angles and improving the detection accuracy of low elevation angle sunlight, enabling detection of even sunlight with an elevation angle near 0°.

In this case, because the index of refraction of the transparent substrate 21 onto which sunlight impinges is greater than the index of refraction of air, the sunlight is refracted at the upper surface of the transparent substrate 21 as well. This causes the angle of incidence θ3 of the sunlight with respect to the optoelectrical conversion layer 26 to be larger than the angle of incidence θ2 of the sunlight with respect to the transparent substrate 21, so that this, just as the lens 130, serves the purpose of increasing the sensor output at low sunlight elevation angles.

However, the present invention can also be made without an intermediate element (transparent substrate 21) between the light-cutoff film 23 and the optoelectrical conversion layer 26, instead having an air layer between these elements, and in this case as well, if lens 130 is provided, it is possible to obtain a high sensor output at low sunlight elevation angles.

Figure 53:
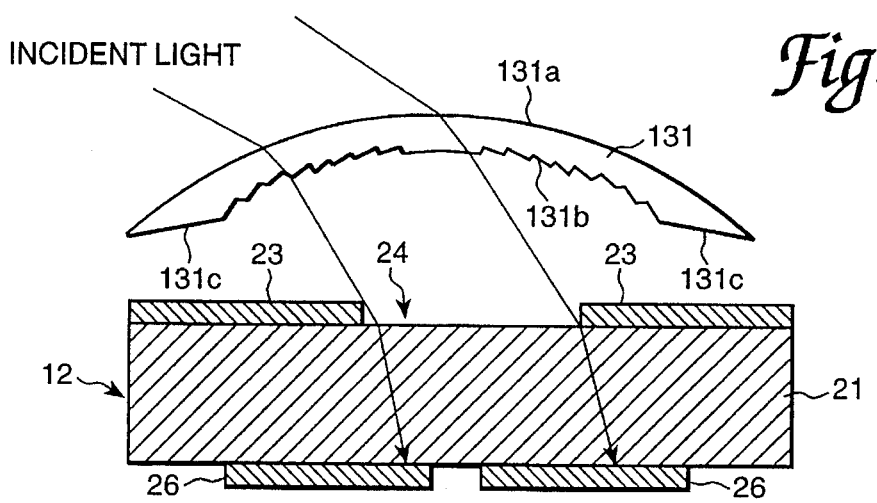
FIG. 53 is a cross-sectional view of a light-sensing element in which a fresnel lens is used as the optical element.
Figure 54:
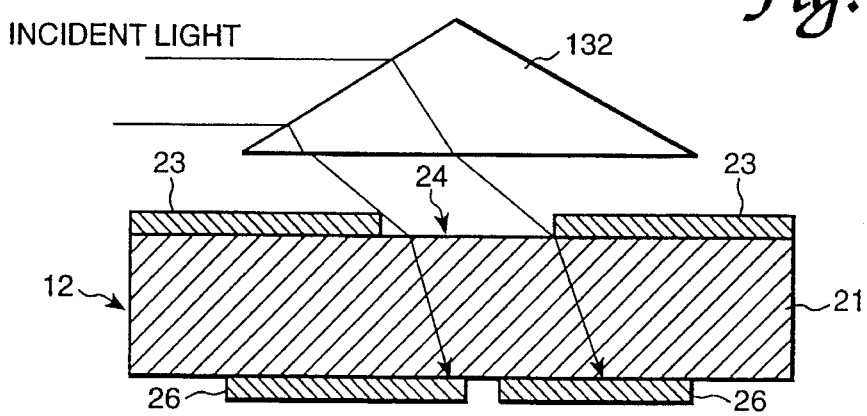
FIG. 54 is a cross-sectional view of a light-sensing element in which a prism is used as the optical element.

Further, the optical element use to refract the sunlight is not limited to the lens 130 shown in FIG. 52, and can instead be, as shown FIG. 53, a fresnel lens 131 or, as shown in FIG. 54, it can be a prism 132.

With regard to the lens 130 or fresnel lens 131, if light reflected at the lower circumferential surface 130c or 131c reaches the concave surface 130b or 131b of the lens, this reflected light will be refracted at the concave surface part of 130b or 131b and enter the optoelectrical conversion layer 26, becoming a cause of a reduction in detection accuracy.

To prevent such intrusion of reflected light, in the above-described embodiment it is possible, as shown in FIG. 52 and FIG. 53, to provide a down-sloping inclination to the lower circumferential surface 130c (131c) of the lens 130 (fresnel lens 131), so that the light striking this lower circumferential surface 130c or 131c is reflected to the upper surface (convex surface 130a or 131a) of the lens.

In addition to this, as a method of preventing intrusion of light reflected from the lower circumferential surface 130c or 131c, it is possible to apply gloss-free processing to the lower circumferential surface 130c or 131c, or to apply color, which reduces reflection (for example, painting with a color that tends to absorb light or forming in two colors in a general process for coloring resin).

Next, a description of a reduction to practice of the method of design of the light-detection section pattern and light-cutoff film pattern will be described, making reference to FIGS. 55(a)–55(c) and FIG. 56, for the case in which a lens is mounted.

First, the angle of incidence θ2 to the light-sensing element 12 is calculated by the following Equation (13).

$$\theta 2=(90-\theta L)/90\times\theta+\theta L \tag{13}$$

(θL: lens 130 conversion angle, θ: sunlight elevation angle)

The output current I(θ) of the light-detection section 135 is calculated by the following Equation (14).

$$I(\theta)=C\cdot S(\theta)\cdot(P\cdot\sin\theta_2) \tag{14}$$

In the above, $S(\theta)$ is the light-receiving surface area of the light-detection section 135, $P \cdot \sin \theta 2$ is incident intensity per unit surface area to the light-sensing element 12, and c is the current density generated by the light-detection section 135 with respect to the incident intensity $P \cdot \sin \theta 2$.

In the above Equation (14), if $S(\theta)$ is considered to be a constant, the output current $I(\theta)$ is maximum when $\theta=\theta 2=90°$. Therefore, to make the sunlight elevation angle at which the output current $I(\theta)$ is maximum (hereafter referred to as the maximum peak elevation angle) smaller than 90°, it is necessary to change the light-receiving surface area $S(\theta)$ by forming a non-detection region H on light-detection section 135 which does not detect light (or by positionally shifting the light-cutoff film pattern).

What follows is a description of the change size in the light-receiving surface area of a model, as shown in FIG. 55, in which a round non-detection region H is provided on the round light-detection section 135, the diameter of the light-guiding hole of the light-cutoff film being made the same as the outer diameter of the non-detection region H. The change in the light-receiving surface area $S(\theta)/S(\theta \max)$ of this model is shown in FIG. 56.

Figure 55A:
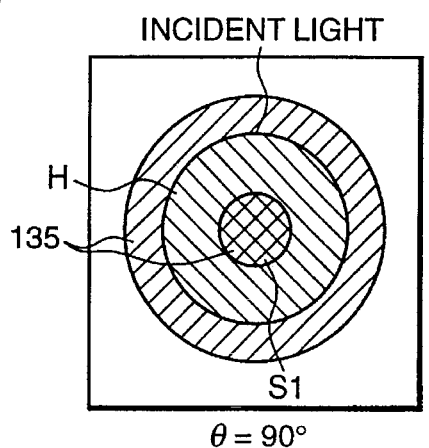
FIG. 55(a) FIG. 55(b) and FIG. 55(c) are drawings explaining the method of designing the light-detection section pattern and light-cutoff film pattern.
Figure 55B:
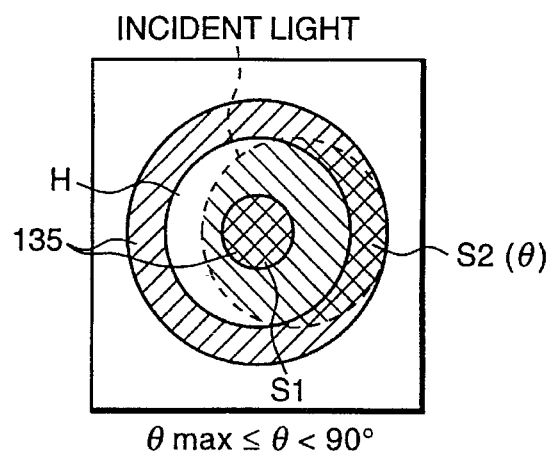
Figure 55C:
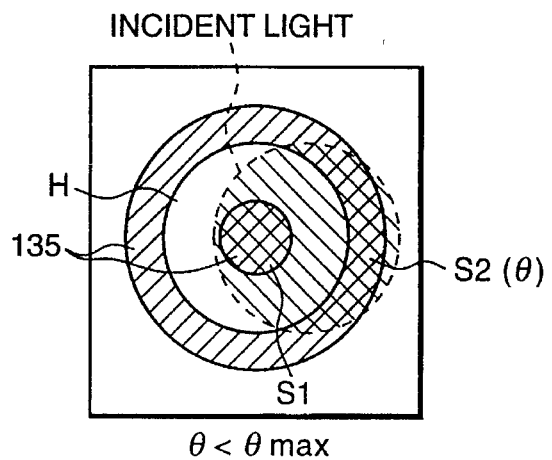

In this model, as shown in FIG. 55(a), when $\theta=90°$, since only the inside light-detection section 135 receives incident light, the light-receiving surface area $S(\theta)$ is only the light-receiving surface area S1 on the inside. However, when in the range $\theta \leq \theta < 90°$, as shown in FIG. 55(b), since the light-receiving surface area $S(\theta)$ is not only the inside light-receiving surface area S1, but also includes the outside light-receiving surface area S2 ($\theta$), the output current $I(\theta)$ is increased compared to the case in which $\theta=90°$. In addition, as shown in FIG. 55(c), for the case of $\theta<\theta$ max, because part of the incident light falls outside of the light-detection section 135, the increase in the light-receiving surface area $S2(\theta)$ reaches a ceiling, and the light-receiving surface area $S(\theta)$ becomes constant.

From the above, it is possible to express the light-receiving surface area $S(\theta)$ as follows.

$$S(\theta)=S1+S2(\theta) \quad (15)$$

Thus it is possible to consider the light-receiving surface area as being divisible into S1 which does not vary with respect to the sunlight elevation angle $\theta$, and S2 ($\theta$) which does vary with respect to $\theta$.

For the case of $\theta$ max $\leq \theta < 90°$, the rate a of change of light-receiving surface area, $S2(\theta)/S(\theta \max)$, of $S2(\theta)$ which does change with respect to the sunlight elevation angle $\theta$ is expressed as follows.

$$a=S2(\theta\max)/\{S(\theta\max)\cdot(90-\theta\max)\} \quad (16)$$

The light-receiving surface area rate b which does not change with respect to the sunlight elevation angle $\theta$ is expressed as follows.

$$b=S1/S(\theta\max) \quad (17)$$

The rate of decrease $\alpha$ in the output at a sunlight elevation angle of 90°, is defined as follows.

$$\alpha=1-I(90°)/I(\theta\max) \quad (18)$$

The influence of these values of a and b and the conversion angle $\theta L$ of the lens 130 on the peak elevation angle $\theta$ max and the rate of decrease $\alpha$ in the output ratio at a sunlight elevation angle of 90° is shown in FIGS. 57(a)–57(c). For example, if the values of a, b, and $\theta L$ are set as shown in FIG. 57(a) at No. 1 to No. 3, the output ratio varies as shown in FIG. 58(b). If the values of a, b, and $\theta L$ are set as shown in FIG. 57 at No. 4 to No. 6, the output ratio varies as shown in FIG. 57(c).

Therefore, by varying the values of a, b, and $\theta L$, it is possible to arbitrarily vary the peak elevation angle $\theta$ max and the rate of decrease in the output ratio at a sunlight elevation angle of 90°.

Figure 58:
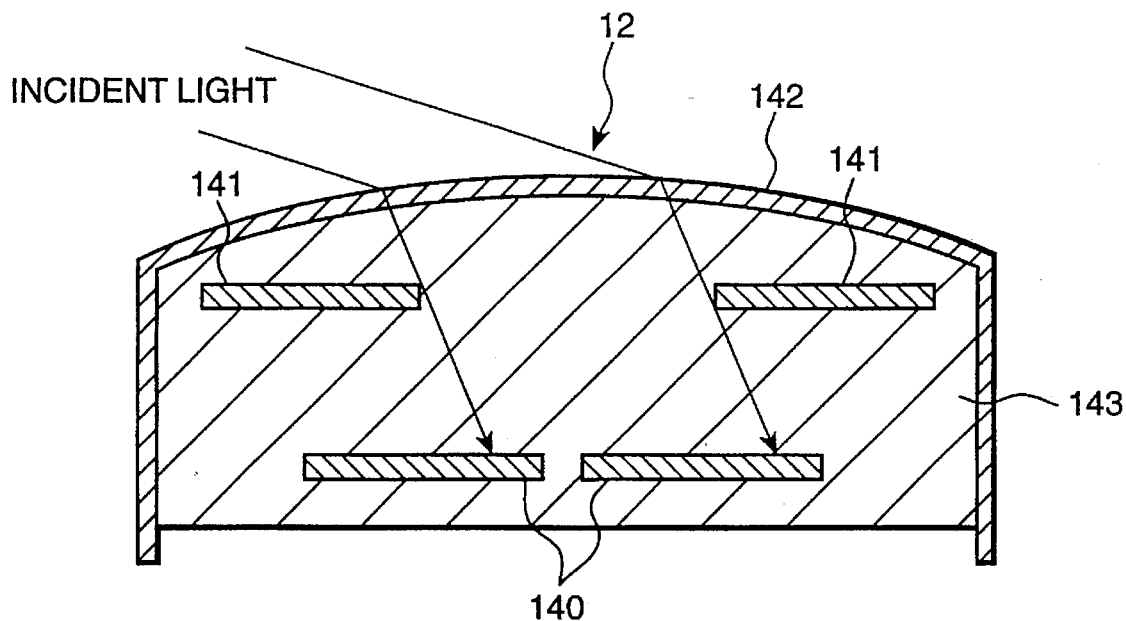
FIG. 58 is a cross-sectional view of a light-sensing element which shows the twenty fifth embodiment of the present invention.
Figure 59:
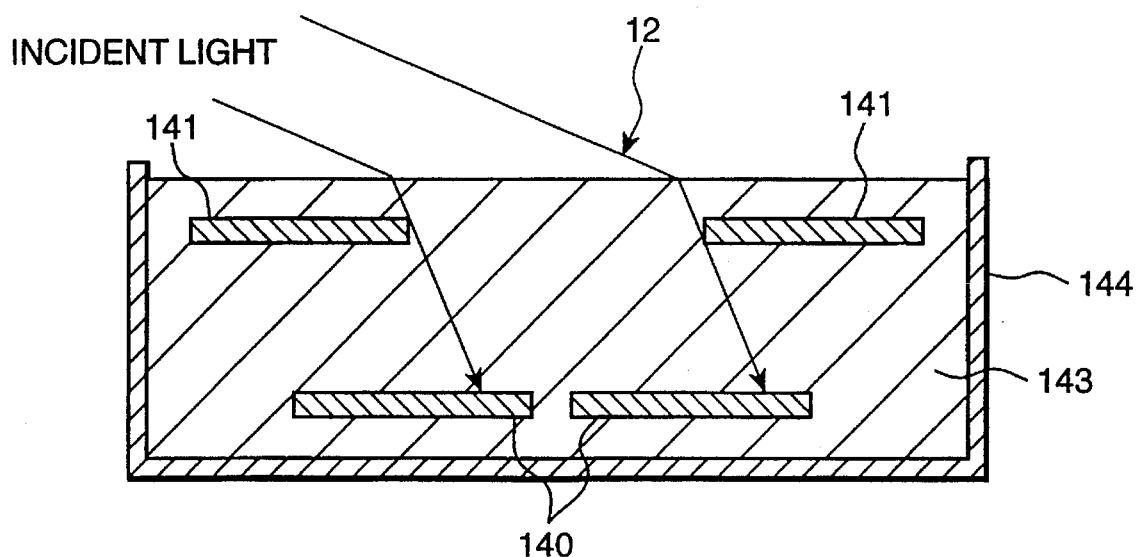
FIG. 59 is a cross-sectional view of a light-sensing element which shows the twenty sixth embodiment of the present invention.

In each of the previously described embodiments, although the transparent substrate 23 and optoelectrical conversion layer 26 (light-detection section) were formed by means of, for example, printed patterns on the upper and lower surfaces of the transparent substrate 21 (intermediate element), it is also possible to use the configurations as shown in the twenty fifth or twenty sixth embodiments of the present invention shown in FIG. 58 and FIG. 59.

In the embodiment shown in FIG. 58, a light-detection section 140 and light-cutoff plate, which serves as the light-cutoff means are housed inside a transparent, dome-shaped cover 142, the inside of this dome-shaped cover 142 being filled with a transparent material 143 (for example, glass or a transparent resin) having an index of refraction greater than that of air.

In the embodiment shown in FIG. 59, there is no transparent cover 142, with case 144 housing the light-detection section 140 and the light-cutoff plate 141, these being molded inside a transparent intermediate element 143 (for example, glass or transparent resin).

Figure 60:
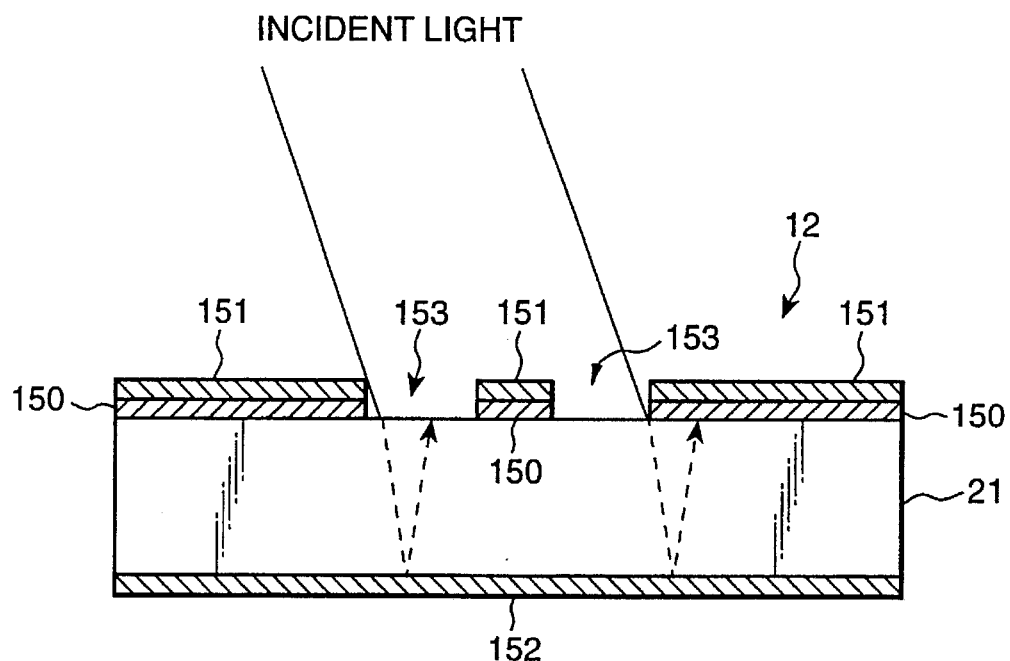
FIG. 60 is a cross-sectional view of a light-sensing element which shows the twenty seventh embodiment of the present invention.

On the other hand, in the twenty seventh embodiment of the present invention, which is shown in FIG. 60, in addition to forming the optoelectrical conversion layer 150 pattern on the upper surface of the transparent substrate 21, the light-cutoff film 151 pattern is formed on the upper surface of this optoelectrical conversion layer 150, a reflective plate 152 which serves as a sunlight direction conversion means which reflects the incident light being formed on the lower surface of the transparent substrate 21. In this case, the light which strikes the transparent substrate 21 after passing through the light-guiding hole 123 of the light-cutoff film 151 is reflected upward by the reflective 152, and strikes the optoelectrical conversion layer 150 from the bottom, thereby generating the sensor output. In this embodiment, because the optoelectrical conversion layer 150 and light-cutoff film overlap one another, there is the advantage that there is absolutely no positional skew between these two elements.

Figure 61:
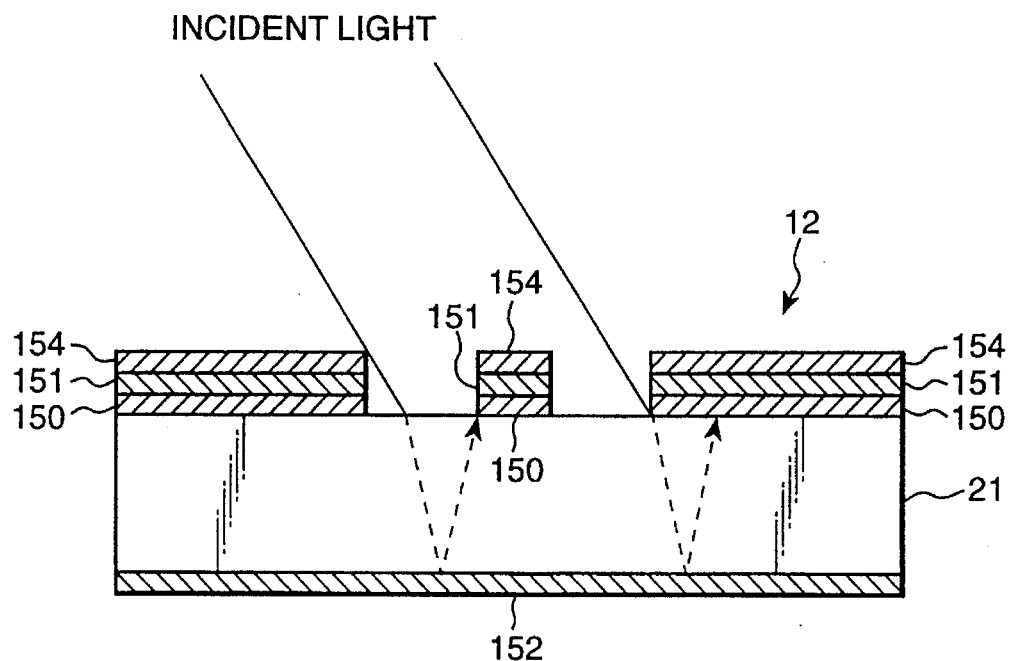
FIG. 61 is a cross-sectional view of a light-sensing element which shows the twenty eighth embodiment of the present invention.

In the above-described embodiment, when the sunlight elevation angle is 90°, the sensor output is not generated. Therefore, to generate a sensor output even when the sunlight elevation angle is 90° possible, as shown in the twenty eighth embodiment of the present invention, shown in FIG. 61, to form a further optoelectrical conversion layer 154 on the upper surface of the light-cutoff film 151.

Figure 62:
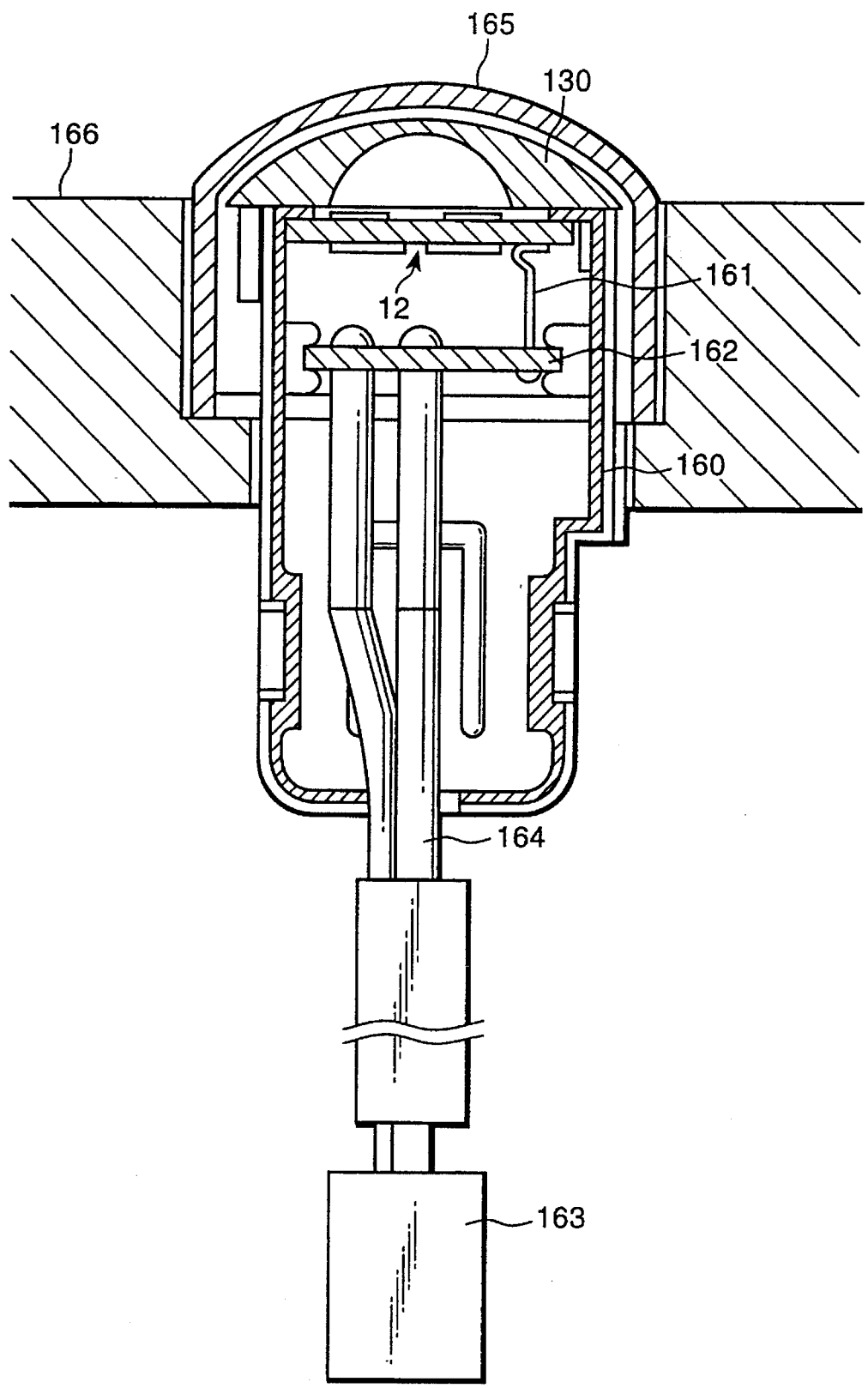
FIG. 62 is a cross-sectional view of a sunlight sensor which shows the twenty ninth embodiment of the present invention.

The light-sensing element 12 of each of the above-described embodiments is, as in the twenty ninth embodiment of the present invention, shown in FIG. 62, held fixed in place facing upwards inside the sensor case 160, and is electrically connected to the printed circuit board 162 by means of lead 161. This printed circuit board 162 has connected to it the signal output lead 164, which has connector 163. At the top of the light-sensing element 12, a lens 130 is installed, the top of this lens 130 being covered by a transparent cover 165.

In this case, while the transparent cover 165 is installed to improve the outer appearance of the sunlight sensor, it is possible to omit this transparent cover 165, and instead to apply a transparent colored material of uniform thickness to the surface, or to form it in two colors. In contrast to this, it is possible to form the entire of lens 130 from a colored resin or colored glass, but because of the fact that the thickness of lens 130 is not uniform, this will result in variations in light transmissivity, which causes detection accuracy to decrease. However, in the case of the fresnel lens 131 shown in FIG. 54, because the lens is approximately uniform in thickness, it can be formed from colored resin or colored glass.

While the sensors of each of the above-described embodiments are mounted, for example, at a position near the front windshield (not shown in the drawing) on the top surface of the dashboard 166 of the vehicle, the existence of the roof of the vehicle means that the amount of light incident to the sunlight sensor from the front direction of the vehicle through the windshield is large.

Figure 63:
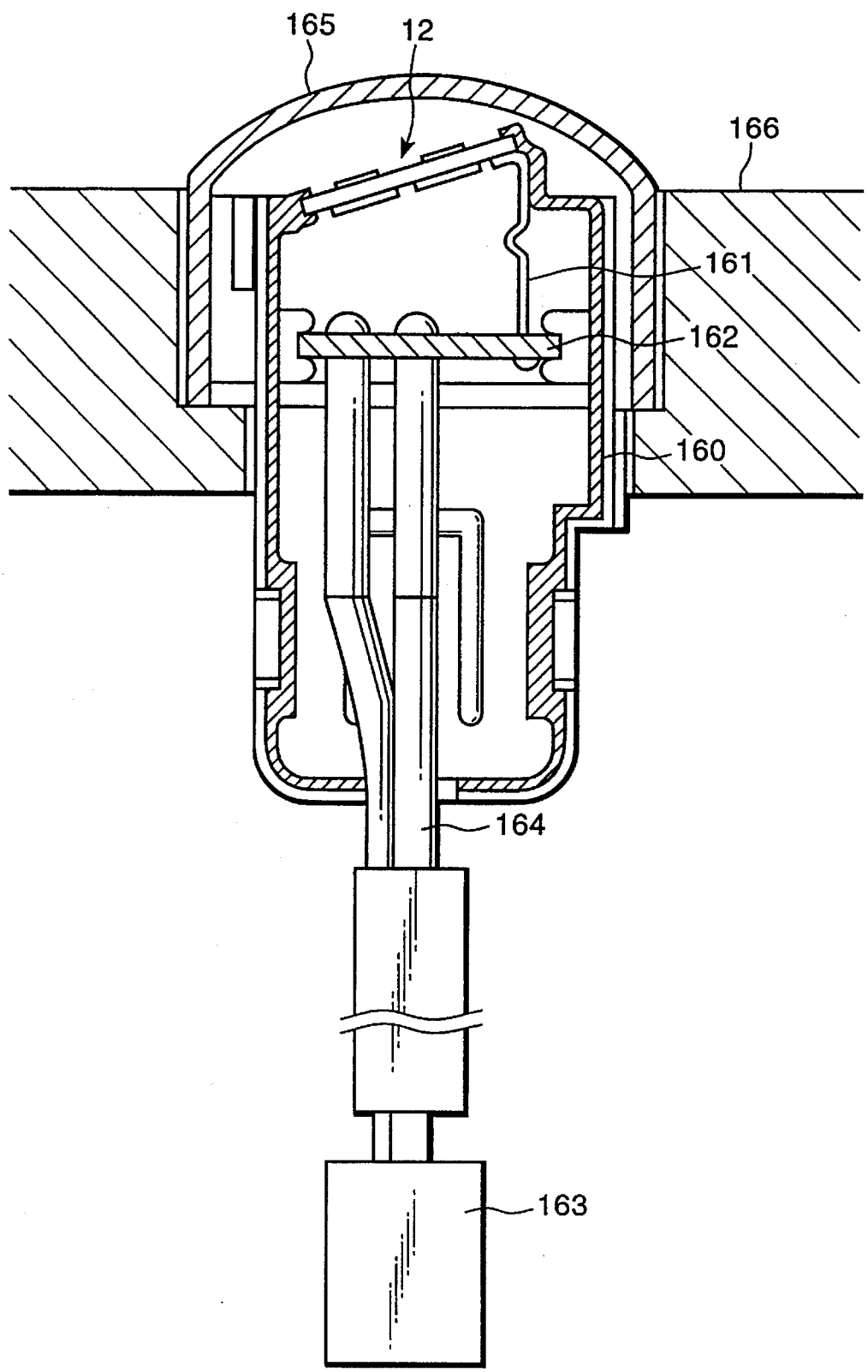
FIG. 63 is a cross-sectional view of a sunlight sensor which shows the thirtieth embodiment of the present invention.
Figure 64:
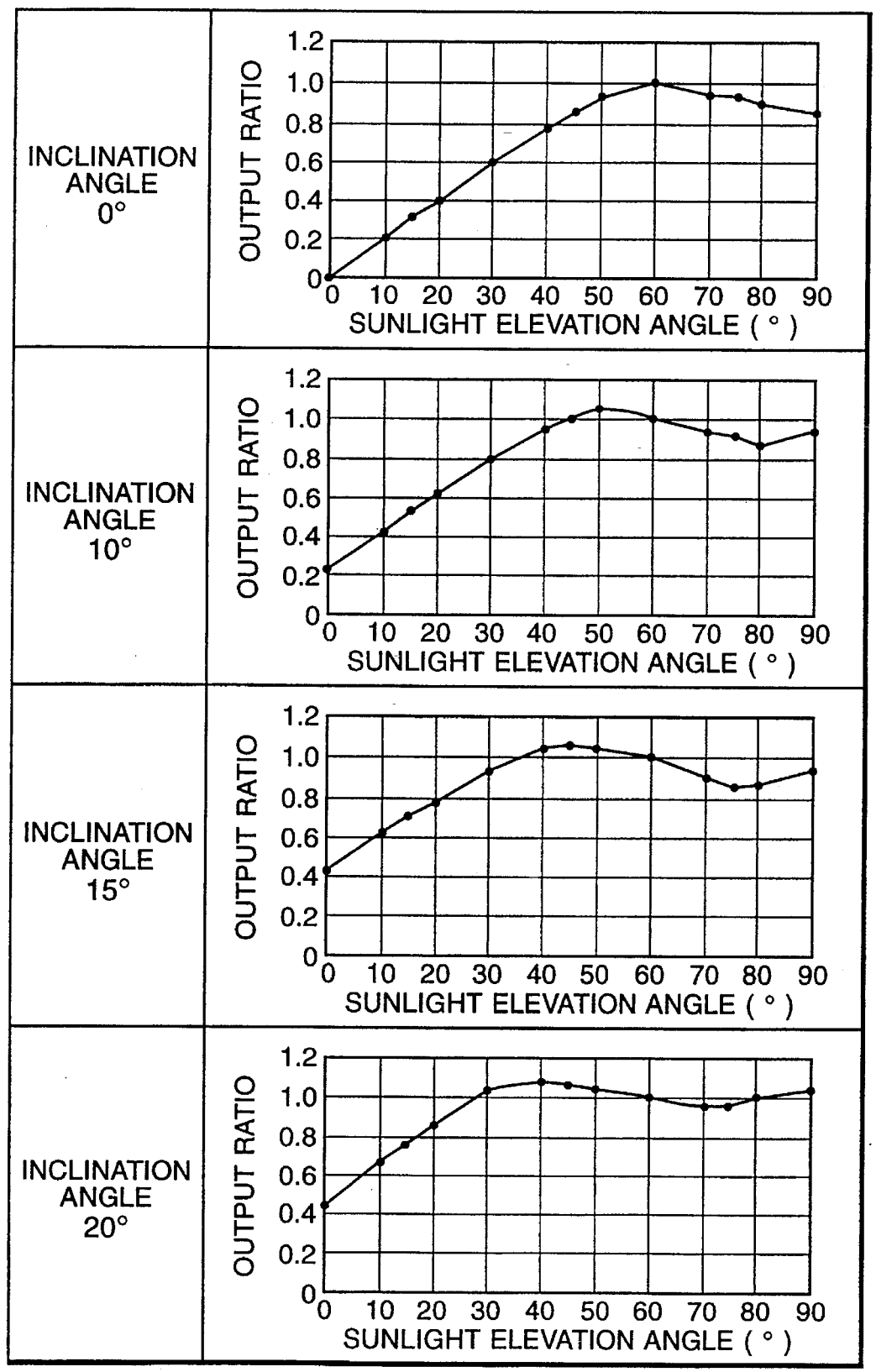
FIG. 64 is a drawing which explains the relationship between the angle of inclination of a light-sensing element and the output ratio.

In consideration of this type of situation, in the thirtieth embodiment of the present invention, shown in FIG. 63, the light-sensing element is mounted in an attitude that is inclined toward the front direction of the vehicle. By doing this, the elevation angle of the overall sunlight with respect to the upper surface of the light-sensing element 12 can be made large, enabling detection of sunlight of low elevation angles from the front direction of the vehicle, even without a lens.

As a reference, FIGS. 64(a)–64(d) show the relationship between the elevation angle and the output ratio of the light-sensing element 12 for inclination angles of 0°, 10°, 15° and 20°, respectively. In the example shown in FIGS. 64(a)–64(d), while the output ratio tends to increase just slightly in the sunlight elevation angle range of 80° to 90°, it is possible to improve this tendency by appropriately changing the light-detection section pattern and light-cutoff film pattern.

Figure 65:
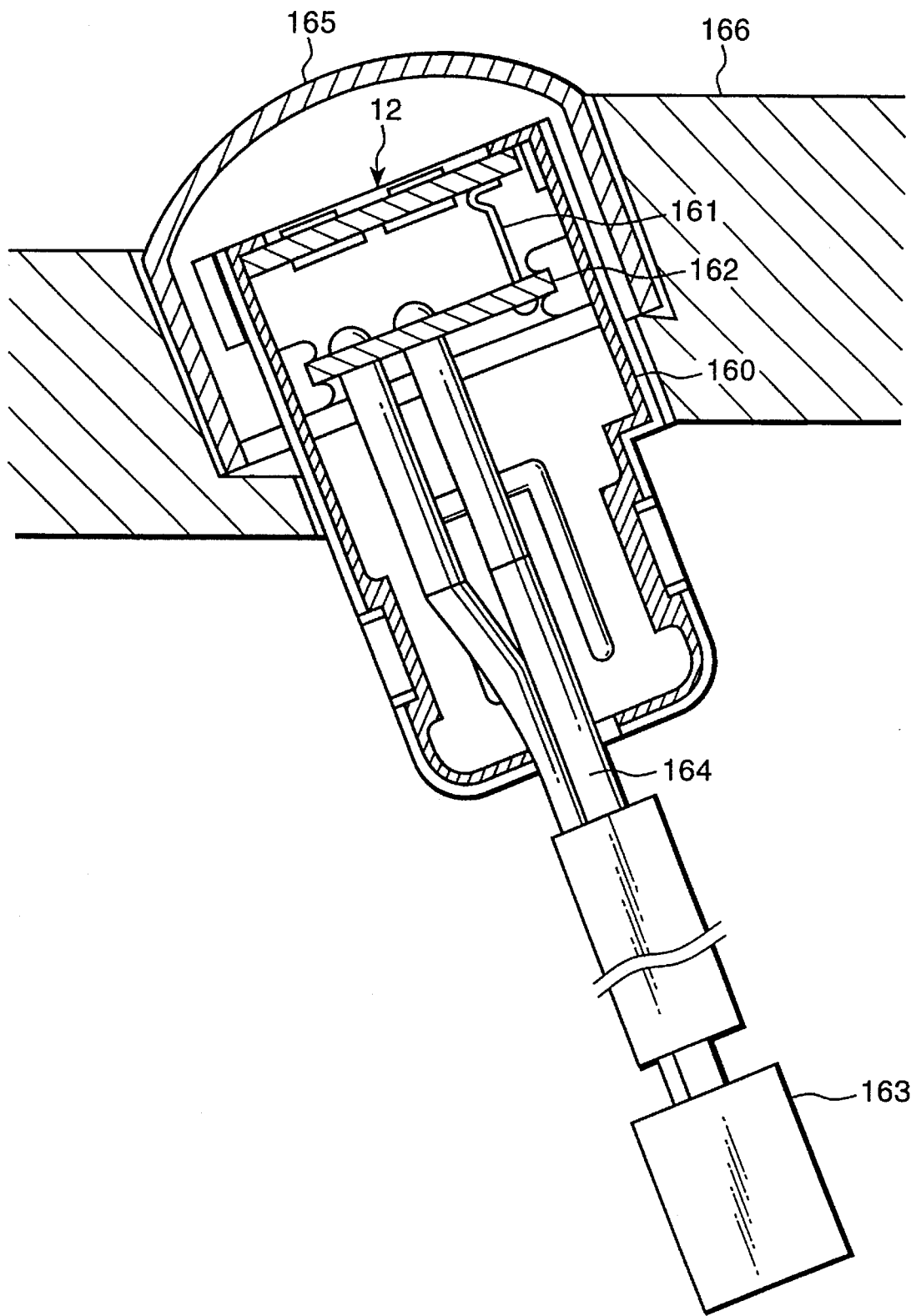
FIG. 65 is a cross-sectional view of a sunlight sensor which shows the thirty first embodiment of the present invention.

In the above-described embodiment, while the only the light-sensing element 12 is inclined toward the front direction of the vehicle, as shown in the thirty first embodiment of the present invention, shown in FIG. 65, it is also possible to mount the entire sunlight sensor on the dashboard of the vehicle so that it is inclined toward the front direction of the vehicle.

In the general vehicle, because the surface area of the door windows is greater than the windshield surface area, the amount of heat that the vehicle receives from the sunlight (hereafter referred to as the vehicle-received heat) is greater from the sunlight from the sides than it is from the sunlight from the front. Therefore, if front sunlight and side sunlight are treated the same, it will not be possible to detect the vehicle-received heat with good accuracy.

Figure 66A:
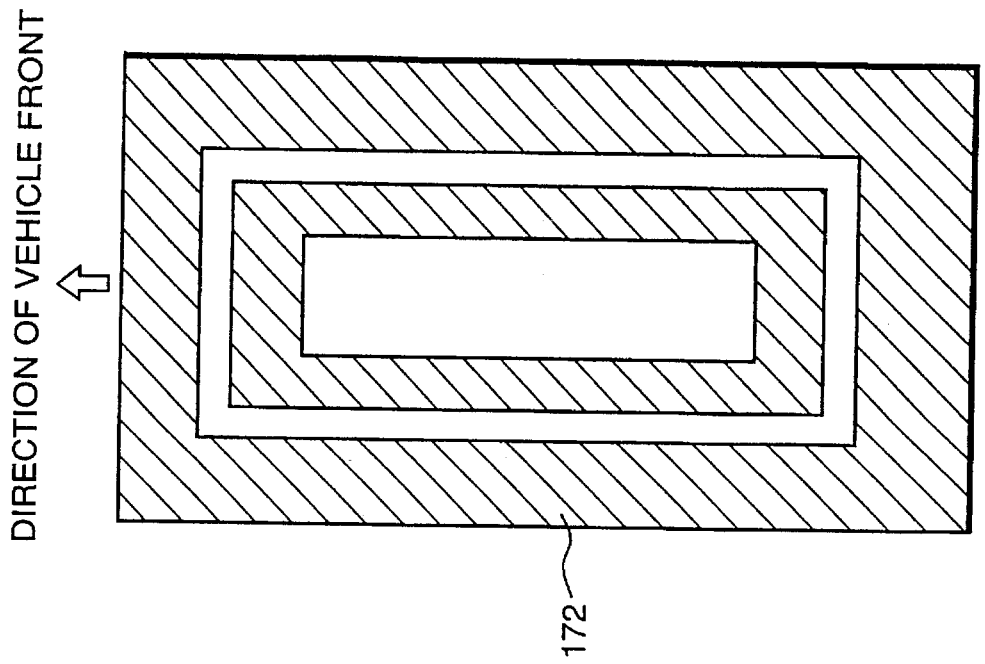
FIG. 66(a) and FIG. 66(b) show the light-detection section pattern and light-cutoff film pattern in the thirty second embodiment of the present invention.
Figure 66B:
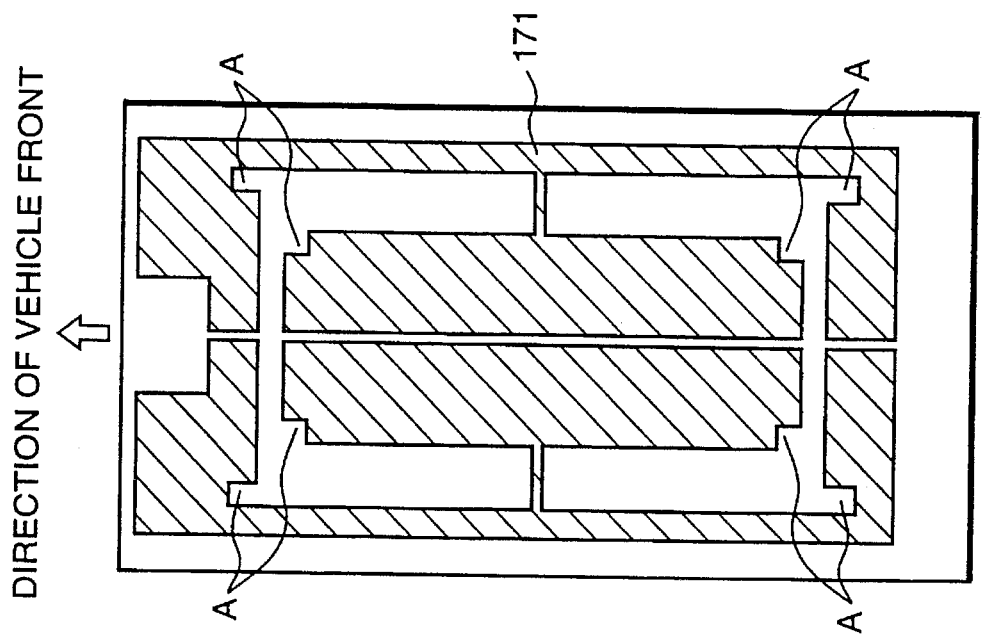
Figure 67:
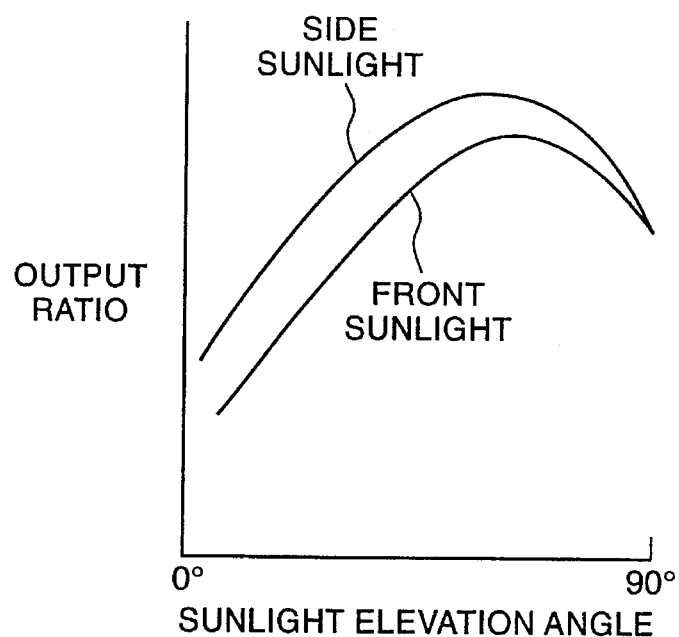
FIG. 67 is a drawing which explains the relationship between the sunlight elevation and the output ratio.

To solve this problem, as is done in the thirty second embodiment of the present invention, which is shown in FIGS. 66(a)–66(b), it is possible to form the light-detection section 171 pattern and the light-cutoff film 172 pattern lengthwise along the front-to-back direction of the vehicle. FIG. 66(a) illustrates the light-detection section pattern and FIG. 66(b) illustrates the light-cutoff section pattern. By doing this, as shown in FIG. 67, the output when the sunlight is from the side is greater than when it is from the front, enabling achievement of detection characteristics that reflect the vehicle-received heat of an actual vehicle. Also, as shown in FIG. 66(a), if cutouts A are formed in the light-detection section 171 in four directions, this reduces the light-receiving surface area for sunlight elevation angles in the region of 45°, enabling a higher sensor output for a sunlight elevation angle of 90° (sunlight from the side of the vehicle), thereby achieving characteristics that are faithful to the vehicle-received heat characteristics of an actual vehicle.

Figure 68A:
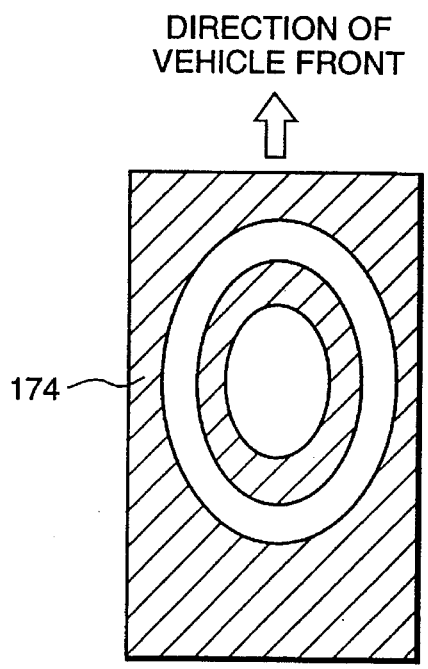
FIG. 68(a) and FIG. 68(b) show the light-detection section pattern and light-cutoff film pattern in the thirty third embodiment of the present invention.
Figure 68B:
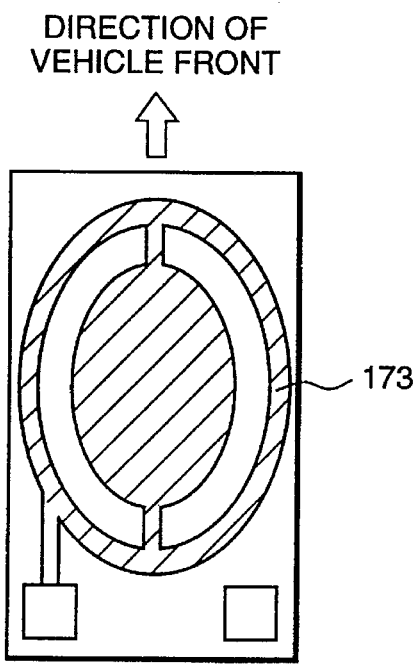

In the above-described embodiment, although the light-detection section 171 pattern and light-cutoff film 172 pattern are formed as rectangular shapes, it is also possible, as in the thirty third embodiment of the present invention, shown in FIGS. 68(a)–68(b), to form the light-detection section 173 pattern and the light-cutoff film 174 as ellipses, with their major axes aligned in the front-to-back direction of the vehicle. FIGS. 68(a) illustrates the light-detection section pattern, and FIG. 68(b) illustrates the light-cutoff section pattern.

Further, in the embodiment of FIGS. 66(a)–66(b), while the light-detection section 171 pattern is divided left-to-right into two, it is also possible to make this a single, undivided pattern. In the embodiment of the FIGS. 68(a)–68(b), it is also possible to divide the light-detection section into two.

Figure 69A:
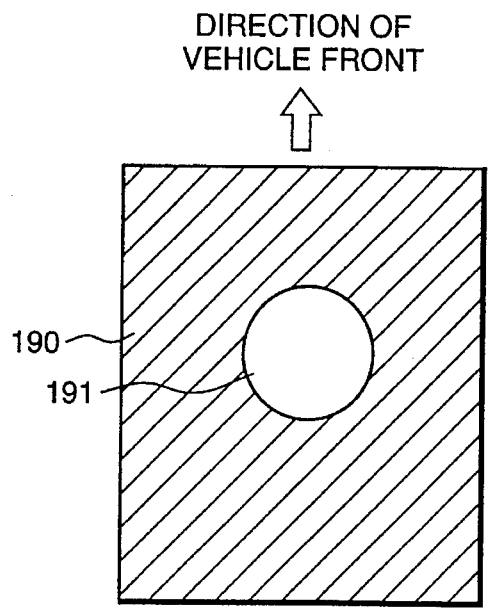
FIG. 69(a) and FIG. 69(a) show the light-cutoff film pattern and light-detection section pattern of the thirty fourth embodiment of the present invention.
Figure 69B:
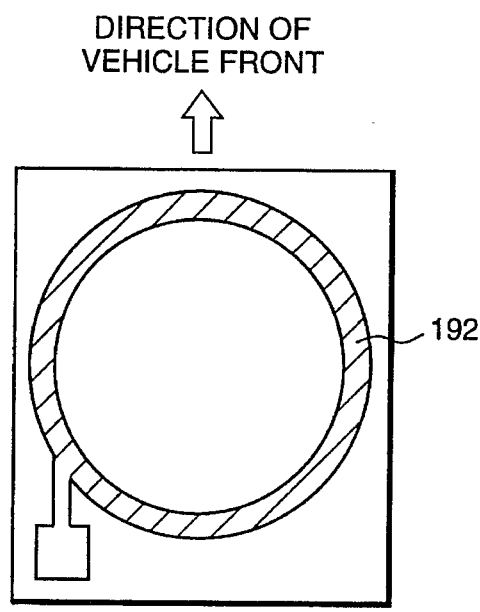

In the thirty forth embodiment of the present invention, which is shown in FIGS. 69(a)–69(b), the shape of the light-guiding hole 191 of the light-cutoff film 190 is simply a circle as indicated in FIG. 69(a), the light-detection section 192 pattern, as shown in FIG. 69(b), is a donut shape having a diameter that is smaller than the diameter of the light-guiding hole 191. By using this type of pattern shape, it is possible to detect reliable just whether the elevation angle of the sunlight is high or low.

Figure 70A:
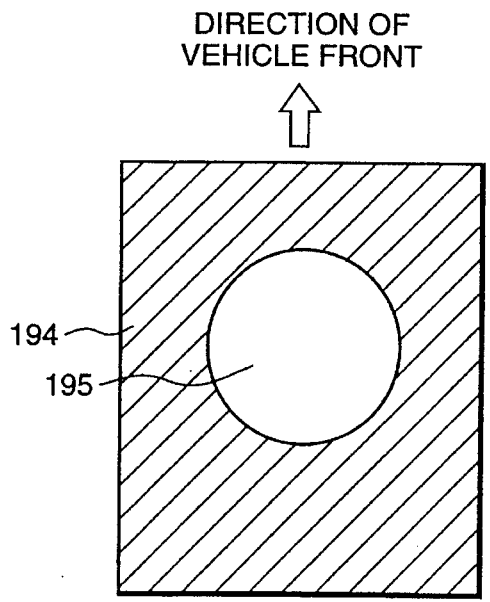
FIG. 70(a) and FIG. 70(b) show the light-cutoff film pattern and light-detection section pattern of the thirty fifth embodiment of the present invention.
Figure 70B:
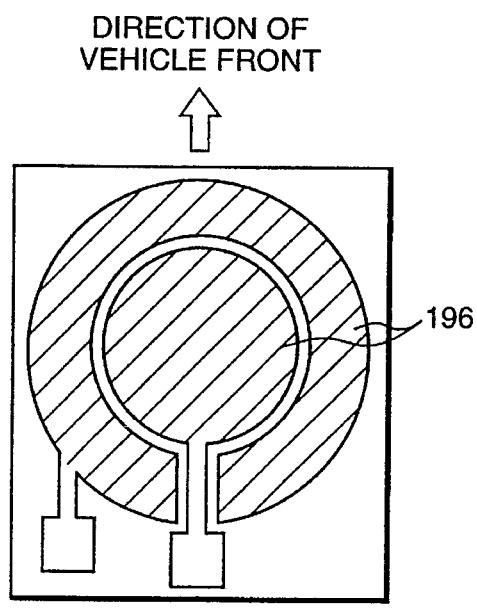

In the thirty fifth embodiment of the present invention as well, which is shown in FIGS. 70(a)–70(b), the shape of the light-guiding hole 195 of the light-cutoff film 194 is simply formed into a circle, as shown in FIG. 70(a), with the light-detection section 196 pattern, as shown in FIG. 70(b), divided into two parts, an inside circle and an outside circle, enable a distinction of the sunlight direction by comparing the output signals from the two parts.

Figure 71A:
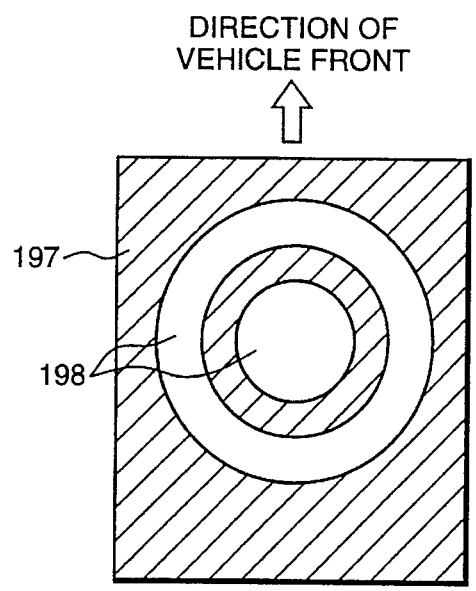
Figure 71B:
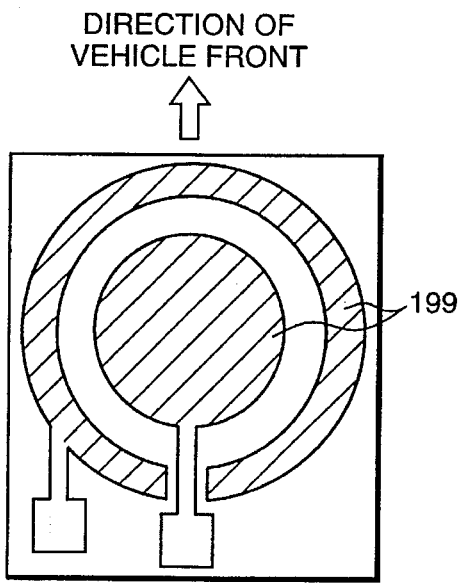

In the thirty sixth embodiment of the present invention, shown in FIGS. 71(a)–71(b), the shape of the light-guiding hole 198 of the light-cutoff film 197, as shown in FIG. 71(a), is formed into a double circle with an inner circle and an ring. As shown in FIG. 71(b), the light-detection section 199 pattern is divided into two, with an inner circle and an outer ring.

Figure 72:
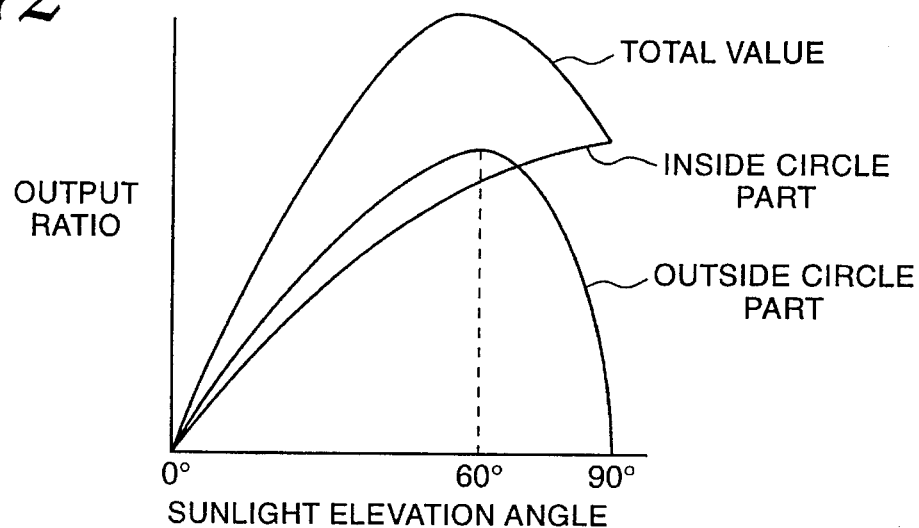
FIG. 72 is a drawing which shows the relationship between the sunlight elevation and the output ratio of the light-detection section.

The relationship of the output ratio to the sunlight elevation angle for the thirty sixth embodiment is shown in FIG. 72. In this case, when the sunlight elevation angle is within the range, for example, of 60° to 90°, because the output of the outer ring-shaped part of the light-detection section 199 drops from the maximum value to zero, the summed output ratio of the inner circuit part and outer circle part of the light-detection section 199, in the same manner as the previously described ninth embodiment, reaches a peak when the sunlight elevation angle is 60°, and in the range above 60° as the sunlight elevation angle increases, the summed output ratio decreases. In the case, the sunlight elevation angle when the summed output ratio reaches its peak can be easily changed by changing the surface area ratio between the inner circle part and the outer ring part of the light-detection section 199.

Figure 73:
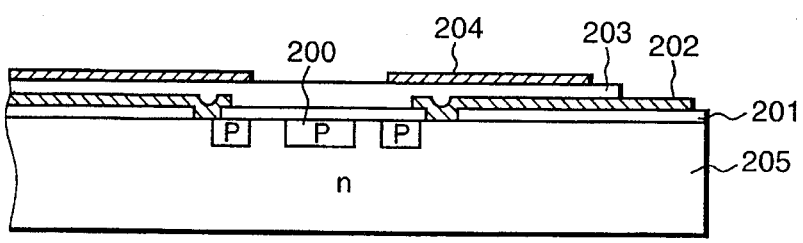
FIG. 73 is a cross-sectional view of a light-sensing element which shows the thirty seventh embodiment of the present invention.

FIG. 73 shows the thirty seventh embodiment of the present invention. In this thirty seventh embodiment, a pn junction photodiode 200 is formed as a semiconductor light-sensing element on the upper surface of a single-crystal silicon substrate 205, with a passivation layer 201 and then an electrode 202 formed over the resulting top surface, over which further is formed transparent insulating layer 203 and finally a light-cutoff film 204.

In this case, the electrode 202 is formed by aluminum deposition and photoetching. The transparent insulating layer 203 corresponds to the "intermediate element" and can be formed from, for example, silicon dioxide ($SiO_2$) using CVD growth. The light-cutoff film 204 is formed by aluminum deposition. By making this type of configuration, it is possible to apply the present invention to prior art photodiodes, resulting in a sunlight sensor with excellent mass producibility using semiconductor manufacturing techniques.

Figure 74:
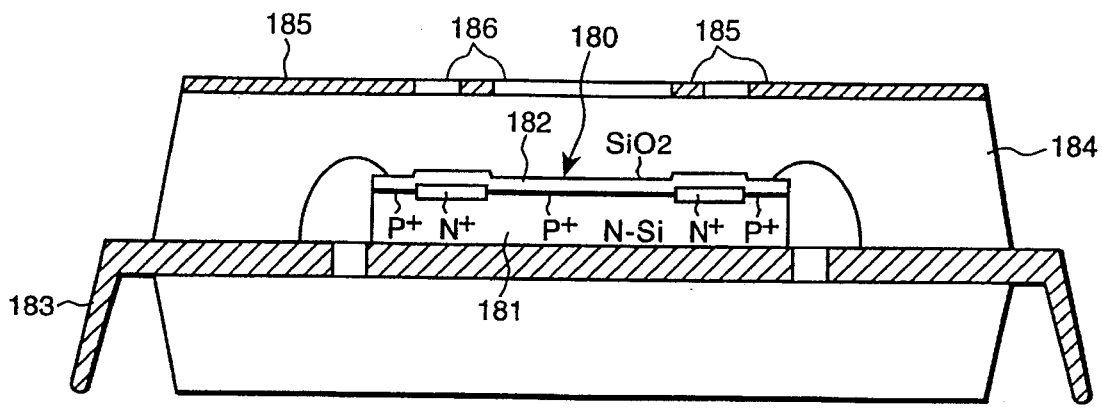
FIG. 74 is a cross-sectional view of a light-sensing element which shows the thirty eighth embodiment of the present invention.
Figure 75:
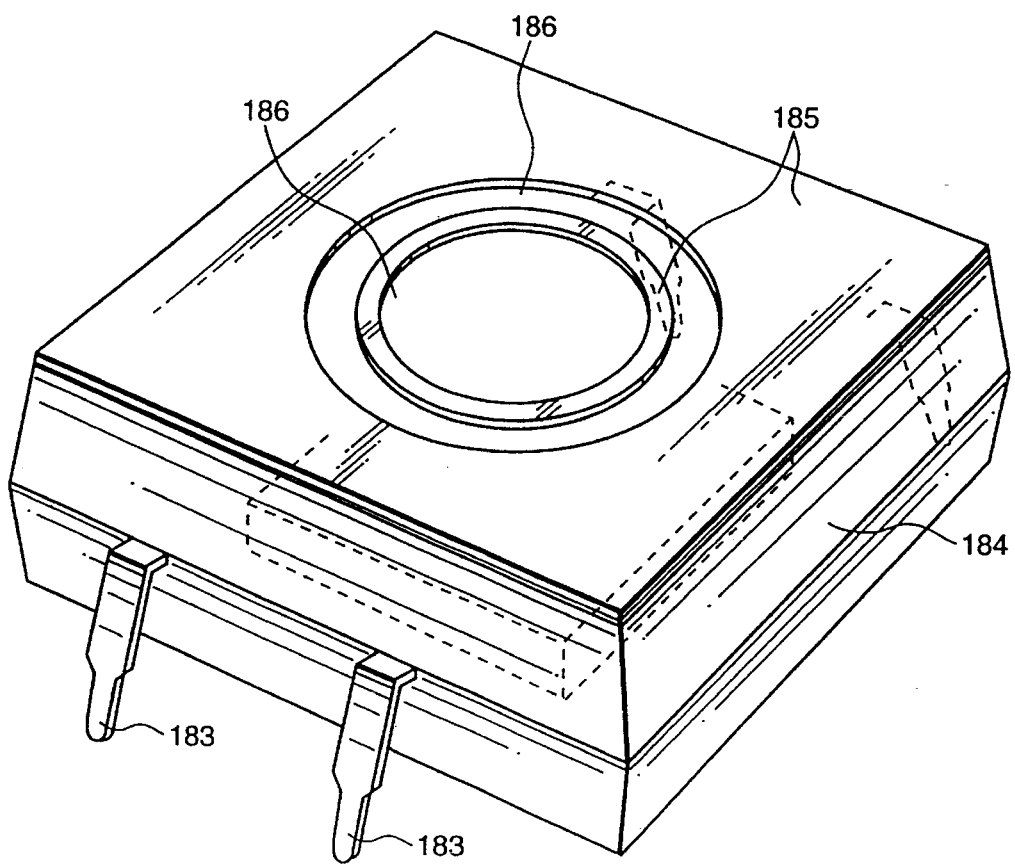
FIG. 75 is a perspective view of a light-sensing element.

In the thirty eighth embodiment of the transparent holder of the present invention, shown in FIG. 74 and FIG. 75, a light-sensing element 180 is formed on the upper surface of a single-crystal silicon substrate 181, by using semiconductor manufacturing techniques to form a pn junction photodiode 182. In this case, the formed pattern of the photodiode 182 which serves as the light-detection section can be selected from the various patterns previously described for the various embodiments. The light-sensing element 180 is mounted to the lead frame 183 by means of the wire bonding method, and both of these are molded into a transparent molded resin 184. On the upper surface of the molded resin 184 is formed an extremely thin light-cutoff film 185 is formed by means of, for example, printing with black epoxy resin, or deposition of a metallic film, with a light-guiding hole 186 of a shape matching the pattern shape of the photodiode 182 formed at its center. In this case, the molded resin 184 between the light-cutoff film 185 and the light-sensing element 180 functions as the intermediate element which refracts the incident light.

Figure 76:
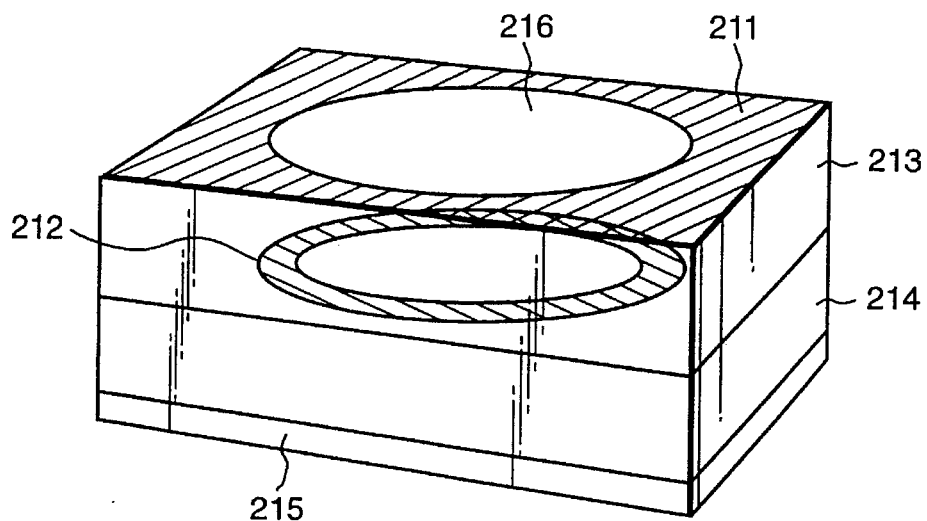
FIG. 76 is a perspective view of a light-sensing element which shows the thirty ninth embodiment of the present invention.
Figure 77:
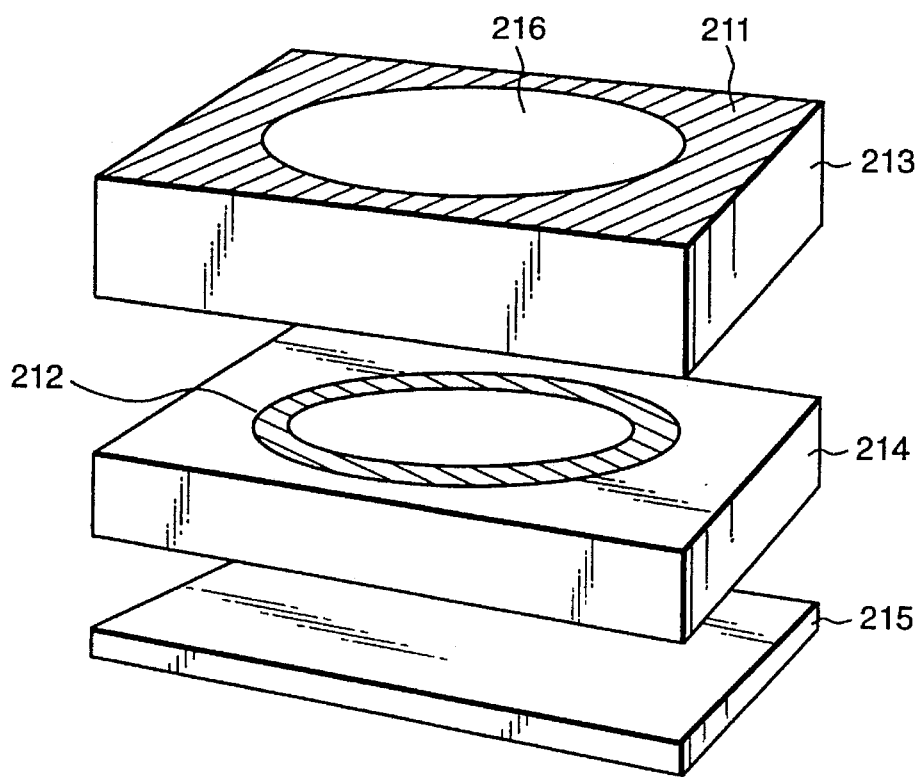
FIG. 77 is an exploded perspective view of a light-sensing element.

In each of the above-described embodiments, although the light-cutoff means (light-cutoff film) is provided in the same plane, it is also possible to use a configuration in which, as in the case of the thirty ninth embodiment of the present invention, shown in FIG. 76 and FIG. 77, a plurality of light-cutoff films 211 and 212 are positionally related above and below one another.

That is, in the thirty ninth embodiment, the first light-cutoff film 211 (first light-cutoff means) is formed on the upper surface of the transparent flat plate 213 (intermediate element), and the second light-cutoff film 212 (second light-cutoff means) is formed on the upper surface of the second transparent flat plate 214 (intermediate element), these first and second transparent flat plates 213 and 214 being linked, the lower surface of the second transparent flat plate 214 being further linked to the light-detection section 215. The linking of these various elements is done by means of an optical adhesive having excellent light transmissivity and immunity to illumination.

In this case, the light-detection section 215 need not be formed as a complex pattern, but can be formed as a simple square or circular light-receiving surface. This light-detection section 215 can be a pin layer structure (solar cell) formed from amorphous silicon as in the case of the 1st embodiment, and can also be a photodiode formed from single crystal silicon, and in the case of a photodiode the linking to the second transparent flat plate 214 can be achieved by means of anode oxidation.

The first and second transparent flat plates 213 and 214 are formed from glass or transparent resin which passes sunlight. The first and second light-cutoff films 211 and 212 are formed as an layer of ink with low transmissivity, a printed material such as metal, or a grown layer formed by either deposition or sputtering, with the round light-guiding hole 216 formed in the center part of the light-cutoff film 211. The second light-cutoff film 212 is formed in the shape of a ring, so that it partially blocks sunlight that is incident from the light-guiding hole 216 of the first light-cutoff film 211 allowing some light to strike the light-detection section 215.

In the thirty ninth embodiment configured in this manner as well, although there are two light-cutoff films 211 and 212 positioned one above the other, it is also possible to have three or more positioned light-cutoff films, and it is further possible to change the position of the lowermost light-cutoff film as desired. In addition, it is possible to have a configuration in which this plurality of light-cutoff films is molded with a transparent resin.

Figure 78:
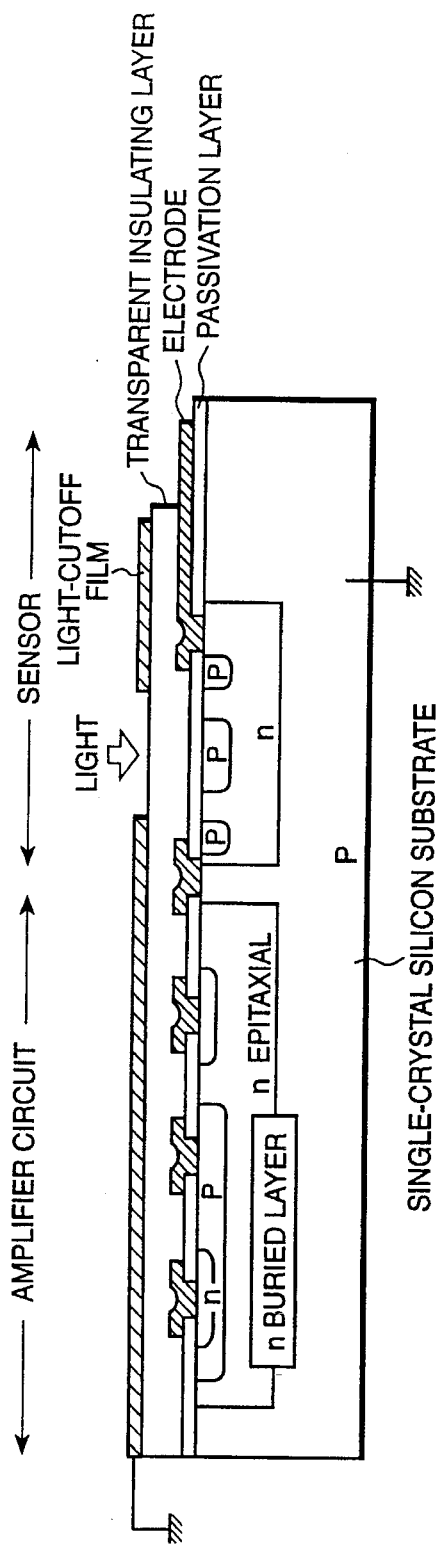
FIG. 78 is a cross-sectional view of a light-sensing element in which the photodiode and amplifier circuit are formed as one.

FIG. 78 shows as the fortieth embodiment of the present invention unifying as one of a photodiode and an amplifier circuit for the signal from the photodiode in place of the photodiode alone of the thirty seventh embodiment.

Figure 79B:
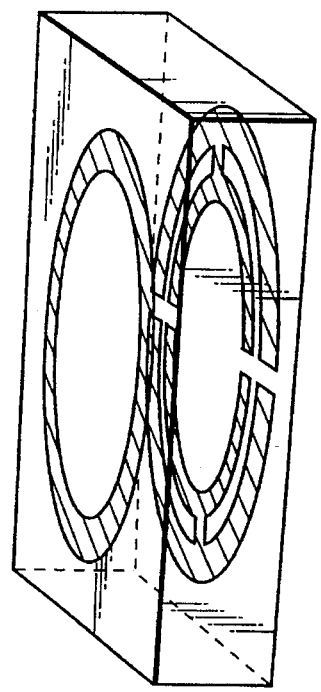
FIG. 79(a) and FIG. 79(b) are perspective views showing an example of a variation of the light-cutoff film pattern.
Figure 79A:
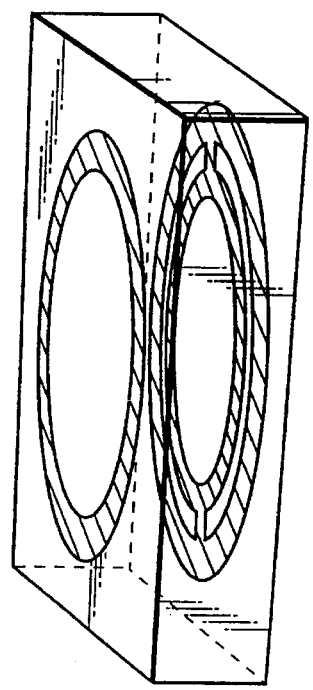
Figure 80A:
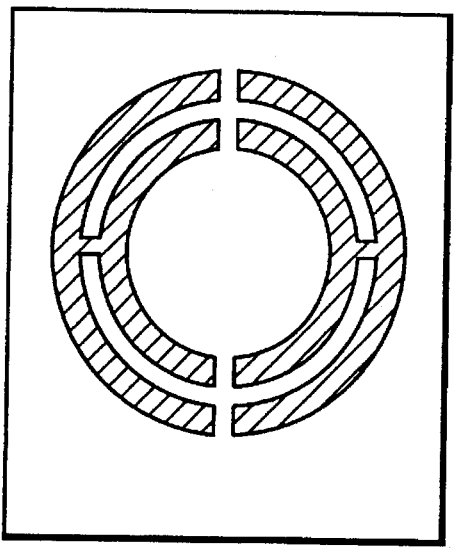
FIG. 80(a), FIG. 80(b), FIG. 80(c) and FIG. 80(d) show examples of in light-detection section patterns and light-cutoff film patterns.
Figure 80B:
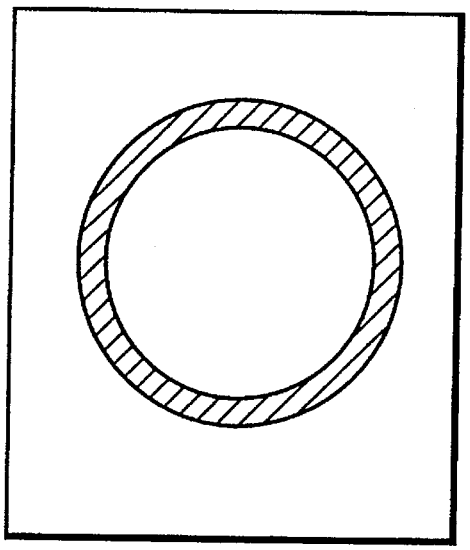
Figure 80C:
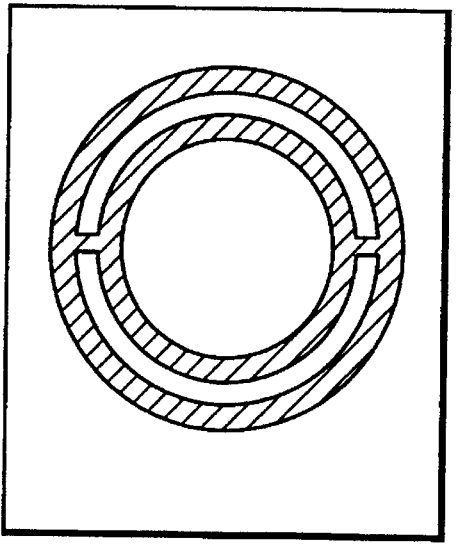
Figure 80D:
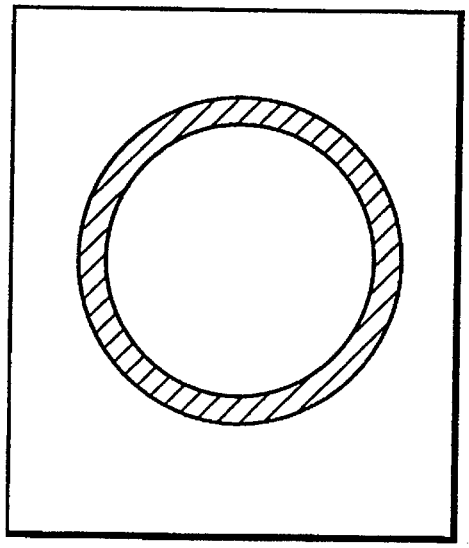
Figure 81:
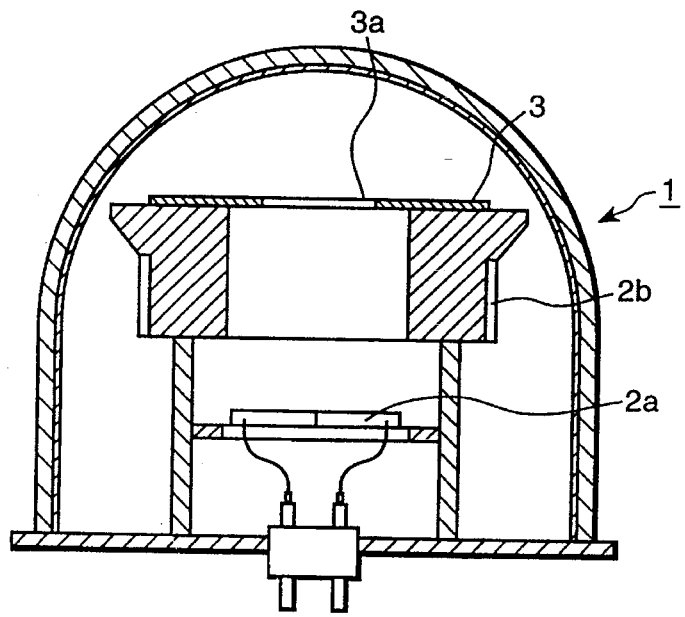
FIG. 81 is a cross-sectional view of a conventional sunlight sensor.
Figure 82:
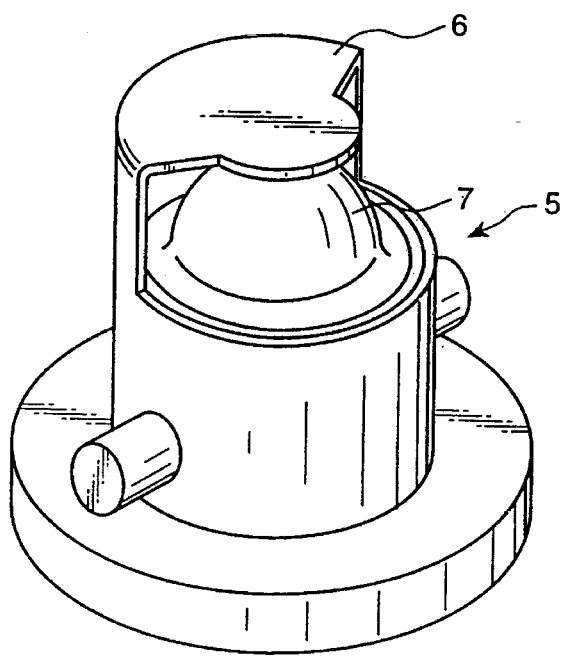
FIG. 82 is a perspective view of a conventional sunlight sensor.

In addition, the shape of the light-cutoff film of the present invention is not, of course, limited to the above-described embodiments. That is, as shown in FIGS. 79(*a*)–79(*b*) and FIGS. 80(*a*)–80(*d*), it is possible to make the light-cutoff section of the above-described embodiment the light-detection section, and the to make the light-detection section of the above-described embodiment the light-cutoff section.

In addition, the light-sensing element used in the configurations shown in FIG. 52 to FIG. 54, FIG. 58 to FIG. 63, and in FIG. 65, in addition to the light-sensing element of the ninth embodiment, can also be an application of the light-sensing element of the 1st embodiment. In this case, it is obvious that the light-detection section pattern and light-cutoff film pattern are not limited to patterns of the various embodiments.

In addition, the sunlight sensor of the present invention is not limited to use in air conditioner control in a vehicle, but can also be used in a wide variety of locations as a sunlight sensor to detect the intensity of sunlight, and can be embodied in a variety of forms.

FIELD OF UTILIZATION IN INDUSTRY

As described above, the sunlight sensor of the present invention is a sunlight sensor that is particularly useful in measuring the amount of heat inside a motor vehicle for the purpose of air conditioner control inside the vehicle.

We claim:

1. A sunlight sensor comprising:

light-cutoff means that selectively transmits sunlight;

light-detection means having a plurality of planar shaped light-detection sections positioned in a same plane; and an intermediate element between said light-detection sections and said light-cutoff means, said intermediate element passes sunlight selectively transmitted by said light-cutoff means, and detecting means for detecting both the distribution and total amount of thermal load present in an environment in which said sensor is located in accordance with outputs of said plurality of light-detection sections, wherein said light-detection sections are shaped and positioned relative to said light-cutoff means such that an output of said light-detection means is directly proportional to said thermal load.

2. A sunlight sensor according to claim 1, wherein said light-cutoff means has a light-guiding hole defined therein which selectively transmits said sunlight.

3. A sunlight sensor according to claim 1, further comprising a refracting means positioned such that said sunlight passes through said refracting means before reaching said light-cutoff means.

4. A sunlight sensor according to claim 3, wherein said refracting means is one of a prism and a transparent resin.

5. A sunlight sensor according to claim 1, wherein said intermediate element is one of glass and a transparent resin.

6. A sunlight sensor according to claim 1, wherein said intermediate element supports said light-cutoff means and said light-detection section as a single unit.

7. A sunlight sensor according to claim 1, wherein said intermediate element is a transparent substrate comprising mutually opposing flat planes, and wherein said light-cutoff means is provided on one of said planes of said substrate, and a surface area light-detection section being provided on another of said planes of said substrate.

8. A sunlight sensor according to claim 1, further comprising a control circuit which performs air conditioning control of an air conditioner based on a signal output by said light-detection section.

9. A sunlight sensor according to claim 1, wherein said light-detecting sections are further shaped and positioned such that an illuminated area is greatest when said thermal load is the greatest.

10. A sunlight sensor according to claim 1, wherein said light-detecting sections are provided so that an illuminated area satisfies the following equation, $$\text{thermal load} = (\text{output value of the sunlight intensity}) \times \sin\Theta\ (\text{elevation angle}) \times (\text{illuminated area}).$$

11. A sunlight sensor comprising:

light-cutoff means provided with an aperture; and a light-detection section which outputs a detection signal in accordance with the amount of received sunlight, configured so that the total amount of surface area of said light-detection section onto which said sunlight which passes through said aperture is varied in accordance with the direction of incidence of said sunlight and so that a portion of said light-detection section is always shaded by said light-cutoff means regardless of an angle of said sunlight relative to said sunlight sensor.

12. A sunlight sensor according to claim 11, wherein said light-cutoff means has a light-guiding hole defined therein through which said sunlight is selectively transmitted.

13. A sunlight sensor according to claim 12, wherein said light detection section is positioned relative to said light-guiding hole such that a portion of said light detection section is shaded from said sunlight by said light-cutoff means when said sunlight is incident upon said sensor in a direction perpendicular to said light-detection section.

14. A sunlight sensor according to claim 11, wherein said sunlight, after passing through said refracting means, is selected by said light-cutoff means.

15. A sunlight sensor according to claim 14, wherein said refracting means is one of a prism and a lens.

16. A sunlight sensor according to claim 11, further comprising an intermediate element positioned between said light-cutoff means and said light-detection section.

17. A sunlight sensor according to claim 16, wherein said intermediate element is one of glass and a transparent resin.

18. A sunlight sensor according to claim 16, wherein said intermediate element supports said light-cutoff means and said light-detection section as a single unit.

19. A sunlight sensor according to claim 16, wherein said intermediate element is a transparent substrate comprising mutually opposing flat planes, and wherein said light-cutoff means is provided on one of said planes of said substrate, and a surface area light-detection section being provided on another of said planes of said substrate.

20. A sunlight sensor according to claim 11, further comprising a control circuit which performs air conditioning control of an air conditioner based on a signal output by said light-detection section.

21. A sunlight sensor according to claim 11, wherein said light-detection section is inclined toward said sunlight.

22. A sunlight sensor according to claim 11, wherein said sunlight sensor is inclined toward said sunlight.

23. A sunlight sensor according to claim 22, wherein a pattern of said detecting sections is provided so that an illuminated area is the greatest when the thermal load is the greatest.

24. A sunlight sensor according to claim 22, wherein a pattern of said detecting sections is provided so that an illuminated area is decided so as to satisfy the following equation, $$\text{thermal load} = (\text{output value of the sunlight intensity}) \times \sin\Theta\ (\text{elevation angle}) \times (\text{illuminated area}).$$

25. A sunlight sensor comprising:

light-cutoff means capable of transmitting selected sunlight only; and light-detection section which outputs a signal responsive to a thermal load of an environment in which said sensor is mounted by causing the total area of said light-detection section illuminated by said sunlight which passes through said light-cutoff means to vary a direction of incidence of said sunlight varies, said signal being directly proportional to said thermal load.

26. A sunlight sensor comprising:

light-cutoff means provided with an aperture; and a light-detection section which outputs a light-detection signal responsive to the overall amount of light received thereby, said light-cutoff means and said light-detection section being shaped and positioned with respect to one another such that within a given range of sunlight elevation angle, as said elevation angle of said sunlight increases, an overall region of said light-detection section illuminated is reduced, so that said detection signal of said light-detection section is varied.

27. A sunlight sensor according to claim 26, further comprising an intermediate element positioned between said light-cutoff means and said light-detection section.

28. A sunlight sensor located inside vehicle compartment, comprising:

light-cutoff means having an aperture defined therein; and light-detection means which outputs a detection signal representative of an amount of heat received inside said compartment, said amount of heat being determined based only on an overall region of said light detection means illuminated by said sunlight selected by said light-cutoff means.

29. A sunlight sensor according to claim 28, wherein said light detection means comprises a plurality of said light-detection sections, said sections outputting a detection signal directly representative of an amount of heat received in a given region in said compartment.

30. A sunlight sensor comprising:

light-cutoff means having an aperture;

a light-detection section provided on a side of said light-cutoff means opposite from a side of sunlight incidence, which outputs a signal representative of a total amount of received heat in an environment associated with said sensor, said signal having a direct correlation to said total amount of received heat; and a sunlight direction changing means which causes said sunlight passing through said aperture to strike said light-detection section.

31. A sunlight sensor according to claim 30, further comprising an intermediatel element disposed between said light-detection section and said sunlight direction changing means, said intermediate element transmitting said sunlight which has had its direction changed by said sunlight direction changing means, said intermediate element being coupled to said light-cutoff means, said light-detection section, and said sunlight direction changing means.

32. A sunlight sensor comprising:

a semiconductor light-detection element which outputs a detection signal representative of an overall amount of light received thereby and which is directly proportional to a thermal load of an environment in which said sensor in located;

an insulating layer having optical transmissivity and disposed on said semiconductor light-detection element;

light-cutoff means disposed on said insulating layer and which transmits selected sunlight; and an amplifier circuit which is formed as one with said semiconductor light-detection element and amplifies said detection signal output by said semiconductor light-detection element.

33. A sunlight sensor comprising:

first light-cutoff means that selectively transmits sunlight;

a light detection section which outputs a detection signal responsive to an overall amount of received sunlight; and second light-cutoff means located between said first light-cutoff means and said light-detection section, the light-detection section, first and second cut-off means being shaped and positioned relative to one another so that the overall amount of surface area of said light detection section illuminated by said sunlight which is transmitted by said first light-cutoff means changes as an elevation of said sunlight changes so that a detection signal is output by said light detection section which is directly proportional to a thermal load of the environment in which said sensor is located.

* * * * *